(12) United States Patent
Lee et al.

(10) Patent No.: US 12,369,437 B2
(45) Date of Patent: Jul. 22, 2025

(54) LIGHT EMITTING ELEMENT, MANUFACTURING METHOD THEREFOR AND DISPLAY DEVICE INCLUDING SAME

(71) Applicant: Samsung Display Co., LTD., Yongin-si (KR)

(72) Inventors: Dong Eon Lee, Hwaseong-si (KR); Hoo Keun Park, Cheongju-si (KR); Moon Jung An, Hwaseong-si (KR); Chul Jong Yoo, Seongnam-si (KR); Hye Lim Kang, Hwaseong-si (KR); Dong Gyun Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 617 days.

(21) Appl. No.: 17/638,169

(22) PCT Filed: Feb. 27, 2020

(86) PCT No.: PCT/KR2020/002789
§ 371 (c)(1),
(2) Date: Feb. 24, 2022

(87) PCT Pub. No.: WO2021/040162
PCT Pub. Date: Mar. 4, 2021

(65) Prior Publication Data
US 2022/0367756 A1 Nov. 17, 2022

(30) Foreign Application Priority Data
Aug. 26, 2019 (KR) .................. 10-2019-0104250

(51) Int. Cl.
*H01L 33/38* (2010.01)
*H01L 33/00* (2010.01)
(Continued)

(52) U.S. Cl.
CPC ........ *H10H 20/8312* (2025.01); *H10H 20/01* (2025.01); *H10H 20/84* (2025.01);
(Continued)

(58) Field of Classification Search
CPC ..... H01L 33/382; H01L 33/005; H01L 33/44; H01L 33/62; H01L 33/24; H01L 33/38;
(Continued)

(56) References Cited

U.S. PATENT DOCUMENTS 10,910,512 B2  2/2021  Sung
11,728,457 B2  8/2023  Sung
(Continued)

FOREIGN PATENT DOCUMENTS

CN  105074942 A  11/2015
CN  107210350 A  9/2017
(Continued)

OTHER PUBLICATIONS

International Search Report issued in corresponding application No. PCT/KR2020/002789, issued Jun. 17, 2020, 4 pages.
(Continued)

*Primary Examiner* — Ajay Ojha
*Assistant Examiner* — Sandra Milena Rodriguez Villan
(74) *Attorney, Agent, or Firm* — Womble Bond Dickinson (US) LLP

(57) ABSTRACT

A light emitting element includes: a first semiconductor layer doped with a first polarity; a second semiconductor layer doped with a second polarity different from the first polarity; an active layer between the first semiconductor layer and the second semiconductor layer in a first direction; a first outer film around an outer surface of at least the active layer and extending in the first direction; and a second outer
(Continued)

film around an outer surface of a portion of the first semiconductor layer on which the first outer film is not present.

24 Claims, 40 Drawing Sheets

(51) Int. Cl.
    *H01L 33/44*     (2010.01)
    *H01L 33/62*     (2010.01)
    *H10H 20/01*     (2025.01)
    *H10H 20/80*     (2025.01)
    *H10H 20/831*     (2025.01)
    *H10H 20/84*     (2025.01)
    *H10H 20/857*     (2025.01)

(52) U.S. Cl.
    CPC ......... *H10H 20/857* (2025.01); *H10H 20/032* (2025.01); *H10H 20/034* (2025.01); *H10H 20/0364* (2025.01); *H10H 20/882* (2025.01)

(58) Field of Classification Search
    CPC . H01L 24/95; H01L 25/0753; H01L 2224/95; H01L 27/156; H10H 20/8312; H10H 20/80; H10H 20/8132; H10H 20/8133; H10H 20/01; H10H 20/84; H10H 20/032; H10H 20/034; H10H 20/0364; H10H 20/831; H10H 29/832; H10H 29/142
See application file for complete search history.

(56) References Cited

U.S. PATENT DOCUMENTS

| | | |
|---|---|---|
| 2011/0254043 A1 | 10/2011 | Negishi et al. |
| 2013/0027623 A1 | 1/2013 | Negishi et al. |
| 2015/0325621 A1 | 11/2015 | Kim et al. |
| 2017/0317228 A1* | 11/2017 | Sung ................. H01L 33/08 |
| 2017/0358563 A1 | 12/2017 | Cho et al. |
| 2018/0175104 A1 | 6/2018 | Kang et al. |
| 2019/0051724 A1 | 2/2019 | Do et al. |
| 2019/0198716 A1 | 6/2019 | Gordon et al. |
| 2020/0313044 A1* | 10/2020 | Ho ................. H01L 33/42 |

FOREIGN PATENT DOCUMENTS

| | | |
|---|---|---|
| JP | 2001-284644 A | 10/2001 |
| KR | 10-2009-0090812 A | 8/2009 |
| KR | 10-2018-0036272 A | 4/2018 |
| KR | 10-2018-0071465 A | 6/2018 |
| WO | WO 2016/080709 A1 | 5/2016 |

OTHER PUBLICATIONS

Extended European Search Report issued in corresponding Application No. EP 20856991.3, dated Sep. 6, 2023, 8 pages.

* cited by examiner

LIGHT EMITTING ELEMENT, MANUFACTURING METHOD THEREFOR AND DISPLAY DEVICE INCLUDING SAME

CROSS-REFERENCE TO RELATED APPLICATIONS

This application is a U.S. National Phase Patent Application of International Patent Application Number PCT/KR2020/002789, filed on Feb. 27, 2020, which claims priority to Korean Patent Application Number 10-2019-0104250, filed on Aug. 26, 2019, the entire content of all of which is incorporated herein by reference.

BACKGROUND

1. Field

Aspects of embodiments of the present disclosure relate to a light emitting element, a manufacturing method therefor, and a display device including the same.

2. Description of the Related Art

The importance of display devices has steadily increased with the development of multimedia technology. In response thereto, various types of display devices, such as an organic light emitting display (OLED), a liquid crystal display (LCD), and the like have been used.

A display device is a device for displaying an image and generally includes a display panel, such as an organic light emitting display panel or a liquid crystal display panel. The light emitting display panel may include light emitting elements, for example, light emitting diodes (LED), and examples of the light emitting diode include an organic light emitting diode (OLED) using an organic material as a fluorescent material and an inorganic light emitting diode using an inorganic material as a fluorescent material.

An inorganic light emitting diode using an inorganic semiconductor as a fluorescent material has an advantage in that it has durability even in a high temperature environment and has higher blue light efficiency than an organic light emitting diode. Also, in the manufacturing process, as noted as a drawback of a conventional inorganic light emitting diode, a transfer method using a dielectrophoresis (DEP) method has been developed. Accordingly, continuous studies have been conducted on the inorganic light emitting diode having superior durability and efficiency compared to the organic light emitting diode.

SUMMARY

Aspects embodiments of the present disclosure provide a light emitting element including a semiconductor core including an active layer and a plurality of outer films surrounding the semiconductor core, and a manufacturing method therefor.

Aspects of embodiments of the present disclosure also provide a display device including the light emitting element and having improved luminous efficiency and luminous reliability of the light emitting element.

It should be noted that aspects and features of the present disclosure are not limited thereto and other aspects and features, which are not mentioned herein, will be apparent to those of ordinary skill in the art from the following description.

According to an embodiment of the present disclosure, a light emitting element includes: a first semiconductor layer doped with a first polarity; a second semiconductor layer doped with a second polarity different from the first polarity; an active layer between the first semiconductor layer and the second semiconductor layer in a first direction; a first outer film around an outer surface of at least the active layer and extending in the first direction; and a second outer film around an outer surface of a portion of the first semiconductor layer on which the first outer film is not present.

The first outer film and the second outer film may include different materials.

The first outer film may include an insulating material.

The second outer film may include a material having a refractive index in a range of 1 to 2.4.

The second outer film may include a thermally conductive material.

The light emitting element may further include a scatterer in the second outer film to scatter incident light.

The second outer film may be spaced apart from the active layer.

The light emitting element may further include an electrode layer on the second semiconductor layer. The first outer film may extend around side surfaces of a part of the second semiconductor layer and the electrode layer.

The first outer film may extend around an outer surface of a part of the first semiconductor layer, and a length of a region in which the first outer film contacts the first semiconductor layer may be equal to a thickness of the second semiconductor layer.

A partial region of a side surface of the electrode layer may be exposed without contacting the first outer film.

The first outer film may have a curved outer surface such that its thickness in the first direction decreases.

A thickness of the second outer film may be greater than a thickness of the first outer film.

According to an embodiment of the present disclosure, a method of manufacturing a light emitting element includes: preparing a substrate and forming a plurality of semiconductor cores spaced apart from each other on the substrate; forming a base layer in a region in which the plurality of semiconductor cores are spaced apart from each other, the base layer extending around an outer surface of a part of the semiconductor core; forming a first outer film around an exposed outer surface of the semiconductor core in which the base layer is not formed; forming a second outer film around a part of the outer surface of the semiconductor core by etching the base layer; and separating the semiconductor core on which the first outer film and the second outer film are formed from the substrate.

The semiconductor core may include a first semiconductor layer, a second semiconductor layer, an active layer between the first semiconductor layer and the second semiconductor layer, and an electrode layer on the second semiconductor layer, and the base layer may be formed to extend around a partial region of the first semiconductor layer.

The forming of the first outer film may include: forming an insulating coating film to cover an exposed side surface and an exposed top surface of the semiconductor core; and exposing a top surface of the electrode layer by partially removing the insulating coating film.

According to an embodiment of the present disclosure, a display device includes: a substrate; a first electrode on the substrate and a second electrode spaced apart from the first electrode; a light emitting element between the first electrode and the second electrode and electrically connected to the first electrode and the second electrode, the light emitting element includes: a first semiconductor layer doped with a first polarity; a second semiconductor layer doped with a second polarity different from the first polarity; an active layer between the first semiconductor layer and the second semiconductor layer in a first direction; and a first outer film around an outer surface of at least the active layer and extending in the first direction; a first insulating layer under the light emitting element between the first electrode and the second electrode; and a second insulating layer on the light emitting element and exposing one end and another end of the light emitting element.

The light emitting element may further include a second outer film around an outer surface of a portion of the first semiconductor layer on which the first outer film is not present.

The display device may further include: a first contact electrode contacting the first electrode and the one end of the light emitting element; and a second contact electrode contacting the second electrode and the other end of the light emitting element.

The second insulating layer may contact the second outer film.

The display device may further include an electrode layer on the second semiconductor layer. The first outer film may extend around side surfaces of a part of the second semiconductor layer and the electrode layer.

The first outer film and the second outer film may include different materials.

The first outer film may include an insulating material, the second outer film may include a material having a refractive index in a range of 1 to 2.4, and at least some of the light generated in the active layer may be emitted through the second outer film.

The display device may further include a pattern layer on the second insulating layer and the first semiconductor layer of the light emitting element.

The pattern layer may not be between the first insulating layer and the first semiconductor layer of the light emitting element.

Details of other embodiments of the present disclosure are included in the detailed description and the accompanying drawings.

A light emitting element according to one embodiment includes a first outer film, that is, an insulating film, surrounding the outer surface of a semiconductor core and a second outer film, that is, a functional layer. The light emitting element may include the first outer film for protecting an active layer for generating light and the second outer film for improving element efficiency of the light emitting element.

Further, the display device may include the above-described light emitting element to improve luminous efficiency and element reliability.

The aspects and features according to embodiments of the present disclosure are not limited by (or to) the above description, and more various aspects and features are included in this disclosure.

DETAILED DESCRIPTION

Figure 1:
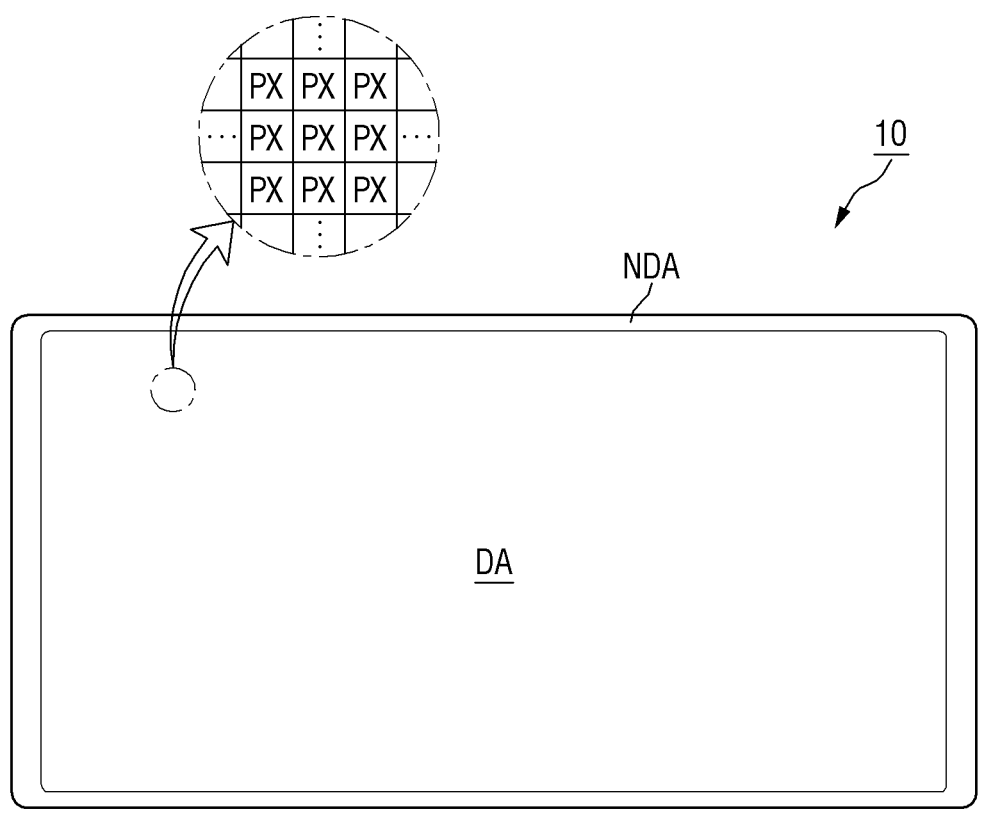
FIG. 1 is a schematic plan view of a display device according to one embodiment.

The present disclosure will now be described more fully hereinafter with reference to the accompanying drawings, in which embodiments of the present disclosure are shown. The present disclosure may, however, be embodied in different forms and should not be construed as limited to the embodiments set forth herein. Rather, these embodiments are provided so that the present disclosure will be thorough and complete, and will fully convey the scope of the present disclosure to those skilled in the art.

The terminology used herein is for the purpose of embodiments of the present disclosure and is not intended to be limiting of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

It will be understood that when an element or layer is referred to as being "on," "connected to," or "coupled to" another element or layer, it may be directly on, connected, or coupled to the other element or layer or one or more intervening elements or layers may be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present disclosure relates to "one or more embodiments of the present disclosure." Expressions, such as "at least one of," when preceding a list of elements, modify the entire list of elements and do not modify the individual elements of the list. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

Hereinafter, embodiments will be described with reference to the accompanying drawings.

FIG. 1 is a schematic plan view of a display device according to one embodiment.

Referring to FIG. 1, a display device 10 displays (or is configured to display) a moving image or a still image. The display device 10 may refer to any electronic device providing a display screen. Examples of the display device 10 may include a television, a laptop computer, a monitor, a billboard, an Internet-of-Things (IoT) device, a mobile phone, a smartphone, a tablet personal computer (PC), an electronic watch, a smart watch, a watch phone, a head-mounted display, a mobile communication terminal, an electronic notebook, an electronic book, a portable multi-media player (PMP), a navigation device, a game machine, a digital camera, a camcorder, and the like, which provide (or include) a display screen.

The display device 10 includes a display panel which provides (or includes) a display screen. Examples of the display panel may include an LED display panel, an organic light emitting diode display panel, a quantum dot light emitting display panel, a plasma display panel, and a field emission display panel. In the following description, an embodiment in which the display panel is an LED display panel will be described as an example, but the present disclosure is not limited thereto, and other display panels may be applied within the same scope of technical spirit.

The shape of the display device 10 may be variously modified. For example, the display device 10 may have a shape, such as a rectangular shape elongated in a horizontal direction, a rectangular shape elongated in a vertical direction, a square shape, a quadrilateral shape with rounded corners (e.g., vertices), another polygonal shape, and a circular shape. The shape of a display area DA of the display device 10 may be similar to the overall shape of the display device 10. In FIG. 1, the display device 10 and the display area DA having a rectangular shape elongated in the horizontal direction are illustrated.

The display device 10 may have the display area DA and a non-display area NDA. The display area DA is an area where a screen (e.g., an image) can be displayed, and the non-display area NDA is an area where a screen (e.g., an image) is not displayed. The display area DA may be referred to as an active region, and the non-display area NDA may also be referred to as a non-active region.

The display area DA may substantially occupy the center of the display device 10. The display area DA may include a plurality of pixels PX. The plurality of pixels PX may be arranged in a matrix. The shape of each pixel PX may be a rectangular or square shape in a plan view. However, the present disclosure is not limited thereto, and each of the pixels PX may have, for example, a rhombic shape in which each side is inclined with respect to one direction. Each of the pixels PX may include one or more light emitting elements 300 that emit light of a specific wavelength band to display a specific color.

Figure 2:
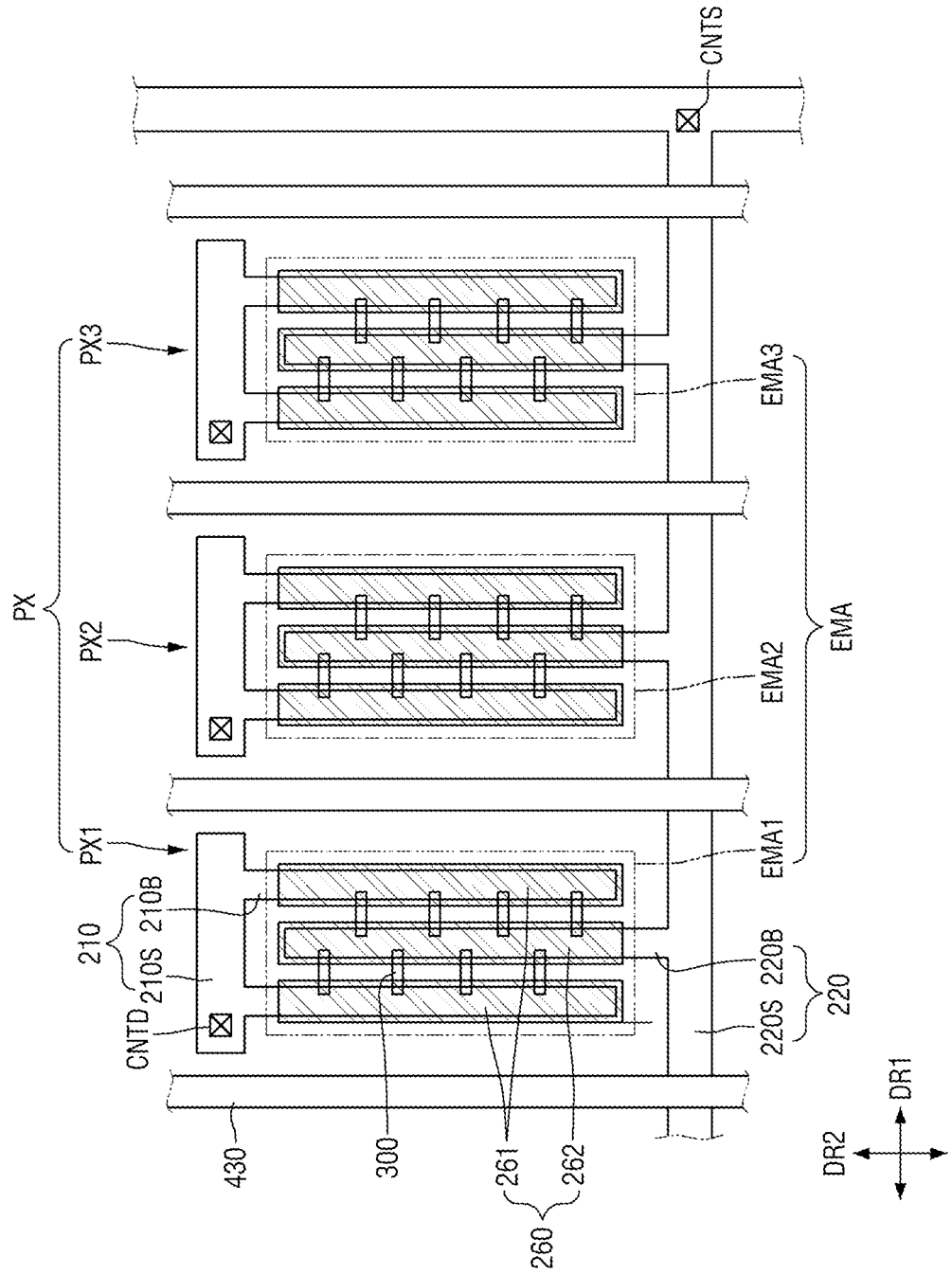
FIG. 2 is a schematic plan view of one pixel of a display device according to one embodiment.
Figure 3:
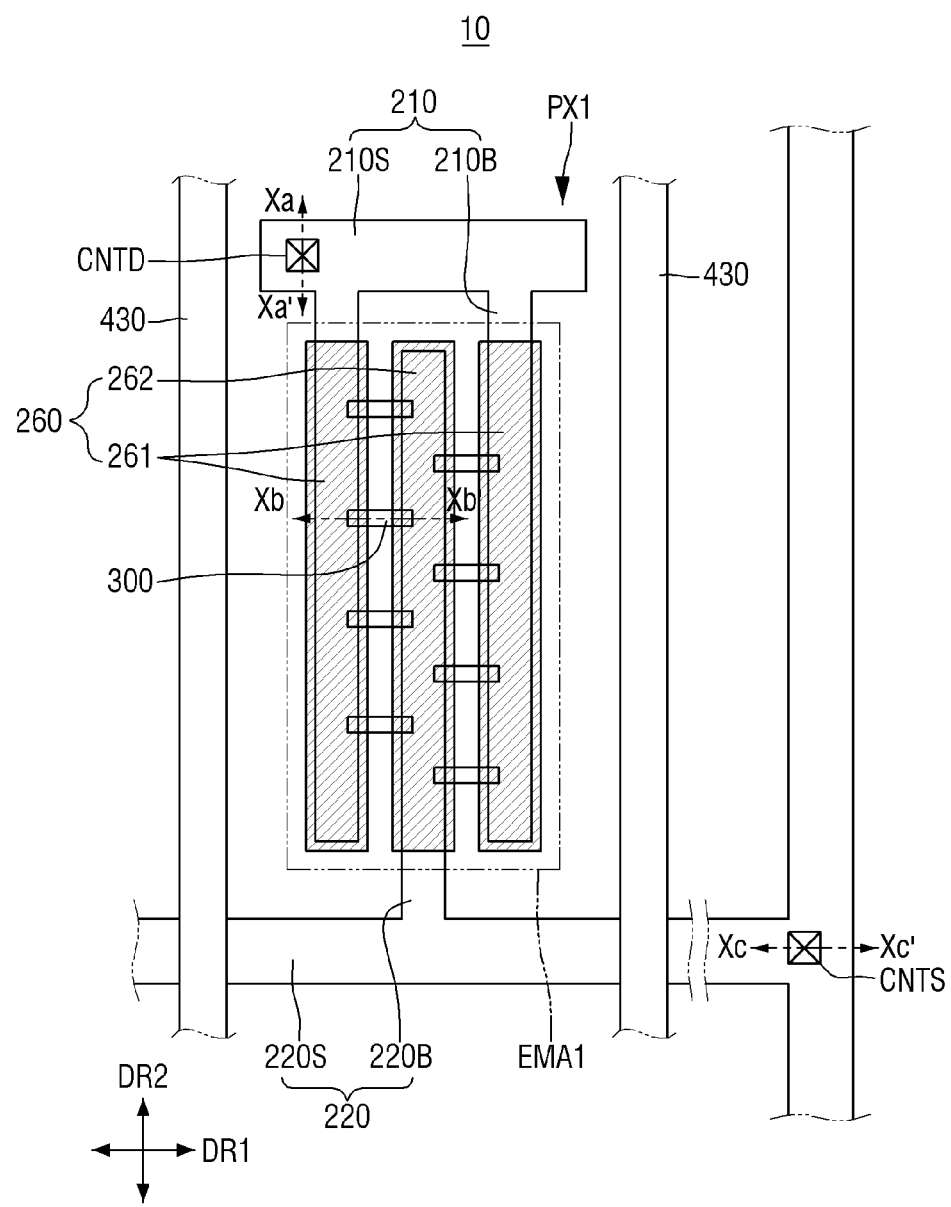
FIG. 3 is a plan view illustrating one sub-pixel shown in FIG. 2.

FIG. 2 is a schematic plan view of one pixel of a display device according to one embodiment, and FIG. 3 is a plan view illustrating one sub-pixel shown in FIG. 2.

Referring to FIGS. 2 and 3, each of the pixels PX may include a first sub-pixel PX1, a second sub-pixel PX2, and a third sub-pixel PX3. The first sub-pixel PX1 may emit light of a first color, the second sub-pixel PX2 may emit light of a second color, and the third sub-pixel PX3 may emit light of a third color. The first color may be blue, the second color may be green, and the third color may be red. However, the present disclosure is not limited thereto, and the sub-pixels PXn may emit light of the same color. In addition, although FIG. 2 illustrates an embodiment in which the pixel PX includes three sub-pixels PXn, the present disclosure is not limited thereto, and the pixel PX may include a greater number of sub-pixels PXn.

Each sub-pixel PXn of the display device 10 may have a region defined as an emission area EMA. The first sub-pixel PX1 may have a first emission area EMA1, the second sub-pixel PX2 may have a second emission area EMA2, and the third sub-pixel PX3 may have a third emission area EMA3. The emission area EMA may be defined as a region where the light emitting elements 300 included in the display device 10 are disposed to emit light of a specific wavelength band. The light emitting element 300 includes the active layer 330, and the active layer 330 may emit light of a specific wavelength band without directionality. Light emitted from the active layer 330 of the light emitting element 300 may be radiated in a lateral direction of the light emitting element 300 as well as in directions of both ends (e.g., opposite ends) of the light emitting element 300. The emission area EMA of each sub-pixel PXn may include a region adjacent to the light emitting element 300 where the light emitted from the light emitting element 300 is radiated, including the region where the light emitting element 300 is disposed. Further, without being limited thereto, the emission area EMA may also include a region where the light emitted from the light emitting element 300 is reflected or refracted by another member and emitted. The plurality of light emitting elements 300 may be disposed in the respective sub-pixels PXn, and the emission area EMA may include an area where the light emitting element 300 is disposed and an area adjacent thereto.

Each sub-pixel PXn of the display device 10 may have a non-emission area defined as a region other than the emission area EMA. The non-emission area may be a region in which the light emitting element 300 is not disposed and a region from which light is not emitted because light emitted from the light emitting element 300 does not reach it.

Each sub-pixel PXn of the display device 10 may include a plurality of electrodes 210 and 220, the light emitting element 300, a plurality of contact electrodes 260, and a plurality of external banks 430. The display device 10 may further include a plurality of internal banks 410 and 420 (see, e.g., FIG. 4) and a plurality of insulating layers 510, 520, 530 and 550 (see, e.g., FIG. 4).

The plurality of electrodes 210 and 220 may include a first electrode 210 and a second electrode 220. The first and second electrodes 210 and 220 may include respective electrode stems 210S and 220S arranged to extend in the first direction DR1 and respective electrode branches 210B and 220B extending from the respective electrode stems 210S and 220S in the second direction DR2 crossing the first direction DR1.

The first electrode 210 may include the first electrode stem 210S extending in the first direction DR1 and at least one electrode branch 210B branched off from the first electrode stem 210S and extending in the second direction DR2.

The first electrode stems 210S of any one pixel may be arranged such that both ends of the individual first electrode stems 210S are terminated with gaps between the respective sub-pixels PXn (e.g., with gaps between adjacent sub-pixels PXn), and each first electrode stem 210S may be arranged on substantially the same straight line as the first electrode stem 210S of the sub-pixel adjacent to it in the same row (e.g., in the first direction DR1). Because the first electrode stems 210S disposed in the respective sub-pixels PXn are arranged such that both ends thereof are spaced apart from each other, different electric signals may be applied to the first electrode branches 210B.

The first electrode branch 210B may be branched off from at least a part of the first electrode stem 210S and extend in the second direction DR2, and it may be terminated while being spaced apart from the second electrode stem 220S, which is disposed to face the first electrode stem 210S.

The second electrode 220 may include the second electrode stem 220S extending in the first direction DR1 and disposed to face the first electrode stem 210S while being distanced apart from it in the second direction DR2 and the second electrode branch 220B branched off from the second electrode stem 220S and extending in the second direction DR2. The second electrode stem 220S may be connected at the other end to the second electrode stem 220S of another sub-pixel PXn adjacent to it in the first direction DR1. For example, different from the first electrode stem 210S, the second electrode stem 220S may extend in the first direction DR1 across the respective sub-pixels PXn. The second electrode stem 220S that is elongated across the respective sub-pixels PXn may be connected to an outer part of the display area DA where the respective pixels PX or sub-pixels PXn are placed or to an extension portion extended from the non-display area NDA in one direction.

The second electrode branch 220B may be disposed to face the first electrode branch 210B with a gap therebetween and may be terminated while being spaced apart from the first electrode stem 210S. The second electrode branch 220B may be connected with the second electrode stem 220S, and an end of the second electrode branch 220B in the extension direction may be disposed within the sub-pixel PXn while being spaced apart from the first electrode stem 210S.

The first electrode 210 and the second electrode 220 may be electrically connected to the conductive layer of a circuit element layer PAL (see, e.g., FIG. 4) of the display device 10 through contact holes (e.g., contact openings), such as a first electrode contact hole CNTD and a second electrode contact hole CNTS, respectively. In the embodiment illustrated in FIG. 3, the second electrode contact hole CNTD is formed at every first electrode stem 210S of each sub-pixel PXn, whereas only one second electrode contact hole CNTS is formed at the single second electrode stem 220S, which is elongated across the respective sub-pixels PXn. However, the present disclosure is not limited thereto, and the second electrode contact hole CNTS may also be formed for every sub-pixel PXn, in other embodiments.

The electrodes 210 and 220 may be electrically connected with the light emitting elements 300 and may receive a voltage (e.g., a preset voltage) applied thereto to allow the light emitting elements 300 to emit light in a specific wavelength band. Further, at least a part of each of the electrodes 210 and 220 may be used to form an electric field within the sub-pixel PXn to align the light emitting elements 300.

In an embodiment, the first electrode 210 may be a pixel electrode which is separated for each sub-pixel PXn, and the second electrode 220 may be a common electrode connected along the respective sub-pixels PXn to be shared by them. One of the first and second electrodes 210 and 220 may be an anode electrode of the light emitting element 300, and the other may be a cathode electrode of the light emitting element 300. However, the present disclosure is not limited thereto, and an opposite case may also be possible.

In the embodiment illustrated in FIG. 3, two first electrode branches 210B are disposed in each sub-pixel PXn and one second electrode branch 220B is disposed therebetween. However, the layout of the first and second electrode branches may not be limited thereto. In some embodiments, the first electrode 210 and the second electrode 220 may have a shape without the electrode stems 210S and 220S and may extend in the second direction DR2. Further, the first and second electrodes 210 and 220 may not necessarily have the shape extending in one direction, and they may have various layouts. For example, the first electrode 210 and the second electrode 220 may have a partially curved or bent shape, and one electrode may be disposed to surround (e.g., to surround in a plan view or to extend around a periphery of) the other electrode. The layout and the shape of the first and second electrodes 210 and 220 may not be particularly limited as long as at least some portions thereof face each other with a gap therebetween, creating a space where the light emitting elements 300 may be disposed.

The external banks 430 may be disposed at the boundaries between the sub-pixels PXn. Each external bank 430 may extend in the second direction DR2 to be disposed at the boundary between adjacent sub-pixels PXn that are arranged in (e.g., adjacent to each other in) the first direction DR1. The first electrode stems 210S may be terminated such that their respective ends are spaced apart from each other with the external banks 430 therebetween. However, the present disclosure is not limited thereto, and the external bank 430 may extend in the first direction DR1 to be disposed at the boundary between adjacent sub-pixels PXn that are arranged in (e.g., adjacent to each other in) the second direction DR2. The external banks 430 may include the same material as the internal banks 410 and 420, to be described later, and these external and internal banks may be formed concurrently (or simultaneously) in one process.

The light emitting elements 300 may be disposed between the first electrode 210 and the second electrode 220. The light emitting element 300 may be electrically connected to the first electrode 210 at one end thereof and the second electrode 220 at the other end thereof. The light emitting element 300 may be electrically connected to each of the first electrode 210 and the second electrode 220 through the contact electrode 260.

The plurality of light emitting elements 300 may be spaced apart from each other and aligned substantially parallel to each other. The interval between the light emitting elements 300 is not particularly limited. In some embodiments, a plurality of light emitting elements 300 may be disposed adjacent to each other to form a group (e.g., a first group), and other plurality of light emitting elements 300 may be arranged while being spaced apart from each other at a regular distance to form another group (e.g., a second group). For example, the light emitting elements 300 may be arranged in different densities but may be still aligned in one direction. Further, in an embodiment, the light emitting element 300 may have a shape extending in one direction, and the extension direction of the electrodes, for example, the first electrode branch 210B and the second electrode branch 220B, may be substantially perpendicular to the extension direction of the light emitting element 300. However, the present disclosure is not limited thereto, and the light emitting element 300 may be disposed diagonally with respect to the extension direction of the first electrode branch 210B and the second electrode branch 220B, not perpendicularly thereto.

The light emitting elements 300 according to one embodiment may have active layers 330 including different materials and, thus, may emit light in different wavelength bands to the outside. The display device 10 according to one embodiment may include the light emitting elements 300 that emit light of different wavelength bands. The light emitting element 300 of the first sub-pixel PX1 may include the active layer 330 that emits a first light L1 having a central wavelength band of a first wavelength, the light emitting element 300 of the second sub-pixel PX2 may include the active layer 330 that emits a second light L2 having a central wavelength band of a second wavelength, and the light emitting element 300 of the third sub-pixel PX3 may include the active layer 330 that emits a third light L3 having a central wavelength band of a third wavelength.

Accordingly, the first light L1 may be emitted from the first sub-pixel PX1, the second light L2 may be emitted from the second sub-pixel PX2, and the third light L3 may be emitted from the third sub-pixel PX3. In some embodiments, the first light L1 may be blue light having a central wavelength band of about 450 nm to about 495 nm, the second light L2 may be green light having a central wavelength band of about 495 nm to about 570 nm, and the third light L3 may be red light having a central wavelength band of about 620 nm to about 752 nm.

However, the present disclosure is not limited thereto. In some embodiments, the first sub-pixel PX1, the second sub-pixel PX2, and the third sub-pixel PX3 may include the light emitting elements 300 of the same type to emit light of substantially the same color.

The light emitting element 300 may include a semiconductor core and a plurality of outer films 380 and 390 (see, e.g., FIG. 5) surrounding (e.g., extending around) the semiconductor core. The semiconductor core may include a plurality of semiconductor layers 310 and 320 (see, e.g., FIG. 5) and the active layer 330 (see, e.g., FIG. 5) disposed therebetween, and one end of the light emitting element 300 may be electrically connected to the first electrode 210 and the other end thereof may be electrically connected to the second electrode 220 to receive electric signals. The light emitting element 300 that has received the electrical signals may generate light in the active layer 330 and emit it to the outside.

In some embodiments, the light emitting element 300 may include an insulating film for protecting the active layer 330 for generating light and a functional film disposed in the other region to improve luminous efficiency and element reliability of the light emitting element 300. In accordance with one embodiment, the light emitting element 300 may include the first outer film 380 disposed to surround at least the outer surface of the active layer 330 in the semiconductor core and the second outer film 390 disposed in another region. The first outer film 380 may be an insulating film that prevents the active layer 330 from being damaged, and the second outer film 390 may be a functional film for improving luminous efficiency or element reliability of the light emitting element 300. A detailed description thereof will be given later with reference to other drawings.

The plurality of contact electrodes 260 may have a shape in which at least a partial region thereof extends in one direction. Each of the plurality of contact electrodes 260 may contact the light emitting element 300 and the electrodes 210 and 220, and the light emitting elements 300 may receive the electrical signals from the first electrode 210 and the second electrode 220 through the contact electrode 260.

The contact electrode 260 may include a first contact electrode 261 and a second contact electrode 262. The first contact electrode 261 and the second contact electrode 262 may be disposed on the first electrode branch 210B and the second electrode branch 220B, respectively.

The first contact electrode 261 may be disposed on the first electrode 210 or the first electrode branch 210B and may extend in the second direction DR2 to contact one end of the light emitting element 300. The second contact electrode 262 may be spaced apart from the first contact electrode 261 in the first direction DR1 and may be disposed on the second electrode 220 or the second electrode branch 220B and extend in the second direction DR2 to contact the other end of the light emitting element 300. The first contact electrode 261 and the second contact electrode 262 may contact the first electrode 210 and the second electrode 220 exposed through openings of the second insulating layer 520. The light emitting element 300 may be electrically connected to the first electrode 210 and the second electrode 220 through the first contact electrode 261 and the second contact electrode 262.

In some embodiments, the widths of the first contact electrode 261 and the second contact electrode 262 measured in one direction may be respectively greater than the widths of the first electrode 210 and the second electrode 220 or the widths of the first electrode branch 210B and the second electrode branch 220B measured in the one direction. The first contact electrode 261 and the second contact electrode 262 may be disposed to cover the side portions of the first electrode 210 and the second electrode 220 or the side portions of the first electrode branch 210B and the second electrode branch 220B. However, the present disclosure is not limited thereto, and in some embodiments, the first contact electrode 261 and the second contact electrode 262 may be disposed to cover only one side portion of the first electrode branch 210B and the second electrode branch 220B.

Although the embodiment illustrated in FIG. 3 includes two first contact electrodes 261 and one second contact electrode 262 disposed in one sub-pixel PXn, the present disclosure is not limited thereto. The number of the first contact electrode 261 and the second contact electrode 262 may vary depending on the number of the first electrode 210 and the second electrode 220 disposed in each sub-pixel PXn or the number of the first electrode branch 210B and the second electrode branch 220B.

The display device 10 may further include the circuit element layer PAL positioned under the electrodes 210 and 220 and a plurality of insulating layers disposed thereon. Hereinafter, the stacked structure of the display device 10 will be elaborated with reference to FIG. 4.

Figure 4:
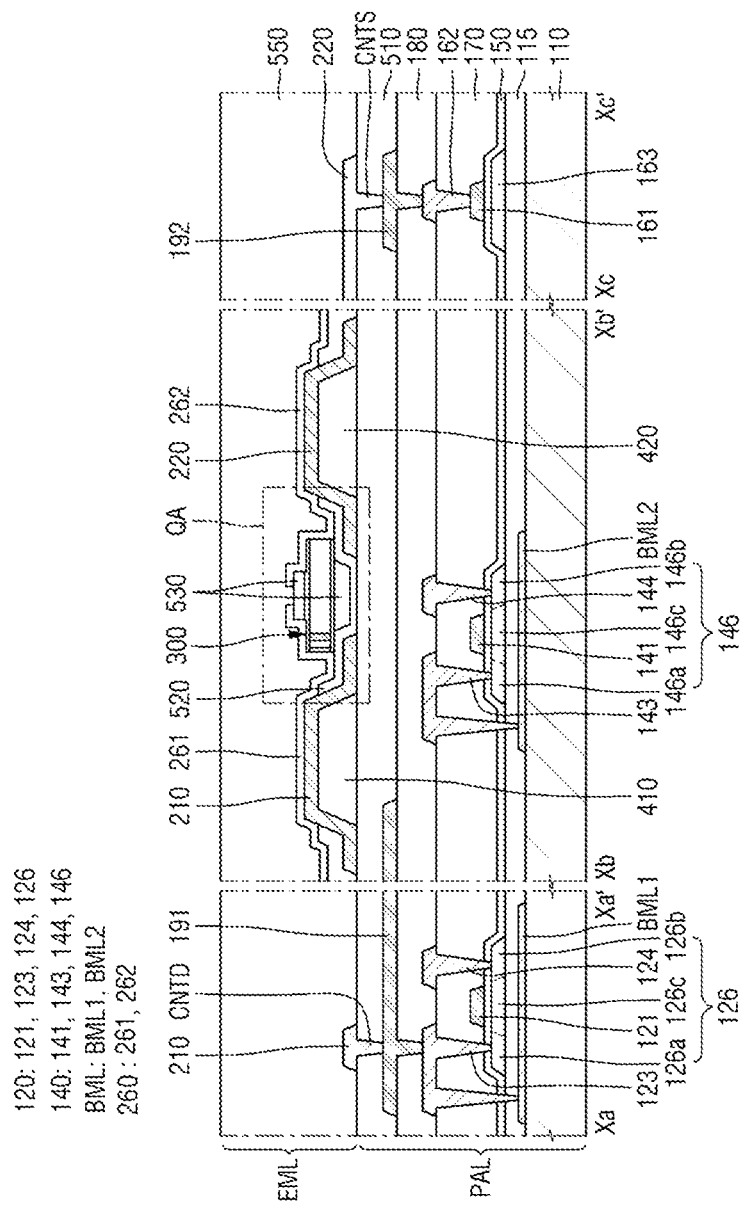
FIG. 4 is a cross-sectional view taken along the lines Xa-Xa', Xb-Xb', and Xc-Xc' of FIG. 3.

FIG. 4 is a cross-sectional view taken along the lines Xa-Xa', Xb-Xb' and Xc-Xc' of FIG. 3.

FIG. 4 shows a cross section of the first sub-pixel PX1, but the same may be applied to other pixels PX or sub-pixels PXn. FIG. 4 shows a cross section passing through one end and the other end of the light emitting element 300 disposed in the first sub-pixel PX1.

Referring to FIG. 4 in conjunction with FIGS. 2 and 3, the display device 10 may include the circuit element layer PAL and an emission layer EML. The circuit element layer PAL may include a substrate 110, a buffer layer 115, a light blocking layer BML, conductive wires 191 and 192, first and second transistors 120 and 140, and the like, and the emission layer EML may include the above-described plurality of electrodes 210 and 220, the light emitting element 300, the plurality of contact electrodes 261 and 262, the plurality of insulating layers 510, 520, 530, 550, and the like.

For example, the substrate 110 may be an insulating substrate. The substrate 110 may be made of an insulating material, such as glass, quartz, or polymer resin. Further, the substrate 110 may be a rigid substrate, but may also be a flexible substrate which can be bent, folded or rolled.

The light blocking layer BML may be disposed on the substrate 110. The light blocking layer BML may include a first light blocking layer BML1 and a second light blocking layer BML2. The first light blocking layer BML1 may be electrically connected with a first source electrode 123 of the first transistor 120 to be described later. The second light blocking layer BML2 may be electrically connected with a second source electrode 143 of the second transistor 140.

The first light blocking layer BML1 and the second light blocking layer BML2 are arranged to overlap a first active material layer 126 of the first transistor 120 and a second active material layer 146 of the second transistor 140, respectively. The first and second light blocking layers BML1 and BML2 may include a material that blocks light and, thus, can prevent light from reaching the first and second active material layers 126 and 146. For example, the first and second light blocking layers BML1 and BML2 may be formed of an opaque metal material that blocks light transmission. However, the present disclosure is not limited thereto, and in some embodiments, the light blocking layer BML may be omitted.

The buffer layer 115 is disposed on the light blocking layer BML and the substrate 110. The buffer layer 115 may be disposed to cover the entire surface of the substrate 110, including the light blocking layer BML. The buffer layer 115 can prevent diffusion of impurity ions, prevent penetration of moisture or external air, and perform a surface planarization function. Furthermore, the buffer layer 115 may insulate the light blocking layer BML and the first and second active material layers 126 and 146 from each other.

A semiconductor layer is disposed on the buffer layer 115. The semiconductor layer may include the first active material layer 126 of the first transistor 120, the second active material layer 146 of the second transistor 140, and an auxiliary layer 163. The semiconductor layer may include polycrystalline silicon, monocrystalline silicon, oxide semiconductor, and the like.

The first active material layer 126 may include a first doped region 126a, a second doped region 126b, and a first channel region 126c. The first channel region 126c may be disposed between the first doped region 126a and the second doped region 126b. The second active material layer 146 may include a third doped region 146a, a fourth doped region 146b, and a second channel region 146c. The second channel region 146c may be disposed between the third doped region 146a and the fourth doped region 146b. The first active material layer 126 and the second active material layer 146 may include polycrystalline silicon. The polycrystalline silicon may be formed by crystallizing amorphous silicon. Examples of the crystallizing method may include rapid thermal annealing (RTA), solid phase crystallization (SPC), excimer laser annealing (ELA), metal-induced lateral crystallization (MILC), and sequential lateral solidification (SLS) but are not limited thereto. As another example, the first active material layer 126 and the second active material layer 146 may include monocrystalline silicon, low-temperature polycrystalline silicon, amorphous silicon, or the like. The first doped region 126a, the second doped region 126b, the third doped region 146a, and the fourth doped region 146*b* may be some areas of the first active material layer 126 and the second active material layer 146 doped with impurities. However, the present disclosure is not limited thereto.

However, the first active material layer 126 and the second active material layer 146 are not necessarily limited to the above-described ones. In an embodiment, the first active material layer 126 and the second active material layer 146 may include an oxide semiconductor. In such an embodiment, the first doped region 126*a* and the third doped region 146*a* may be a first conductive region, and the second doped region 126*b* and the fourth doped region 146*b* may be a second conductive region. When the first active material layer 126 and the second active material layer 146 include an oxide semiconductor, the oxide semiconductor may be an oxide semiconductor including (or containing) indium (In). In some embodiments, the oxide semiconductor may be indium tin oxide (ITO), indium zinc oxide (IZO), indium gallium oxide (IGO), indium zinc tin oxide (IZTO), indium gallium tin oxide (IGTO), indium gallium zinc tin oxide (IGZTO), or the like. However, the present disclosure is not limited thereto.

A first gate insulating film 150 is disposed on the semiconductor layer. The first gate insulating film 150 may be disposed to cover the entire surface of the buffer layer 115, including the semiconductor layer. The first gate insulating film 150 may act as a gate insulating film for the first and second transistors 120 and 140.

A first conductive layer is disposed on the first gate insulating film 150. The first conductive layer may include a first gate electrode 121 disposed on the first active material layer 126 of the first transistor 120, a second gate electrode 141 disposed on the second active material layer 146 of the second transistor 140, and a wiring pattern 161 disposed on the auxiliary layer 163 on the first gate insulating film 150. The first gate electrode 121 may overlap the first channel region 126*c* of the first active material layer 126, and the second gate electrode 141 may overlap the second channel region 146*c* of the second active material layer 146.

An interlayer insulating film 170 is disposed on the first conductive layer. The interlayer insulating film 170 may act as an insulating film between the first conductive layer and other layers disposed thereon. In addition, the interlayer insulating film 170 may include (or contain) an organic insulating material and may perform a surface planarization function.

A second conductive layer is disposed on the interlayer insulating film 170. The second conductive layer includes the first source electrode 123 and the first drain electrode 124 of the first transistor 120, the second source electrode 143 and the second drain electrode 144 of the second transistor 140, and a power electrode 162 disposed on the wiring pattern 161.

The first source electrode 123 and the first drain electrode 124 may contact the first doped region 126*a* and the second doped region 126*b* of the first active material layer 126, respectively, via contact holes (e.g., contact openings) formed through the interlayer insulation film 170 and the first gate insulating film 150. The second source electrode 143 and the second drain electrode 144 may contact the third doped region 146*a* and the fourth doped region 146*b* of the second active material layer 146, respectively, via contact holes (e.g., contact openings) formed through the interlayer insulation film 170 and the first gate insulating film 150. Further, the first source electrode 123 and the second source electrode 143 may be electrically connected with the first light blocking layer BML1 and the second light blocking layer BML2, respectively, via other contact holes (e.g., other contact openings).

A passivation film 180 may be disposed on the second conductive layer. The passivation film 180 may be disposed to cover the second conductive layer and may be disposed on the entire interlayer insulating film 170. For example, the passivation film 180 may be disposed to cover the first source electrode 123, the first drain electrode 124, the second source electrode 143, and the second drain electrode 144.

A conductive wiring layer may be disposed on the passivation film 180. The conductive wiring layer may include a first conductive wire 191 and a second conductive wire 192, and they may be electrically connected to the first source electrode 123 of the first transistor 120 and the power electrode 162, respectively. The conductive wiring layer may also be electrically connected to the first electrode 210 and the second electrode 220 of the emission layer EML and may transmit electrical signals applied from the first transistor 120 and the power electrode 162 to the electrodes 210 and 220.

A first insulating layer 510 is disposed on the conductive wiring layer. The first insulating layer 510 includes (or contains) an organic insulating material and may perform a surface planarization function.

The plurality of internal banks 410 and 420, the external bank 430, the plurality of electrodes 210 and 220, and the light emitting element 300 may be disposed on the first insulating layer 510.

As described above, the external bank 430 may extend in the first direction DR1 or the second direction DR2 to be disposed at the boundary between the sub-pixels PXn. For example, the external bank 430 may delimit the boundary of each sub-pixel PXn.

The external banks 430 may prevent ink from going over the boundaries of the sub-pixels PXn when depositing (e.g., jetting) the ink in which the light emitting elements 300 are dispersed using an inkjet printing device in the manufacture of the display device 10. The external bank 430 may separate inks in which different light emitting elements 300 are dispersed for different sub-pixels PXn so as not to be mixed with each other. However, the present disclosure is not limited thereto.

The plurality of internal banks 410 and 420 may be disposed to be spaced apart from each other in each sub-pixel PXn. The plurality of internal banks 410 and 420 may include the first internal bank 410 and the second internal bank 420 disposed adjacent to the center of each sub-pixel PXn.

The first internal bank 410 and the second internal bank 420 are disposed to face each other. The first electrode 210 may be disposed on the first internal bank 410, and the second electrode 220 may be disposed on the second internal bank 420. Referring to FIGS. 3 and 4, the first electrode branch 210B is shown disposed on the first internal bank 410, and the second electrode branch 220B is shown disposed on the second internal bank 420.

Similarly to the first electrode 210 and the second electrode 220, the first internal bank 410 and the second internal bank 420 may be disposed to extend in the second direction DR2 in each sub-pixel PXn. The first internal bank 410 and the second internal bank 420 may extend in the second direction DR2 toward the sub-pixels PXn adjacent in the second direction DR2. However, the present disclosure is not limited thereto, and the first internal bank 410 and the second internal bank 420 may be disposed in each of the sub-pixels PXn separately, forming a pattern on the entire surface of the display device 10.

Each of the first internal bank 410 and the second internal bank 420 may have a structure with at least a part thereof protruding above the first insulating layer 510. Each of the first internal bank 410 and the second internal bank 420 may protrude above the plane on which the light emitting element 300 is disposed, and at least a part of this protruding portion may have a slope. The shape of the protruding portions of the first and second internal banks 410 and 420 is not particularly limited. Because the internal banks 410 and 420 protrude with respect to (e.g., protrude from or above) the first insulating layer 510 and have inclined side surfaces, the light emitted from the light emitting element 300 may be reflected by the inclined side surfaces of the internal banks 410 and 420. As will be described later, when the electrodes 210 and 220 disposed on the internal banks 410 and 420 include a material having high reflectivity, the light emitted from the light emitting element 300 may be reflected by the electrodes 210 and 220 positioned on the inclined side surfaces of the internal banks 410 and 420 and travel in an upward direction of the first insulating layer 510.

For example, the external bank 430 may delimit adjacent sub-pixels PXn and may prevent ink from overflowing to an adjacent sub-pixels PXn in an inkjet process, whereas the internal banks 410 and 420 may have a protruding structure in each sub-pixel PXn and may act as a reflective partition wall for reflecting the light emitted from the light emitting element 300 in the upward direction of the first insulating layer 510. However, the present disclosure is not limited thereto. The plurality of internal banks 410 and 420 and external banks 430 may include, but are not limited to, polyimide (PI).

The plurality of electrodes 210 and 220 may be disposed on the first insulating layer 510 and the internal banks 410 and 420, respectively. As stated above, the electrodes 210 and 220 include the electrode stems 210S and 220S and the electrode branches 210B and 220B, respectively. The line Xa-Xa' of FIG. 3 crosses the first electrode stem 210S, the line Xb-Xb' of FIG. 3 crosses the first and second electrode branches 210B and 220B, and the line Xc-Xc' of FIG. 3 crosses the second electrode stem 220S. That is, the first electrode 210 disposed in the area Xa-Xa' of FIG. 4 can be understood to be the first electrode stem 210S, the first electrode 210 and the second electrode 220 disposed in the area Xb-Xb' of FIG. 4 can be understood to be the first electrode branch 210G and the second electrode branch 220B, respectively, and the second electrode 220 disposed in the area Xc-Xc' of FIG. 4 can be understood to be the second electrode stem 220S. The electrode stems 210S and the electrode branch 210B may constitute the first electrode 210, and the electrode stem 220S and the electrode branch 220B may constitute the second electrode 220.

Some areas of the first and second electrodes 210 and 220 may be disposed on the first insulating layer 510, and some other areas thereof may be disposed on the first and second internal banks 410 and 420, respectively. For example, the widths of the first electrode 210 and the second electrode 220 may be greater than the widths of the internal banks 410 and 420. Parts of the bottom surfaces of the first electrode 210 and the second electrode 220 may contact the first insulating layer 510, and other parts thereof may contact the internal banks 410 and 420.

The first electrode stem 210S of the first electrode 210 and the second electrode stem 220S of the second electrode 220, which extend in the first direction DR1, may partially overlap the first internal bank 410 and the second internal bank 420, respectively. However, the present disclosure is not limited thereto, and the first electrode stem 210S and the second electrode stem 220S may not overlap the first internal bank 410 and the second internal bank 420, respectively.

The first electrode contact hole CNDT may be formed in the first electrode stem 210S of the first electrode 210 to penetrate the first insulating layer 510 and expose a part of the first conductive wire 191. The first electrode 210 may be in contact with the first conductive wire 191 through the first electrode contact hole CNTD, and the first electrode 210 may be electrically connected to the first source electrode 123 of the first transistor 120 to receive an electrical signal.

The second electrode contact hole CNTS may be formed in the second electrode stem 220S of the second electrode 220 to penetrate the first insulating layer 510 and expose a part of the second conductive wire 192. The second electrode 220 may contact the second conductive wire 192 through the second electrode contact hole CNTS, and the second electrode 220 may be electrically connected to the power electrode 162 to receive an electrical signal.

Some areas of the first electrode 210 and the second electrode 220, for example, the first electrode branch 210B and the second electrode branch 220B may be disposed to cover the first internal bank 410 and the second internal bank 420, respectively. The first electrode 210 and the second electrode 220 may face each other with a gap therebetween, and the plurality of light emitting elements 300 may be disposed therebetween.

Each of the electrodes 210 and 220 may include a transparent conductive material. For example, each of the electrodes 210 and 220 may include a material, such as indium tin oxide (ITO), indium zinc oxide (IZO), and indium tin zinc oxide (ITZO), but is not limited thereto. In some embodiments, each of the electrodes 210 and 220 may include a conductive material having high reflectivity. For example, each of the electrodes 210 and 220 may include, as a material having high reflectivity, metal, such as silver (Ag), copper (Cu), or aluminum (Al). In such an embodiment, light incident to each of the electrodes 210 and 220 may be reflected to be radiated in an upward direction of each sub-pixel PXn.

Further, each of the electrodes 210 and 220 may have a structure in which at least one transparent conductive material and at least one metal layer having high reflectivity are stacked, or may be formed as one layer including them. In an embodiment, each of the electrodes 210 and 220 may have a stacked structure of ITO/silver(Ag)/ITO/IZO, or may be made of an alloy including aluminum (Al), nickel (Ni), and lanthanum (La). However, the present disclosure is not limited thereto.

The second insulating layer 520 is disposed on the first insulating layer 510, the first electrode 210, and the second electrode 220. The second insulating layer 520 is disposed to partially cover the first electrode 210 and the second electrode 220. The second insulating layer 520 may be disposed to cover most of the top surfaces of the first electrode 210 and the second electrode 220, and openings exposing parts of the first electrode 210 and the second electrode 220 may be formed in the second insulating layer 520. The openings in the second insulating layer 520 may be positioned to expose the relatively flat top surfaces of the first electrode 210 and the second electrode 220.

In an embodiment, the second insulating layer 520 may be formed to have a step such that a portion of the top surface thereof is recessed between the first electrode 210 and the second electrode 220. In some embodiments, the second insulating layer 520 may include (or contain) an inorganic insulating material, and a part of the top surface of the second insulating layer 520 disposed to cover the first electrode 210 and the second electrode 220 may be recessed by the step formed by the electrodes 210 and 220. The light emitting element 300 disposed on the second insulating layer 520 between the first electrode 210 and the second electrode 220 may form an empty space with respect to the recessed top surface of the second insulating layer 520. The light emitting element 300 may be disposed to be partially spaced apart from the top surface of the second insulating layer 520 with a clearance (or a space) therebetween, and this clearance may be filled with a material forming the third insulating layer 530, to be described later.

However, the present disclosure is not limited thereto. The second insulating layer 520 may have a flat top surface so that the light emitting element 300 is disposed thereon. The top surface may extend in one direction toward the first electrode 210 and the second electrode 220 and may be terminated on inclined side surfaces of the first electrode 210 and the second electrode 220. For example, the second insulating layer 520 may be disposed in an area where the electrodes 210 and 220 overlap the inclined side surfaces of the first internal bank 410 and the second internal bank 420, respectively. The contact electrode 260, to be described later, may contact the exposed areas of the first and second electrodes 210 and 220 and may smoothly contact an end of the light emitting element 300 on the flat top surface of the second insulating layer 520.

The second insulating layer 520 may protect the first electrode 210 and the second electrode 220 while insulating them from each other. Further, the light emitting element 300 disposed on the second insulating layer 520 may not be damaged by direct contact with other members. However, the shape and structure of the second insulating layer 520 are not limited thereto.

The light emitting element 300 may be disposed on the second insulating layer 520 between the electrodes 210 and 220. For example, at least one light emitting element 300 may be disposed on the second insulating layer 520 disposed between the electrode branches 210B and 220B. However, without being limited thereto, at least some of the light emitting elements 300 disposed in each sub-pixel PXn may be placed in a region other than the region between the electrode branches 210B and 220B. Further, the light emitting element 300 may be disposed such that some areas thereof overlap the electrodes 210 and 220. The light emitting element 300 may be disposed on ends where the first electrode branch 210B and the second electrode branch 220B face each other.

In the light emitting element 300, a plurality of layers may be disposed in a direction parallel to the first insulating layer 510. The light emitting element 300 of the display device 10 according to one embodiment may have a shape extending in one direction and may have a structure in which a plurality of semiconductor layers are sequentially arranged in one direction (e.g., arranged in another direction). In the light emitting element 300, the first semiconductor layer 310, the active layer 330, the second semiconductor layer 320, and an electrode layer 370 may be sequentially disposed along one direction, and the outer surfaces thereof may be surrounded by (e.g., covered by) the first outer film 380. The light emitting element 300 disposed in the display device 10 may be disposed such that one extension direction is parallel to the first insulating layer 510, and the plurality of semiconductor layers included in the light emitting element 300 may be sequentially disposed along the direction parallel to the top surface of the first insulating layer 510.

However, the present disclosure is not limited thereto. In some embodiments, when the light emitting element 300 has a different structure, a plurality of layers may be arranged in a direction perpendicular to the first insulating layer 510.

Further, one end of the light emitting element 300 may contact the first contact electrode 261, and the other end thereof may contact the second contact electrode 262. In accordance with one embodiment, because the end surfaces of the light emitting element 300 in one direction in which it extends are exposed without the first outer film 380 formed thereon, the light emitting element 300 may contact the first contact electrode 261 and the second contact electrode 262, to be described later, in the exposed regions. However, the present disclosure is not limited thereto. In some embodiments, in the light emitting element 300, at least a partial region of the first outer film 380 may be removed, and both end side surfaces of the light emitting element 300 may be partially exposed by the removal of the first outer film 380. The first outer film 380 may be partially removed in the step of forming the third insulating layer 530 covering the outer surface of the light emitting element 300 during the manufacturing process of the display device 10. The exposed side surfaces of the light emitting element 300 may contact the first contact electrode 261 and the second contact electrode 262. However, the present disclosure is not limited thereto.

The third insulating layer 530 may be partially disposed on the light emitting element 300 disposed between the first electrode 210 and the second electrode 220. The third insulating layer 530 may be disposed to partially surround (e.g., to cover or extend around) the outer surface of the light emitting element 300 to protect the light emitting element 300 and may fix the light emitting element 300 during the manufacturing process of the display device 10. In accordance with one embodiment, the third insulating layer 530 may be disposed on the light emitting element 300 and may expose one end and the other end of the light emitting element 300. One end and the other end of the light emitting element 300 that are exposed may contact the contact electrode 260 so that electrical signals may be received from the electrodes 210 and 220. The shape of the third insulating layer 530 may be formed by a patterning process using a material forming the third insulating layer 530 using a conventional mask process. The mask for forming the third insulating layer 530 may have a width smaller than the length of the light emitting element 300, and the material forming the third insulating layer 530 may be patterned such that both ends of the light emitting element 300 are exposed. However, the present disclosure is not limited thereto.

Further, in an embodiment, a portion of the material of the third insulating layer 530 may be disposed between the bottom surface of the light emitting element 300 and the second insulating layer 520. The third insulating layer 530 may be formed to fill a space between the second insulating layer 520 and the light emitting element 300 formed during the manufacturing process of the display device 10. Accordingly, the third insulating layer 530 may be formed to surround the outer surface of the light emitting element 300. However, the present disclosure is not limited thereto.

The third insulating layer 530 may extend in the second direction DR2 between the first electrode branch 210B and the second electrode branch 220B in a plan view. For example, the third insulating layer 530 may have an island shape or a linear shape on the first insulating layer 510 in a plan view.

The first contact electrode 261 is disposed on the first electrode 210 and the third insulating layer 530, and the second contact electrode 262 is disposed on the second electrode 220 and the third insulating layer 530. The third insulating layer 530 may be disposed between the first contact electrode 261 and the second contact electrode 262 and may insulate them from each other to prevent direct contact between the first contact electrode 261 and the second contact electrode 262.

As described above, the first contact electrode 261 and the second contact electrode 262 may contact at least one end of the light emitting element 300, and the first contact electrode 261 and the second contact electrode 262 may be electrically connected to the first electrode 210 or the second electrode 220, respectively, to receive an electrical signal.

The first contact electrode 261 may contact the exposed area of the first electrode 210 on the first internal bank 410, and the second contact electrode 262 may contact the exposed area of the second electrode 220 on the second internal bank 420. The first contact electrode 261 and the second contact electrode 262 may respectively transmit electrical signals transmitted from the electrodes 210 and 220 to the light emitting element 300.

The contact electrode 260 may include a conductive material. For example, the contact electrode 260 may include ITO, IZO, ITZO, aluminum (Al), or the like. However, the present disclosure is not limited thereto.

A passivation layer 550 may be disposed on the contact electrode 260 and the third insulating layer 530. The passivation layer 550 may protect the members disposed on the first insulating layer 510 from the external environment.

Each of the first insulating layer 510, the second insulating layer 520, the third insulating layer 530, and the passivation layer 550 described above may include an inorganic insulating material or an organic insulating material. In an embodiment, the first insulating layer 510, the second insulating layer 520, the third insulating layer 530, and the passivation layer 550 may include an inorganic insulating material, such as silicon oxide (SiOx), silicon nitride (SiNx), silicon oxynitride (SiOxNy), aluminum oxide ($Al_2O_3$), aluminum nitride (AlN), and the like. The first insulating layer 510, the second insulating layer 520, the third insulating layer 530, and the passivation layer 550 may include an organic insulating material, such as acrylic resin, epoxy resin, phenolic resin, polyamide resin, polyimide resin, unsaturated polyester resin, polyphenylene resin, polyphenylene-sulfide resin, benzocyclobutene, cardo resin, siloxane resin, silsesquioxane resin, polymethylmethacrylate, polycarbonate, or polycarbonate synthetic resin. However, the present disclosure is not limited thereto.

The display device 10 according to one embodiment may include the light emitting element 300 having the first outer film 380 and the second outer film 390 surrounding the semiconductor core. The first outer film 380 may prevent the active layer 330 of the light emitting element 300 from being damaged, and the second outer film 390 may improve the luminous efficiency and the element reliability of the light emitting element 300. Hereinafter, the light emitting element 300 according to one embodiment will be described in detail with reference to other drawings.

Figure 5:
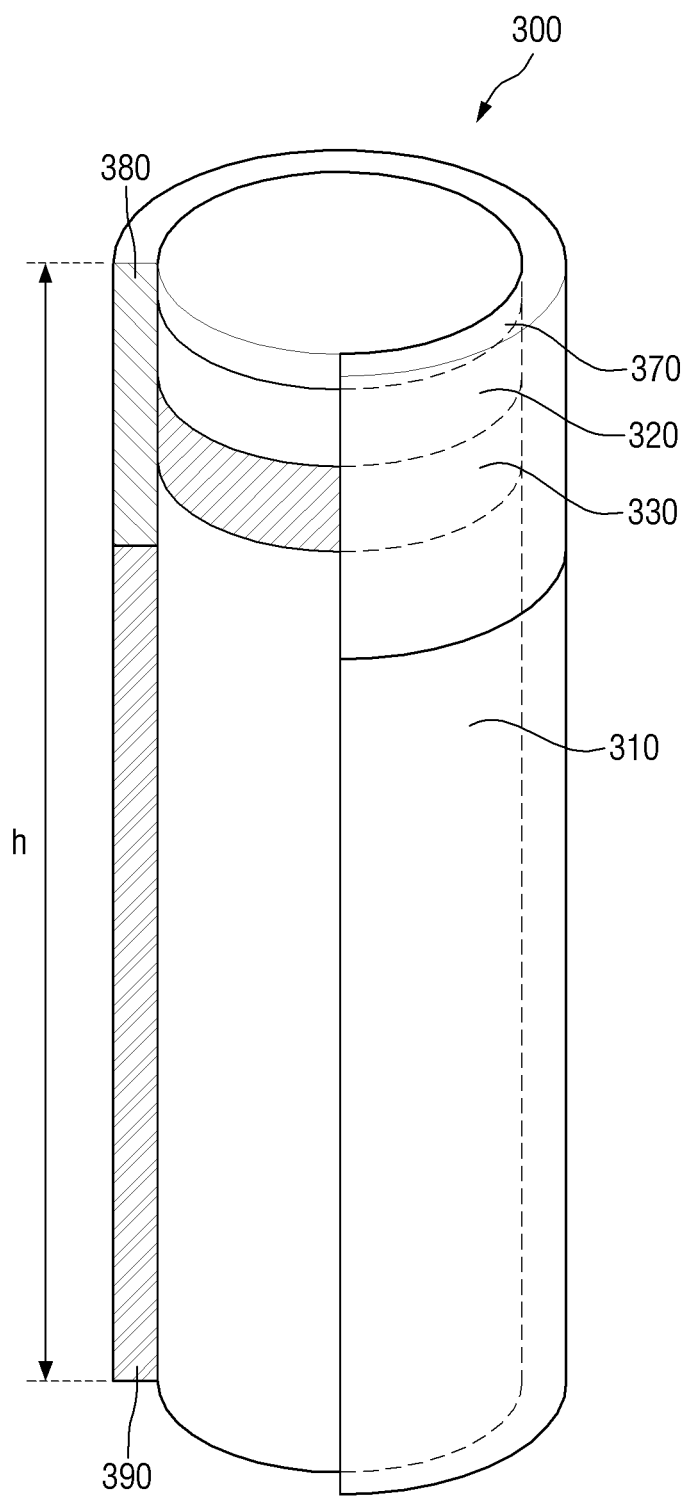
FIG. 5 is a schematic diagram of a light emitting element according to one embodiment.
Figure 6:
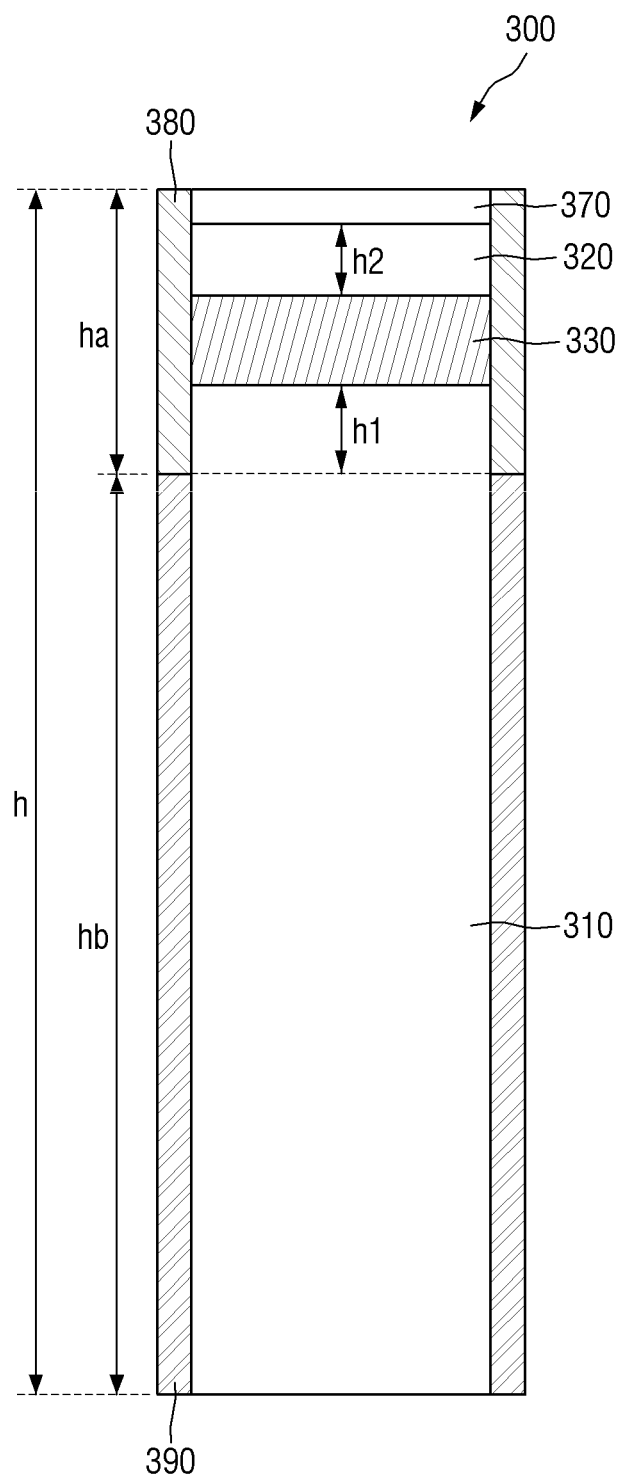
FIG. 6 is a schematic cross-sectional view of the light emitting element shown in FIG. 5.

FIG. 5 is a schematic diagram of a light emitting element according to one embodiment, and FIG. 6 is a schematic cross-sectional view of the light emitting element shown in FIG. 5.

A light emitting element 300 may be a light emitting diode. For example, the light emitting element 300 may be an inorganic light emitting diode that has a micrometer or nanometer size and made of an inorganic material. The inorganic light emitting diode may be aligned between two electrodes having polarity when an electric field is formed in a specific direction between two electrodes opposing each other. The light emitting element 300 may be aligned between two electrodes by the electric field generated between the electrodes.

The light emitting element 300 according to one embodiment may have a shape extending in one direction. The light emitting element 300 may have a shape of a rod, wire, tube, or the like. In an embodiment, the light emitting element 300 may have a cylindrical or rod shape. However, the shape of the light emitting element 300 is not limited thereto, and the light emitting element 300 may have a polygonal prism, shape such as a regular cube, a rectangular parallelepiped, and a hexagonal prism, or may have various other shapes, such as a shape extending in one direction and having an outer surface partially inclined. A plurality of semiconductors included in the light emitting element 300, to be described later, may have a structure in which they are sequentially arranged or stacked along the one direction.

The light emitting element 300 may include a semiconductor layer doped with any conductivity type (e.g., p-type or n-type) impurities. The semiconductor layer may emit light of a specific wavelength band by receiving an electrical signal applied from an external power source.

The light emitting element 300 according to one embodiment may emit light of a specific wavelength band. In an embodiment, an active layer 330 may emit blue light having a central wavelength band ranging from about 450 nm to about 495 nm. However, it should be understood that the central wavelength band of blue light is not limited to the above-mentioned range but includes all wavelength ranges that can be recognized as blue in the pertinent art. Further, the light emitted from the active layer 330 of the light emitting element 300 may not be limited thereto and may be green light having a central wavelength band ranging from about 495 nm to about 570 nm or red light having a central wavelength band ranging from about 620 nm to about 752 nm. Hereinafter, the description will be provided on the assumption that the light emitting element 300 emits blue light, as an example.

Referring to FIGS. 5 and 6, the light emitting element 300 may include the semiconductor core and the first outer film 380 and the second outer film 390 surrounding the semiconductor core, and the semiconductor core of the light emitting element 300 may include the first semiconductor layer 310, the second semiconductor layer 320, and the active layer 330. Further, the light emitting element 300 according to one embodiment may further include the electrode layer 370 disposed on one surface of the first semiconductor layer 310 or the second semiconductor layer 320.

The first semiconductor layer 310 may be an n-type semiconductor. For example, when the light emitting element 300 emits light of a blue wavelength band, the first semiconductor layer 310 may include a semiconductor material having a chemical formula of $Al_xGa_yIn_{1-x-y}N$ ($0 \leq x \leq 1$, $0 \leq y \leq 1$, $0 \leq x+y \leq 1$). For example, it may be any one or more of n-type doped AlGaInN, GaN, AlGaN, InGaN, AlN, and InN. The first semiconductor layer 310 may be doped with an n-type dopant. For example, the n-type dopant may be Si, Ge, Sn, or the like. In an embodiment, the first semiconductor layer 310 may be n-GaN doped with n-type Si. The length of the first semiconductor layer 310 may be in a range of about 1.5 μm to about 5 μm but is not limited thereto.

The second semiconductor layer 320 is disposed on the active layer 330, to be described later. The second semiconductor layer 320 may be a p-type semiconductor. For example, when the light emitting element 300 emits light of a blue or green wavelength band, the second semiconductor layer 320 may include a semiconductor material having a chemical formula of $Al_xGa_yIn_{1-x-y}N$ ($0 \leq x \leq 1$, $0 \leq y \leq 1$, $0 \leq x+y \leq 1$). For example, it may be any one or more of p-type doped AlGaInN, GaN, AlGaN, InGaN, AlN, and InN. The second semiconductor layer 320 may be doped with a p-type dopant. For example, the p-type dopant may be Mg, Zn, Ca, Se, Ba, or the like. In an embodiment, the second semiconductor layer 320 may be p-GaN doped with p-type Mg. The length of the second semiconductor layer 320 may be in a range of about 0.05 μm to about 0.10 μm but is not limited thereto.

Although an embodiment in which the first semiconductor layer 310 and the second semiconductor layer 320 are configured as a single layer is illustrated, the present disclosure is not limited thereto. According to some embodiments, depending on the material of the active layer 330, the first semiconductor layer 310 and the second semiconductor layer 320 may further include a other number of layers, such as a cladding layer or a tensile strain barrier reducing (TSBR) layer. A description thereof will be given later with reference to other drawings.

The active layer 330 is disposed between the first semiconductor layer 310 and the second semiconductor layer 320. The active layer 330 may include a material having a single or multiple quantum well structure. When the active layer 330 includes a material having a multiple quantum well structure, a plurality of quantum layers and well layers may be alternately stacked. The active layer 330 may emit light by coupling of electron-hole pairs according to an electrical signal applied through the first semiconductor layer 310 and the second semiconductor layer 320. For example, when the active layer 330 emits light of a blue wavelength band, a material such as AlGaN or AlGaInN may be included. When the active layer 330 has a structure in which quantum layers and well layers are alternately stacked in a multiple quantum well structure, the quantum layer may include a material, such as AlGaN or AlGaInN, and the well layer may include a material, such as GaN or AlInN. In an embodiment, as described above, the active layer 330 includes AlGaInN as a quantum layer and AlInN as a well layer, and the active layer 330 may emit blue light having a central wavelength band of about 450 nm to about 495 nm.

However, the present disclosure is not limited thereto, and the active layer 330 may have a structure in which semiconductor materials having large band gap energy and semiconductor materials having small band gap energy are alternately stacked and may include other group III to V semiconductor materials according to the wavelength band of the emitted light. The light emitted by the active layer 330 is not limited to light of a blue wavelength band, but the active layer 330 may also emit light of a red or green wavelength band in some embodiments. The length of the active layer 330 may be in a range of about 0.05 μm to about 0.10 μm but is not limited thereto.

Light emitted from the active layer 330 may be emitted to both side surfaces as well as the outer surface of the light emitting element 300 in a longitudinal direction. The directionality of the light emitted from the active layer 330 is not limited to one direction.

The electrode layer 370 may be an ohmic contact electrode. However, the present disclosure is not limited thereto, and it may be a Schottky contact electrode. The light emitting element 300 may include at least one electrode layer 370. Although the embodiment shown in FIG. 6 includes one electrode layer 370, the present disclosure is not limited thereto. In some embodiments, the light emitting element 300 may include a greater number of electrode layers 370 or may be omitted. The following description of the light emitting element 300 may be equally applied even if the number of electrode layers 370 is different or further includes other structures.

In the display device 10 according to an embodiment, when the light emitting element 300 is electrically connected to an electrode or a contact electrode, the electrode layer 370 may reduce the resistance between the light emitting element 300 and the electrode or contact electrode. The electrode layer 370 may include a conductive metal. For example, the electrode layer 370 may include at least one of aluminum (Al), titanium (Ti), indium (In), gold (Au), silver (Ag), indium tin oxide (ITO), indium zinc oxide (IZO), or indium tin zinc oxide (ITZO). Further, the electrode layer 370 may include an n-type or p-type doped semiconductor material. The electrode layer 370 may include the same material or different materials. The length of the electrode layer 370 may be within a range of about 0.02 μm to about 0.1 μm but is not limited thereto.

The first outer film 380 and the second outer film 390 are disposed to surround the outer surface of the semiconductor core. The first outer film 380 may be disposed to surround parts of other semiconductor layers 310 and 320 including the active layer 330 or a part of the electrode layer 370. The second outer film 390 may be disposed to surround the exposed outer surface of the semiconductor core where the first outer film 380 is not disposed. The first outer film 380 and the second outer film 390 may be disposed to surround the outer surface, for example, the side surface, of the semiconductor core, and both end surfaces of the light emitting element 300 in the extension direction may be exposed. The thicknesses of the first outer film 380 and the second outer film 390 may be within a range of about 10 nm to about 1.0 μm but are not limited thereto. The thicknesses of the first outer film 380 and the second outer film 390 may be about 40 nm.

In accordance with one embodiment, the first outer film 380 may be disposed to surround at least the outer surface of the active layer 330 and may extend in one direction in which the light emitting element 300 extends. For example, the first outer film 380 may be disposed to surround the outer surfaces of the active layer 330, the second semiconductor layer 320, and the electrode layer 370, and only a partial region of the first semiconductor layer 310. However, the present disclosure is not limited thereto, and the first outer film 380 may be formed to expose a part of the outer surface of the electrode layer 370.

Although the first outer film 380 extends in the longitudinal direction of the light emitting element 300 to cover the side surface of the electrode layer 370 in the embodiment shown in FIGS. 5 and 6, in other embodiments the first outer film 380 may cover only the outer surfaces of some semiconductor layers including the active layer 330 or may cover a part of the outer surface of the electrode layer 370 to partially expose the outer surface of the electrode layer 370. Further, in a cross-sectional view, the first outer film 380 may have a top surface that is rounded in a region adjacent to at least one end of the light emitting element 300.

The first outer film 380 may be an insulating layer for protecting the active layer 330 to prevent the active layer 330 from being damaged by contact with the outside. The first outer film 380 may include materials having insulating properties, for example, silicon oxide ($SiO_x$), silicon nitride ($SiN_x$), silicon oxynitride ($SiO_xN_y$), aluminum nitride (AlN), aluminum oxide ($Al_2O_3$), and the like.

When the second semiconductor layer 320 as well as the active layer 330 are exposed without being protected by the first outer film 380, light emission failure of the light emitting element 300 may occur due to damage occurring during the manufacturing process of the display device 10. When the exposed active layer 330 directly contacts the electrodes 210 and 220 or the contact electrode 260, an electrical short circuit may occur. The light emitting element 300 according to one embodiment may include the first outer film 380 disposed to surround the semiconductor layer including the active layer 330 that may be damaged by a subsequent process or another member so that damage of the light emitting element 300 and the electrical short circuit in the display device 10 may be prevented.

In an embodiment, the first outer film 380 may be disposed to surround the outer surfaces of the active layer 330 and the second semiconductor layer 320 and may be disposed to surround a partial outer surface of the first semiconductor layer 310 to secure a process margin. The active layer 330 and the second semiconductor layer 320 surrounded by the first outer film 380 need to be protected to allow that the light emitting element 300 to generate light, and other members may be further disposed in a partial region of the first semiconductor layer 310 in which the first outer film 380 is not disposed. For example, in the light emitting element 300 according to one embodiment, the first outer film 380 may be disposed on one side with respect to the active layer 330, and the second outer film 390 or the first outer film 380 and the second outer film 390 may be disposed on the other side with respect to the active layer 330. Accordingly, in the light emitting element 300, the first outer film 380 may be disposed only in a partial region including the active layer 330 to protect it, and the second outer film 390 may be disposed in the other region to improve the luminous efficiency of the light emitting element 300.

A length ha of the first outer film 380 measured in one direction in which the light emitting element 300 extends may vary depending on a length hb of the second outer film 390. In some embodiments, the first outer film 380 may be disposed to extend in both directions with respect to the active layer 330 by the thickness of the second semiconductor layer 320. For example, a length h1 of the region in which the first outer film 380 surrounds the outer surface of the first semiconductor layer 310 may be the same as a thickness h2 of the second semiconductor layer 320. Accordingly, the length hb of the second outer film 390 may be the same as the thickness of the first semiconductor layer 310 except the length h1 of the region thereof in which the first outer film 380 is disposed. However, the present disclosure is not limited thereto.

Further, in some embodiments, the first outer film 380 may have an outer surface which is surface-treated. When the display device 10 is manufactured, the light emitting elements 300 may be aligned by being sprayed on the electrodes in a state of being dispersed in an ink (e.g., in a predetermined ink). Here, the surface of the first outer film 380 may be treated to have a hydrophobic property or hydrophilic property to keep the light emitting element 300 in the dispersed state without being aggregated with other neighboring light emitting elements 300 in the ink.

The second outer film 390 may be disposed in a region of the outer surface of the semiconductor core in which the first outer film 380 is not disposed. In an embodiment, the second outer film 390 may be disposed to surround a part of the outer surface of the first semiconductor layer 310 and extend in one direction in which the light emitting element 300 extends, similar to the first outer film 380. However, different from the first outer film 380, the second outer film 390 may not contact the active layer 330, the second semiconductor layer 320, and the electrode layer 370. For example, in accordance with one embodiment, the second outer film 390 may be disposed to be spaced apart from at least the active layer 330.

The first outer film 380 may be disposed to protect the active layer 330 of the light emitting element 300, whereas the second outer film 390 may be disposed not to overlap the active layer 330 to increase the efficiency of the light emitting element 300. In accordance with one embodiment, the second outer film 390 of the light emitting element 300 may be a functional film that is disposed in a region other than the region in which the first outer film 380 is disposed to improve the luminous efficiency of the light emitting element 300. The light emitting element 300 may include the first outer film 380 disposed to protect the active layer 330 for generating light and reduced or minimizes the region in which the first outer film 380 is applied. The second outer film 390, that is, a functional film, may be disposed in the other region to improve the efficiency of the light emitting element 300. The second outer film 390 may be a scattering layer or a refractive layer that allows light generated in the active layer 330 to be smoothly emitted. In some embodiments, the second outer film 390 may be a heat dissipation layer that smoothly emits (e.g., radiates) heat generated in the active layer 330. This may vary depending on the material of a base layer 3900 (see, e.g., FIG. 14) forming the second outer film 390 during the manufacturing process of the light emitting element 300. A description thereof will be given later.

The light emitting element 300 may have a length in a range of about 1 μm to about 10 μm or about 2 μm to about 6 μm, and in some embodiments, about 3 μm to about 5 μm. Further, a diameter of the light emitting element 300 may have a range of 300 nm to 700 nm, and an aspect ratio of the light emitting element 300 may be 1.2 to 100. However, the present disclosure is not limited thereto, and the plurality of light emitting elements 300 included in the display device 10 may have different diameters according to a difference in composition of the active layer 330. The diameter of the light emitting element 300 may be in a range of about 500 nm.

Because the light emitting element 300 includes the different first and second outer films 380 and 390 surrounding the semiconductor core, the members of the display device 10 may form different contact surfaces with the light emitting element 300.

Figure 7:
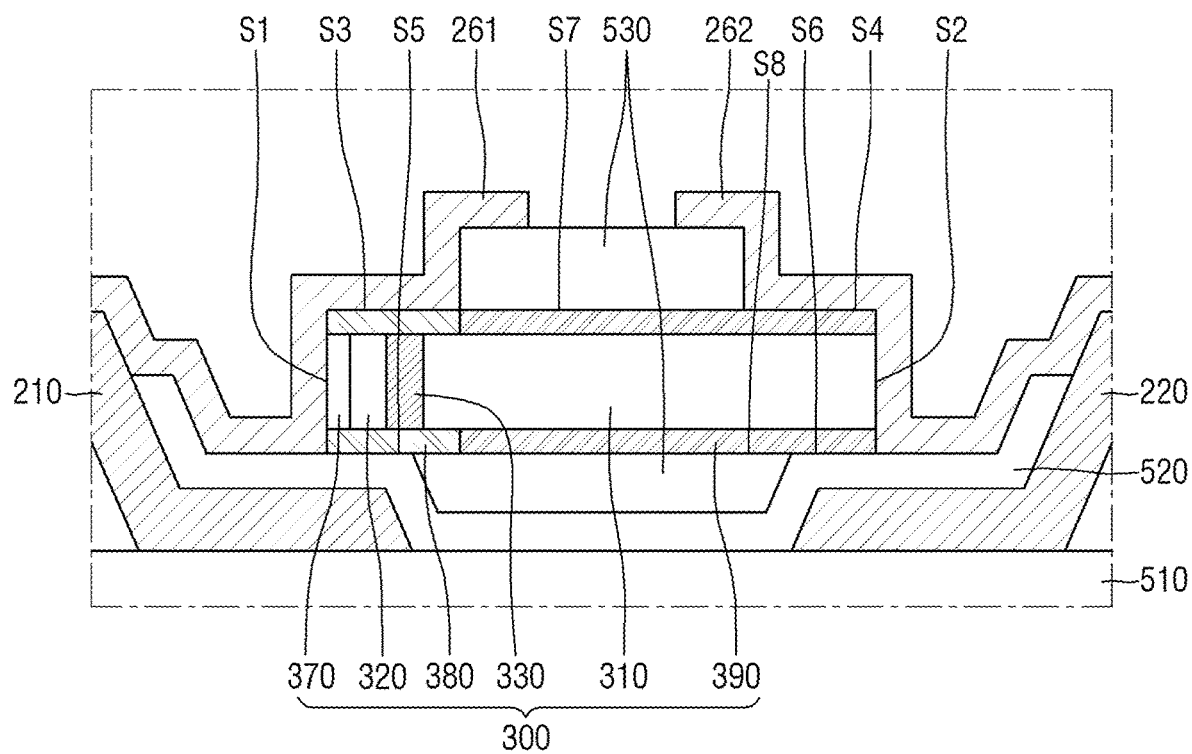
FIG. 7 is an enlarged view of the part QA of FIG. 4.

FIG. 7 is an enlarged view of the part QA of FIG. 4.

FIG. 7 is an enlarged cross-sectional view illustrating the light emitting element 300 disposed between the first electrode 210 and the second electrode 220 in the display device 10. Referring to FIG. 7 in conjunction with FIGS. 5 and 6, the light emitting element 300 may be disposed on the second insulating layer 520 between the first electrode 210 and the second electrode 220. The light emitting element 300 may contact the second insulating layer 520, the third insulating layer 530, the first contact electrode 261, and the second contact electrode 262 simultaneously, and the second insulating layer 520, the third insulating layer 530, the first contact electrode 261, and the second contact electrode 262 may contact different outer films 380 and 390 or end surfaces of the light emitting element 300 to form different contact surfaces.

The first contact electrode 261 (e.g., the top surface of the electrode layer 370) may contact one end surface of the light emitting element 300 to form a first contact surface S1, and the second contact electrode 262 (e.g., the bottom surface of the first semiconductor layer 310) may contact with the other end surface of the light emitting element 300 to form a second contact surface S2. Further, the first contact electrode 261 may contact a part of the first outer film 380 surrounding the active layer 330 of the light emitting element 300 to form a third contact surface S3, and the second contact electrode 262 may contact a part of the second outer film 390 surrounding the first semiconductor layer 310 to form a fourth contact surface S4.

Further, the first outer film 380 and the second outer film 390 may contact with the second insulating layer 520, respectively, to form a fifth contact surface S5 and a sixth contact surface S6, and the second outer film 390 may contact the third insulating layer 530 disposed on the upper side and the lower side of the light emitting element 300, respectively, to form a seventh contact surface S7 and an eighth contact surface S8.

The display device 10 may have a surface that is not parallel but perpendicular to the substrate or the first insulating layer 510 and a surface parallel thereto from among the surfaces on which the contact electrodes 261 and 262 contact the light emitting element 300. The first contact surface S1 between the first contact electrode 261 and the light emitting element 300 and the second contact surface S2 between the second contact electrode 262 and the light emitting element 300 may form surfaces perpendicular to the first insulating layer 510. The first contact surface S1 and the second contact surface S2, which are both end surfaces of the light emitting element 300, may be contact surfaces to which electrical signals are transmitted from the contact electrodes 261 and 262, respectively.

The third contact surface S3 between the first contact electrode 261 and the light emitting element 300 and the fourth contact surface S4 between the second contact electrode 262 and the light emitting element 300 may form surfaces parallel to the first insulating layer 510. In accordance with one embodiment, the contact electrodes 261 and 262 may contact the different outer films 380 and 390 of the light emitting element 300, respectively, to form the surfaces parallel to the substrate or the first insulating layer 510. The third contact surface S3 is a contact surface between the first contact electrode 261 and the first outer film 380, and the fourth contact surface S4 is a contact surface between the second contact electrode 262 and the second outer film 390. In the light emitting element 300, because the different outer films 380 and 390 are disposed on one side and the other side with respect to the active layer 330 to surround the semiconductor core, the first contact electrode 261 and the second contact electrode 262 contacting both ends (e.g., opposite ends) of the light emitting element 300 may form contact surfaces with the different outer films 380 and 390, respectively.

Similarly, the second insulating layer 520 may contact the different outer films 380 and 390 of the light emitting element 300 to form different contact surfaces, such as the fifth contact surface S5 and the sixth contact surface S6. The fifth contact surface S5 and the sixth contact surface S6 may be the surfaces parallel to the first insulating layer 510, and they may face the third contact surface S3 and the fourth contact surface S4, respectively.

The third insulating layer 530 may be disposed on the upper side and the lower side of the light emitting element 300 during the manufacturing process of the display device 10. Although the illustrated embodiment has the third insulating layer 530 contacting only the second outer film 390 of the light emitting element 300 to form the seventh contact surface S7 and the eighth contact surface S8, the present disclosure is not limited thereto. In some embodiments, the length ha of the first outer film 380 may be formed to be longer than as illustrated in FIG. 7, so that the seventh contact surface S7 and the eighth contact surface S8 formed by the contact between the third insulating layer 530 and the light emitting element 300 may be formed across the first outer film 380 and the second outer film 390. A description thereof may refer to other embodiments.

The active layer 330 of the light emitting element 300 may be surrounded by the first outer film 380, and direct contact between the first contact electrode 261 or the second contact electrode 262 and the active layer 330 may be prevented. Accordingly, in the light emitting element 300, the active layer 330 is protected so that an electrical short circuit or light emission failure may be prevented. On the other hand, a part of the first semiconductor layer 310 of the light emitting element 300 may be surrounded by the second outer film 390, and the second outer film 390 may be disposed to be spaced apart from the active layer 330. Because the active layer 330 of the light emitting element 300 does not contact another member in the region in which the second outer film 390 is disposed, the second outer film 390 may include (or contain) a specific material to improve the efficiency of the light emitting element 300.

In an embodiment, the second outer film 390 may include (or contain) a material having a relatively high refractive index to reduce a difference in refractive index between the semiconductor layers 310 and 320 and the outside and prevent total reflection of light.

Figure 8:
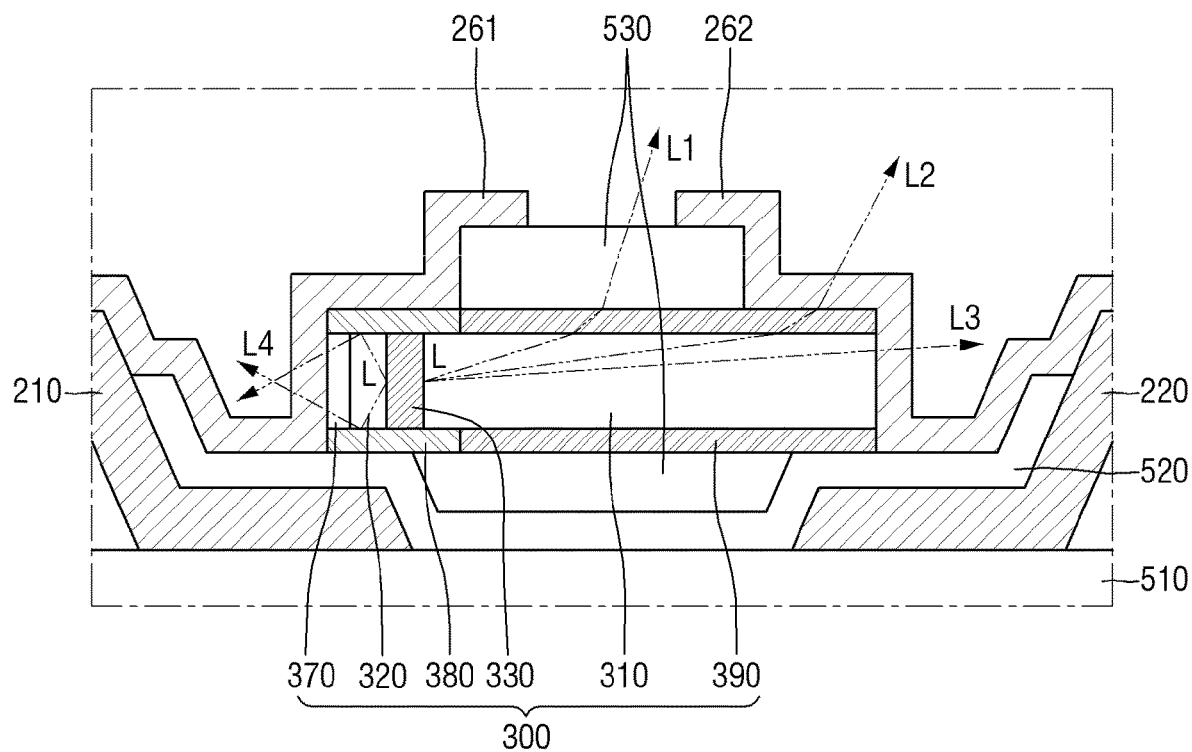
FIG. 8 is a schematic diagram illustrating emission of light generated by the light emitting element of a display device according to one embodiment.

FIG. 8 is a schematic diagram illustrating emission of light generated from the light emitting element of a display device according to one embodiment.

Referring to FIG. 8, light L generated in the active layer 330 of the light emitting element 300 may travel without directionality. From among the lights L generated in the active layer 330, a light L4 may travel toward the first outer film 380, lights L1 and L2 may travel toward the second outer film 390, and a light L3 may travel toward an end surface where the outer films 380 and 390 are not disposed. The light L may commonly travel from the active layer 330 to the outer films 380 and 390 of the light emitting element 300 through the first semiconductor layer 310 or the second semiconductor layer 320.

As described above, the first semiconductor layer 310 and the second semiconductor layer 320 may include (or contain) a semiconductor material and may have a high refractive index. In such an embodiment, the light traveling toward the first outer film 380 and the second outer film 390 may be totally reflected depending on the refractive index of the first outer film 380 or the second outer film 390 between the outside of the light emitting element 300 and the semiconductor layers 310 and 320. The first outer film 380 may include (or contain) an insulating material and may have a relatively low refractive index. From among the light L generated in the active layer 330, the light L4 traveling toward the first outer film 380 may be totally reflected when it travels from the semiconductor layers 310 and 320 having a high refractive index toward the first outer film 380 having a low refractive index. As shown in FIG. 8, the light L4 traveling toward the first outer film 380 may be totally reflected at the boundary between the second semiconductor layer 320 and the first outer film 380 and then emitted to one end surface of the light emitting element 300 through the electrode layer 370 and the first contact electrode 261.

On the other hand, the light emitting element 300 according to one embodiment may include the second outer film 390 having a relatively high refractive index so that the lights L1 and L2 traveling toward the second outer film 390 may be refracted without totally reflection at the boundary with the first semiconductor layer 310 and emitted to the outside of the light emitting element 300. The refractive index of the second outer film 390 may be adjusted between the refractive index of the first outer film 380 and the refractive indices of the semiconductor layers 310 and 320. In some embodiments, the refractive index of the second outer film 390 may be greater than about 1, which is the refractive index of the outside of the light emitting element 300, and may be smaller than about 2.4, which is the average refractive index of the semiconductor layers 310 and 320. However, the present disclosure is not limited thereto.

The light L1 generated in the active layer 330 and traveling toward the seventh contact surface S7 between the second outer film 390 of the light emitting element 300 and the third insulating layer 530 may be emitted to the upper side of the light emitting element 300 through the first semiconductor layer 310, the second outer film 390, and the third insulating layer 530. The light L2 traveling toward the fourth contact surface S4 between the second outer film 390 of the light emitting element 300 and the second contact electrode 262 may be emitted to the upper side of the light emitting element 300 through the first semiconductor layer 310, the second outer film 390, and the second contact electrode 262. In addition, the light L3 traveling toward the other end of the light emitting element 300 may be emitted to the outside of the light emitting element 300 through the first semiconductor layer 310 and the second contact electrode 262. The light L3 and L4 emitted to one end and the other end of the light emitting element 300 may be reflected by the electrodes 210 and 220 on the internal banks 410 and 420 and emitted to the upper side of the light emitting element 300 as described above.

The light emitting element 300 according to one embodiment may include the second outer film 390 that reduces the difference in refractive index between the semiconductor layers 310 and 320 and the outside so that the amount of light L1 and L2 generated in the active layer 330 and directly emitted to the upper side of the light emitting element 300 as well as the amount of light L3 and L4 emitted from both ends of the light emitting element 300 and reflected by the electrodes 210 and 220 may increase. Accordingly, the display device 10 may include the light emitting element 300 including the first outer film 380 and the second outer film 390 to prevent light emission failure of the light emitting element 300 and improve luminous efficiency.

The display device 10 may further include a grater number of insulating layers. According to one embodiment, the display device 10 may further include a fourth insulating layer 540 (see, e.g., FIG. 9) disposed to protect the first contact electrode 261.

Figure 9:
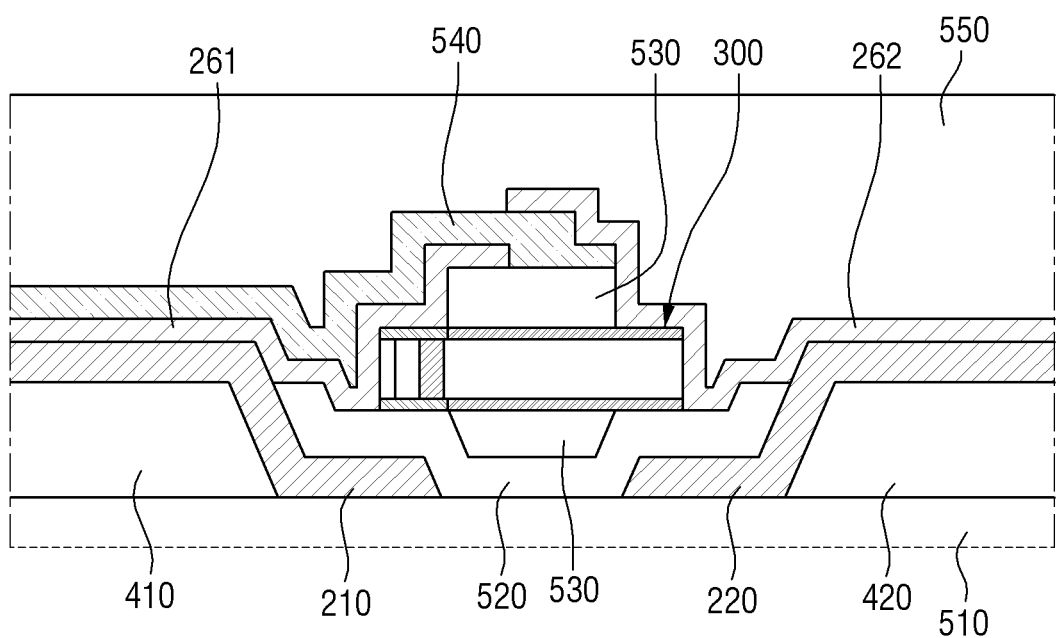
FIG. 9 is a cross-sectional view illustrating a part of a display device according to one embodiment.

FIG. 9 is a cross-sectional view illustrating a part of a display device according to one embodiment.

Referring to FIG. 9, the display device 10 according to one embodiment may further include a fourth insulating layer 540 disposed on the first contact electrode 261. The display device 10 according to an embodiment is different from the display device 10 shown in FIG. 4 in that it further includes the fourth insulating layer 540 and at least a part of the second contact electrode 262 is disposed on the fourth insulating layer 540. In the following description, redundant description will be omitted while focusing on differences.

The display device 10 shown in FIG. 9 may include the fourth insulating layer 540 that is disposed on the first contact electrode 261 and electrically insulates the first contact electrode 261 and the second contact electrode 262 from each other. The fourth insulating layer 540 may be arranged to cover the first contact electrode 261 and to not overlap (e.g., offset from) a partial region of the light emitting element 300 such that the light emitting element 300 is connected to the second contact electrode 262. The fourth insulating layer 540 may partially contact the first contact electrode 261 and the third insulating layer 530 on the top surface of the third insulating layer 530. The fourth insulating layer 540 may be disposed on the third insulating layer 530 to cover one end of the first contact electrode 261. Accordingly, the fourth insulating layer 540 may protect the first contact electrode 261 and electrically insulate it from the second contact electrode 262.

A side surface of the fourth insulating layer 540 in a direction in which the second contact electrode 262 is disposed may be aligned with one side surface of the third insulating layer 530. However, the present disclosure is not limited thereto. In some embodiments, the fourth insulating layer 540 may include (or contain) an inorganic insulating material, similar to the second insulating layer 520.

The first contact electrode 261 may be disposed between the first electrode 210 and the fourth insulating layer 540, and the second contact electrode 262 may be disposed on the fourth insulating layer 540. The second contact electrode 262 may partially contact the second insulating layer 520, the third insulating layer 530, the fourth insulating layer 540, the second electrode 220, and the light emitting element 300. One end of the second contact electrode 262 in a direction in which the first electrode 210 is disposed may be disposed on the fourth insulating layer 540.

The passivation layer 550 may be disposed on the fourth insulating layer 540 and the second contact electrode 262 to protect them. Hereinafter, redundant description will be omitted.

Hereinafter, a manufacturing process of the light emitting element 300 according to one embodiment will be described.

Figure 10:
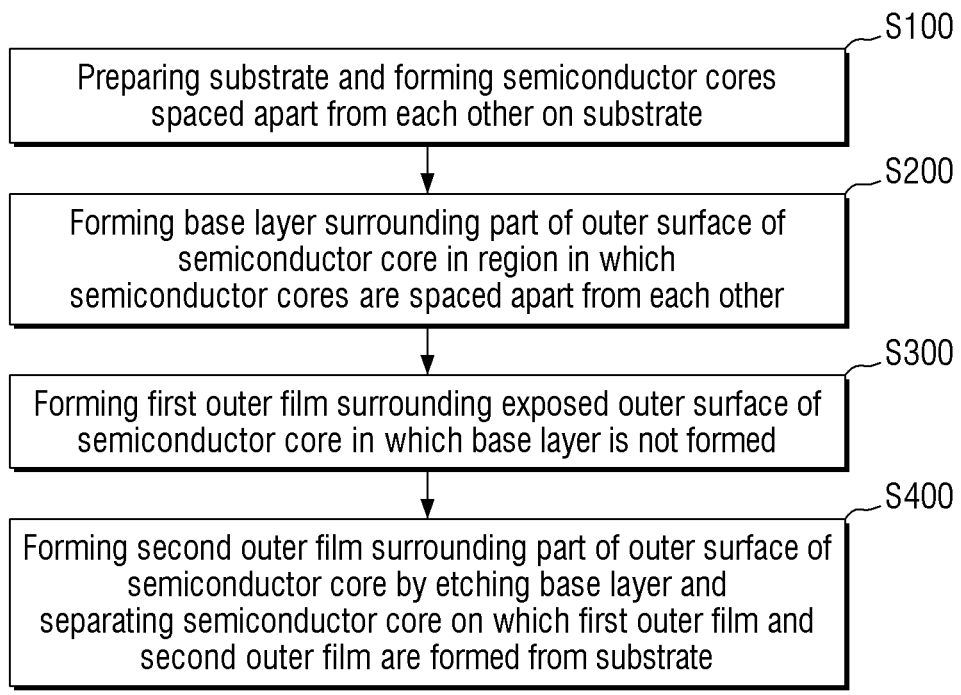
FIG. 10 is a flowchart showing a method of manufacturing a light emitting element according to one embodiment.

FIG. 10 is a flowchart describing a method of manufacturing a light emitting element according to one embodiment.

Referring to FIG. 10, a method of manufacturing the light emitting element 300 according to one embodiment includes: preparing a substrate and forming a plurality of semiconductor cores spaced apart from each other on the substrate (step S100); forming a base layer surrounding a part of the outer surface of the semiconductor core in the region in which the plurality of semiconductor cores are spaced apart from each other (step S200); forming the first outer film surrounding the exposed outer surface of the semiconductor core in which the base layer is not disposed (or formed) (step S300); and forming the second outer film surrounding a part of the outer surface of the semiconductor core by etching the base layer and separating the semiconductor core on which the first outer film and the second outer film are formed from the substrate (step S400).

The light emitting element 300 according to one embodiment may be manufactured by a process of forming the semiconductor core including the active layer 330, forming the base layer 3900 (see, e.g., FIG. 14) forming the second outer film 390, and then forming the first outer film 380 and the second outer film 390. Because the light emitting element 300 includes the different outer films 380 and 390, a process for forming each of them may be performed. For example, when the base layer 3900 for forming the second outer film 390 is formed, the function of the second outer film 390 may be adjusted depending on the selection of the material thereof. Hereinafter, the manufacturing method of the light emitting element 300 will be described in detail with further reference to other drawings.

FIGS. 11 to 18 are cross-sectional views showing steps of a manufacturing process of a light emitting element according to one embodiment.

Figure 11:
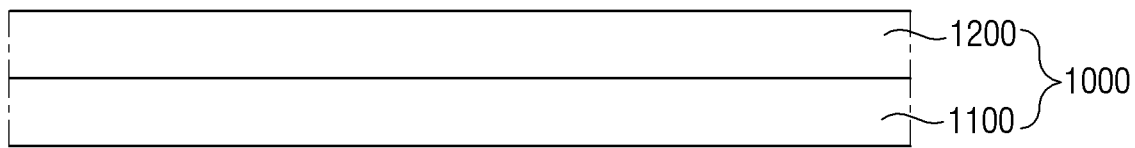
FIGS. 11 to 18 are cross-sectional views showing some steps of a manufacturing process of a light emitting element according to one embodiment.

First, referring to FIG. 11, a lower substrate 1000 including a base substrate 1100 and a buffer material layer 1200 formed on the base substrate 1100 is prepared. The base substrate 1100 may include a transparent substrate, such as a sapphire ($Al_2O_3$) substrate and a glass substrate. However, the present disclosure is not limited thereto, and the base substrate 1100 may be formed of a conductive substrate, such as GaN, SiC, ZnO, Si, GaP, and GaAs. The following description is directed to an embodiment in which the base substrate 1100 is a sapphire ($Al_2O_3$) substrate. Although not limited thereto, the base substrate 1100 may have, for example, a thickness in a range of about 400 μm to about 1500 μm.

A plurality of semiconductor layers are formed on the base substrate 1100. The plurality of semiconductor layers grown by an epitaxial method may be formed by growing seed crystals. In one embodiment, the semiconductor layer may be formed using one of electron beam deposition, physical vapor deposition (PVD), chemical vapor deposition (CVD), plasma laser deposition (PLD), dual-type thermal evaporation, sputtering, and metal organic chemical vapor deposition (MOCVD). In one embodiment, the metal organic chemical vapor deposition (MOCVD) is used. However, the present disclosure is not limited thereto.

A precursor material for forming the plurality of semiconductor layers may be selected to form a target material in a typically selectable range without any limitation. For example, the precursor material may be a metal precursor including an alkyl group, such as a methyl group or an ethyl group. Examples of the precursor material may include, but are not limited to, trimethylgallium ($Ga(CH_3)_3$), trimethylaluminum ($Al(CH_3)_3$), and triethyl phosphate ($(C_2H_5)_3PO_4$). Hereinafter, a description of the processing order of the method for manufacturing the light emitting element 300 and the layered structure of the light emitting element 300 will be provided in detail while the description of the method and processing conditions for forming the plurality of semiconductor layers may be omitted.

A buffer material layer 1200 is formed on the base substrate 1100. Although the illustrated embodiment shows one buffer material layer 1200 that is deposited, the present disclosure is not limited thereto, and a plurality of layers (e.g., a plurality of buffer material layers) may be formed. The buffer material layer 1200 may be disposed to reduce a difference in lattice constant between a first semiconductor 3100 (see, e.g., FIG. 12) and the base substrate 1100.

For example, the buffer material layer 1200 may include an undoped semiconductor and may be a material including substantially the same material as the first semiconductor layer 3100 and neither n-type doped nor p-type doped. In an embodiment, the buffer material layer 1200 may be, but is not limited to, at least one of undoped InAlGaN, GaN, AlGaN, InGaN, AlN, or InN. In some embodiments, the buffer material layer 1200 may be omitted depending on the base substrate 1100. The following description will be given based on an example in which the buffer material layer 1200 including an undoped semiconductor is formed on the base substrate 1100.

Figure 12:
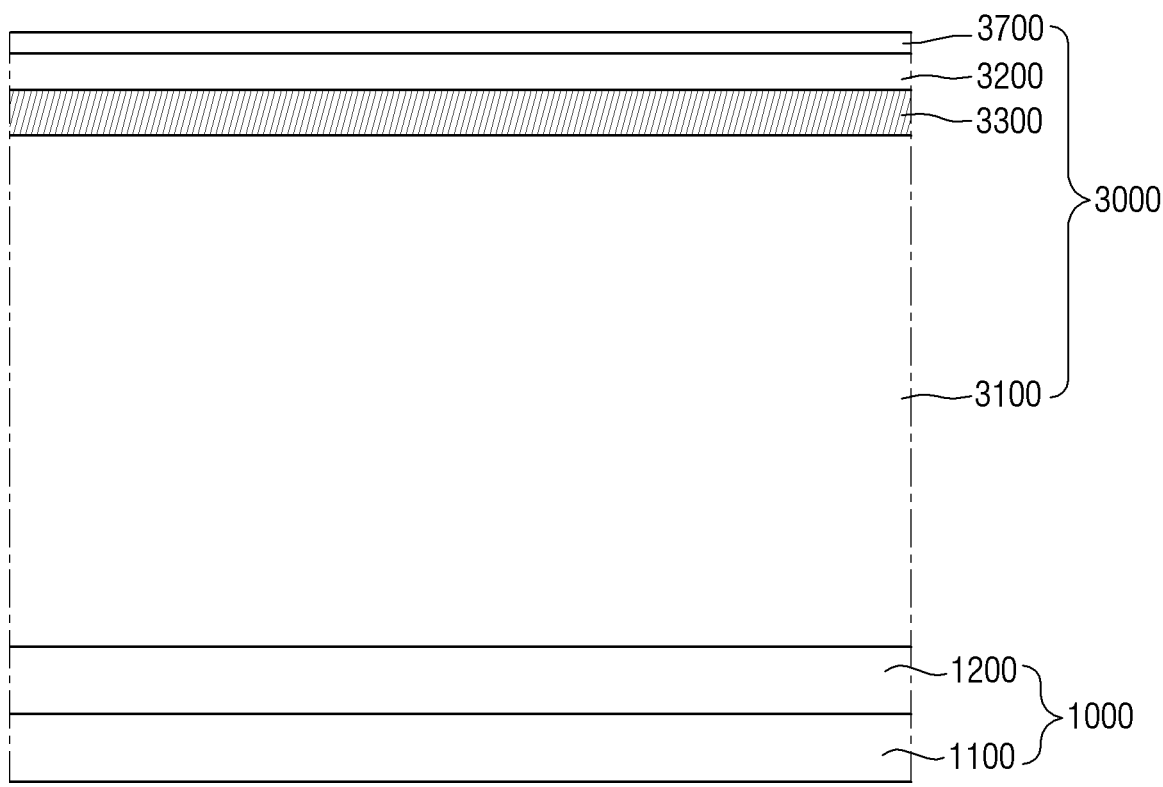

Next, as shown in FIG. 12, the semiconductor structure 3000 is formed on the underlying substrate 1000. The semiconductor structure 3000 may include a first semiconductor 3100, an active layer 3300, a second semiconductor 3200, and an electrode material layer 3700. The plurality of material layers included in the semiconductor structure 3000 may be formed by performing the typical processes as stated above, and the plurality of layers included in the semiconductor structure 3000 may correspond to the respective layers included in the light emitting element 300 according to one embodiment. For example, the plurality of material layers may include the same materials as the first semiconductor layer 310, the active layer 330, the second semiconductor layer 320, and the electrode layer 370 of the light emitting element 300.

Figure 13:
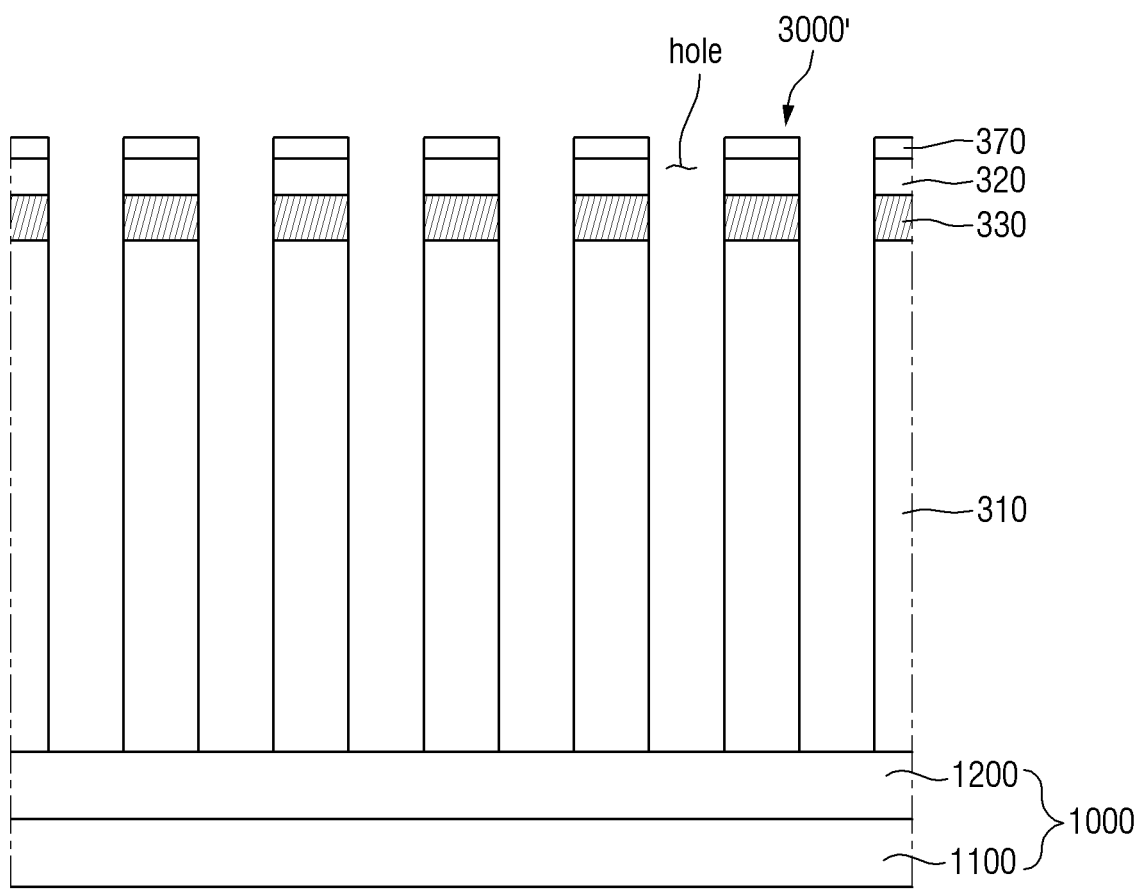

Next, referring to FIG. 13, the semiconductor structure 3000 is etched to form semiconductor cores 3000' spaced apart from each other. The semiconductor structure 3000 may be etched by a conventional method. For example, the semiconductor structure 3000 may be etched by a method of forming an etch mask layer thereon and etching the semiconductor structure 3000 along the etch mask layer in a direction perpendicular to the lower substrate 1000.

For example, the process of etching the semiconductor structure 3000 may be dry etching, wet etching, reactive ion etching (RIE), inductively coupled plasma reactive ion etching (ICP-RIE), or the like. The dry etching may be suitable for vertical etching as it enables anisotropic etching. When using dry etching, $Cl_2$ or $O_2$ may be used as an etchant. However, the present disclosure is not limited thereto.

In some embodiments, the etching of the semiconductor structure 3000 may be carried out with a combination of dry etching and wet etching. For example, the etching may be performed in a depth direction with the dry etching and then anisotropic etching with the wet etching such that the etched sidewalls are on (e.g., are placed on) a plane perpendicular to the surface.

Next, an element rod ROD including the first outer film 380 and the second outer film 390 surrounding the outer surface of the semiconductor core 3000' is formed.

Figure 15:
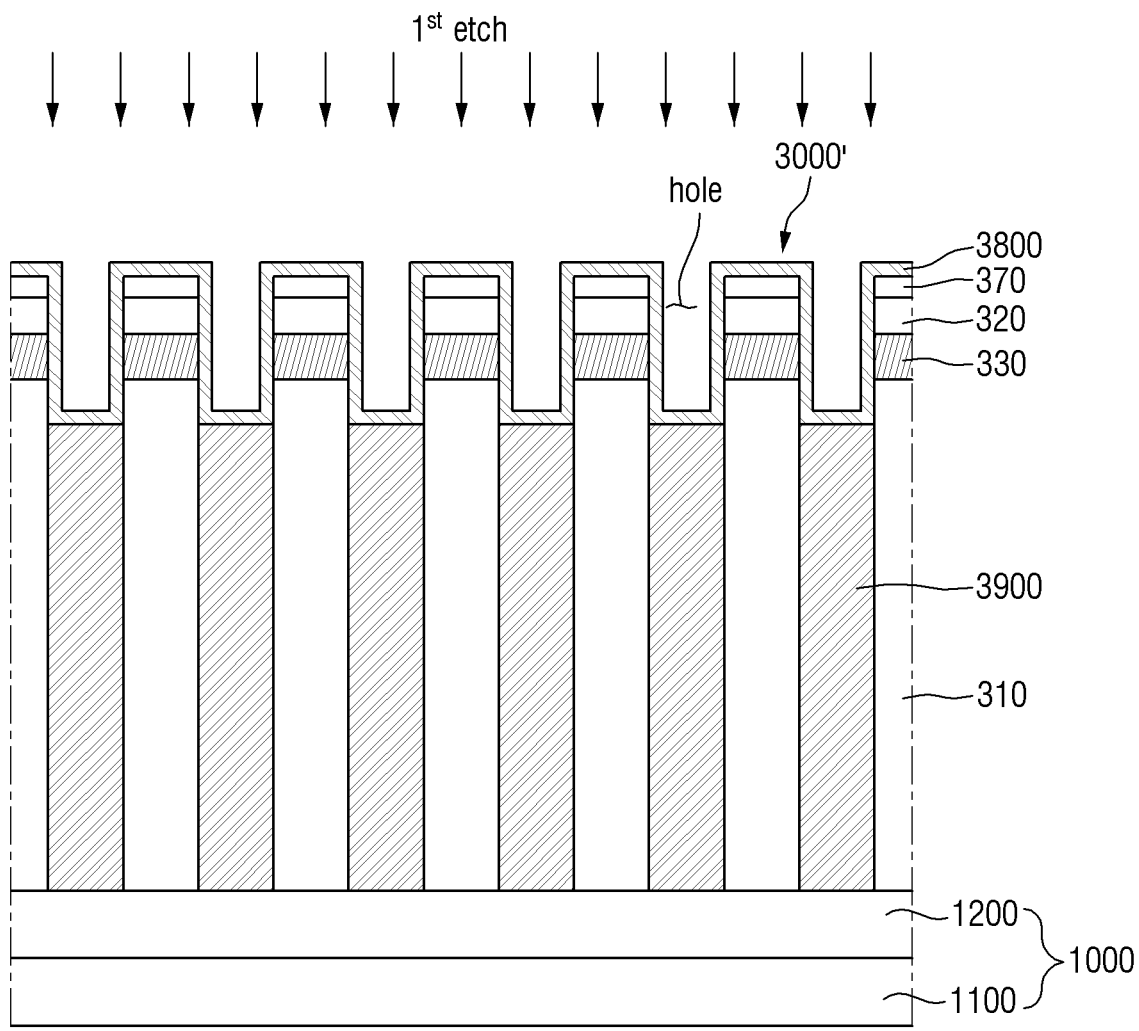
Figure 16:
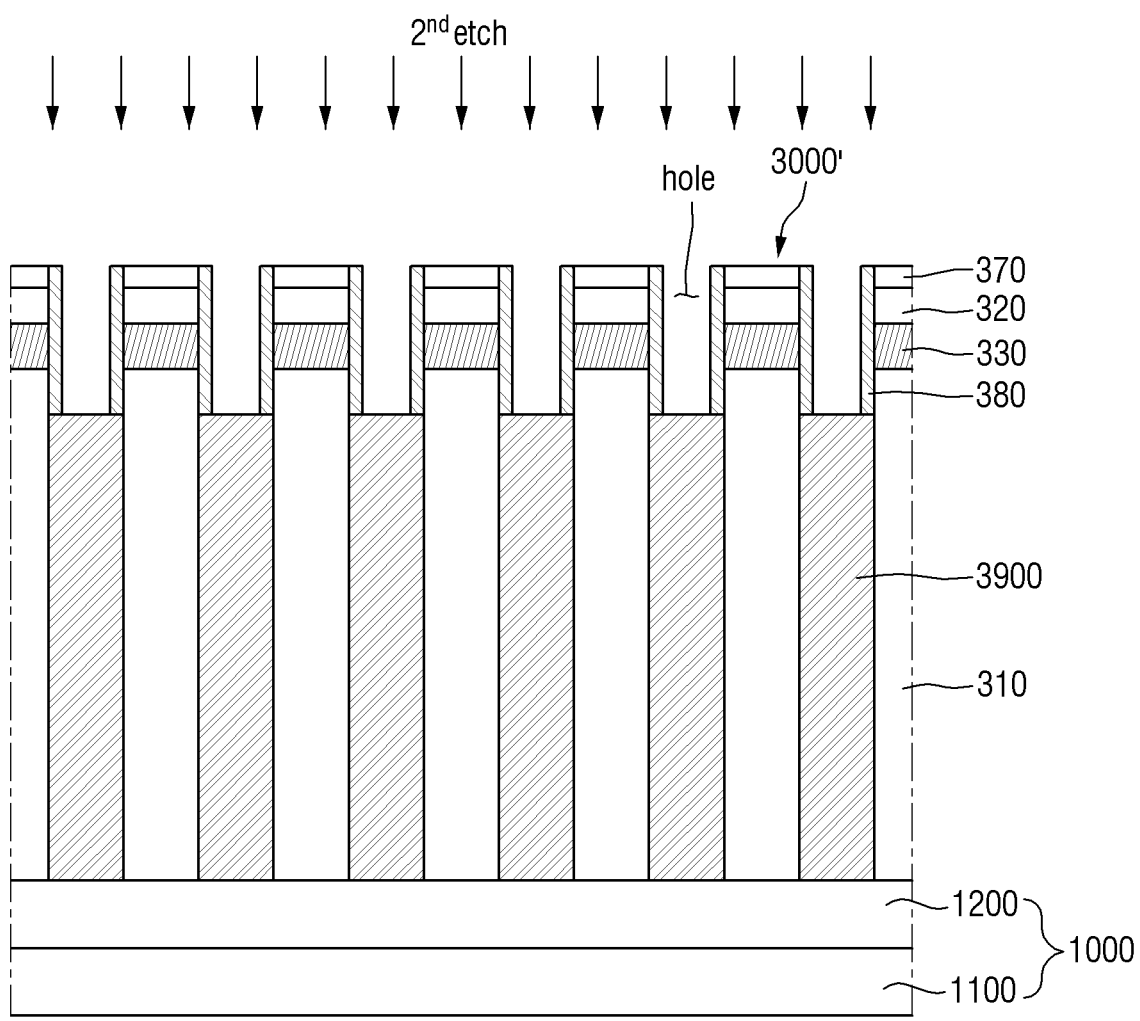

In accordance with one embodiment, forming the first outer film 380 and the second outer film 390 may include a step of forming the base layer 3900 for forming the second outer film 390 (see, e.g., FIG. 14), a first etching process (1st etch) of forming an insulating coating film 3800 forming the first outer film 380 and etching the insulating coating film 3800 (see, e.g., FIG. 15), and a second etching process (2nd etch) of etching the base layer 3900 to form the second outer film 390 (see, e.g., FIG. 16).

Figure 14:
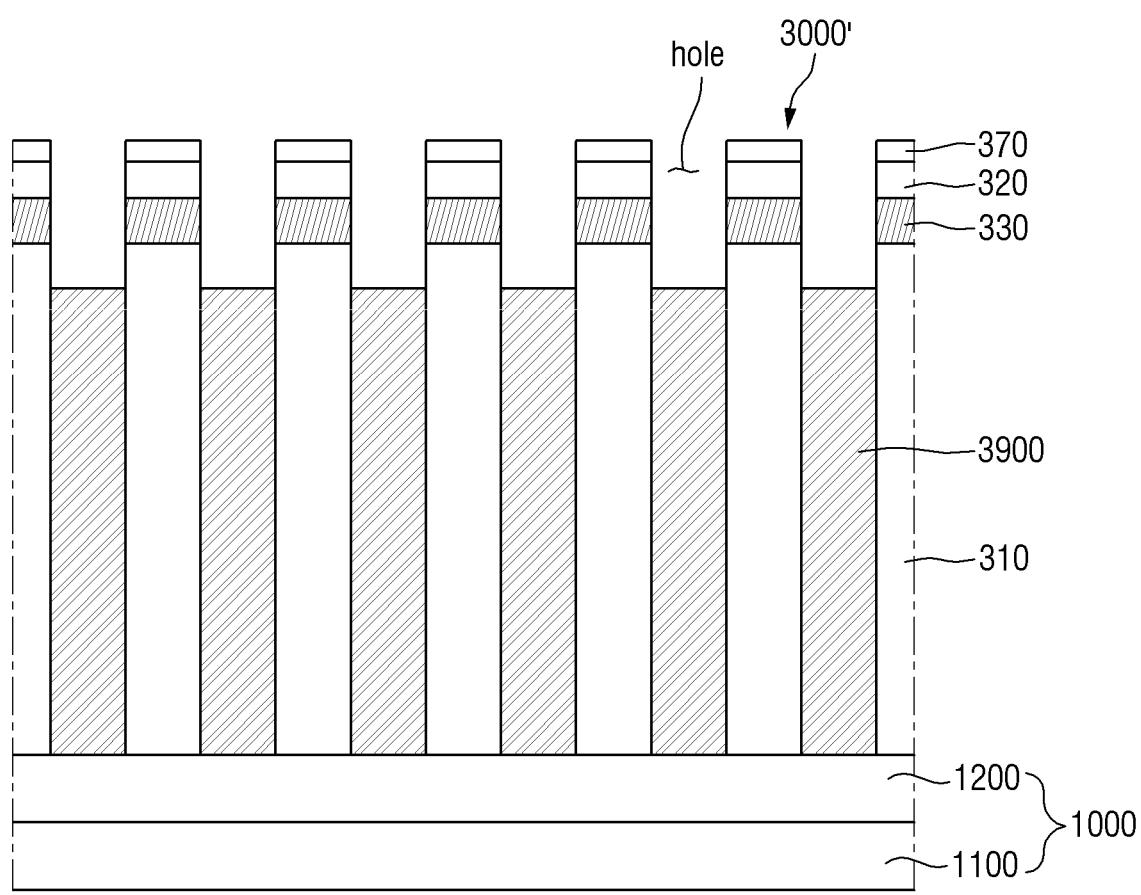

First, referring to FIG. 14, the base layer 3900 surrounding parts of the outer surfaces of the semiconductor cores 3000' spaced apart from each other is formed on the lower substrate 1000. The base layer 3900 may be partially etched in a subsequent process to form the second outer film 390. The base layer 3900 may be formed to fill the spaces between the semiconductor cores 3000' and may be disposed to surround parts of the outer surfaces of the semiconductor cores 3000'.

In an embodiment, the base layer 3900 may be formed to surround a part of the first semiconductor layer 310 of the semiconductor core 3000' and may not contact the active layer 330. As shown in FIG. 14, the height of the base layer 3900 may be lower than the length of the first semiconductor layer 310, and the base layer 3900 may not be formed on the outer surface of the active layer 330. Accordingly, the first outer film 380 to be formed in a subsequent process may be disposed to surround outer surfaces of the first semiconductor layer 310, the active layer 330, and the second semiconductor layer 320.

During the manufacturing process of the light emitting element 300, the base layer 3900, that is, a material forming the second outer film 390, is formed prior to the material forming the first outer film 380 so that the length ha of the first outer film 380 and the length hb of the second outer film 390 may vary depending on the height of the base layer 3900. The height of the base layer 3900 may be formed to be substantially equal to the length hb of the second outer film 390, and the length ha of the first outer film 380 may vary depending on the height of the base layer 3900.

The material of the base layer 3900 may vary depending on the type of the second outer film 390. As described above with reference to FIG. 8, when the second outer film 390 is a refractive layer to smoothly emit the light generated in the active layer 330, the base layer 3900 may include (or contain) a material having refractive index that is higher than that of the first outer film 380. Further, when the second outer film 390 emits the heat generated in the active layer 330, the base layer 3900 may include (or contain) a material having high thermal conductivity. For example, the base layer 3900 may include (or contain) various suitable materials depending on the function of the second outer film 390, and the type thereof is not particularly limited.

Next, referring to FIG. 15, the insulating coating film 3800 is formed on the base layer 3900 to surround the exposed outer surface of the semiconductor core 3000'. As shown in FIG. 15, the insulating coating film 3800 may also be formed on the side surfaces and the top surfaces of the semiconductor cores 3000' and on the base layer 3900 exposed in the region where the semiconductor cores 3000' are spaced apart from each other. The insulating coating film 3800 may be formed by using a method of immersing or coating an insulating material on the outer surface of the semiconductor core 3000'. However, the present disclosure is not limited thereto. For example, the insulating coating film 3800 may be formed using atomic layer deposition (ALD). The insulating coating film 3800 may be partially etched to expose the semiconductor cores 3000', thereby forming the first outer film 380.

Next, referring to FIG. 16, the first etching process (1st etch) for partially removing the insulating coating film 3800 is performed to form the first outer film 380. The first etching process (1st etch) may be performed on the entire lower substrate 1000. Accordingly, a portion of the insulating coating film 3800 disposed on the top surfaces of the semiconductor cores 3000' and the region where the semiconductor cores 3000' are spaced apart from each other may be etched and removed. In the first etching process (1st etch), dry etching, such as anisotropic etching, etch-back, or the like may be performed. The insulating coating film 3800 may be partially removed by the first etching process (1st etch), and the top surface of the electrode layer 370 and a part of the base layer 3900 may be exposed. Accordingly, the insulating coating film 3800 may form the first outer film 380.

Although the electrode layer 370 is exposed and the upper surface of the first outer film 380 is flat in the illustrated embodiment, the present disclosure is not limited thereto. In some embodiments, the first outer film 380 may be formed to have a partially curved outer surface in an area where it surrounds the electrode layer 370. In the process of etching the insulating coating film 3800, the side surface as well as the upper surface of the insulating coating film 3800 are partially removed so that the end surface of the first outer film 380 surrounding the active layer 330 may be partially etched.

Figure 17:
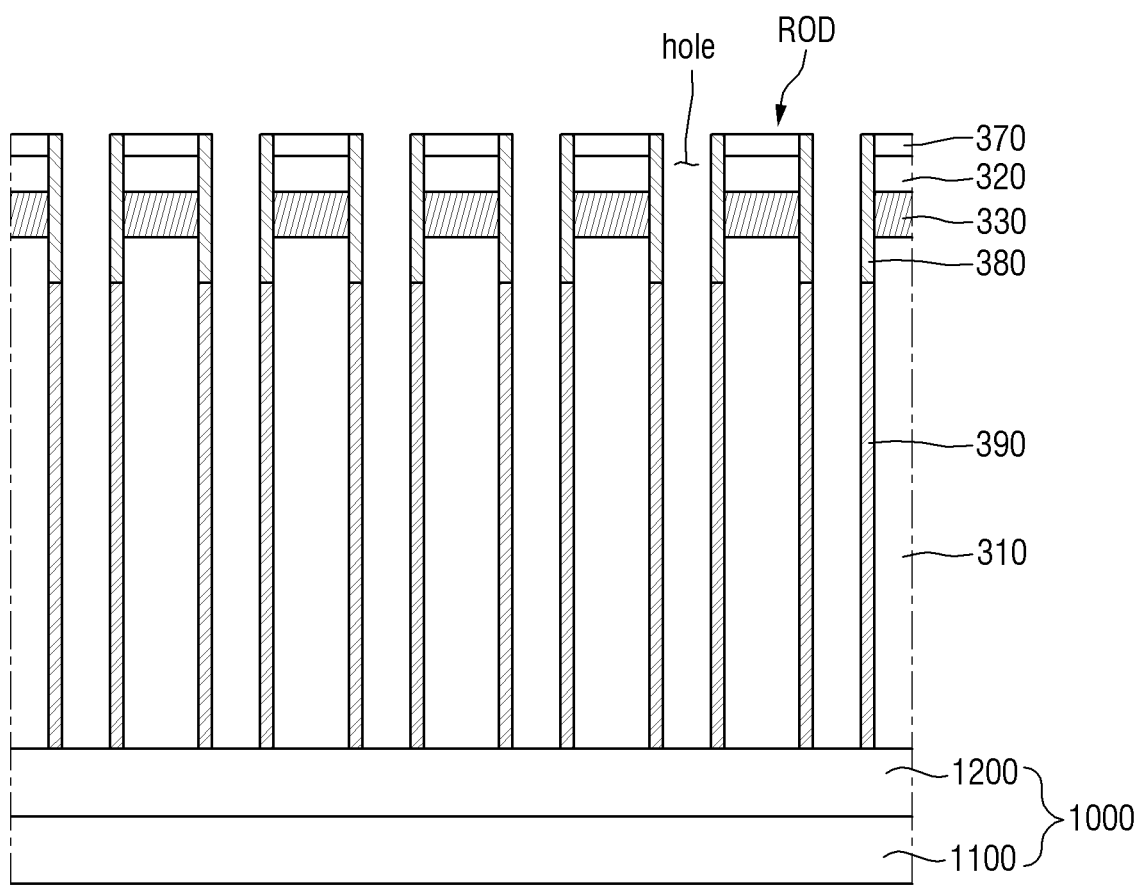

Next, referring to FIG. 17, the second etching process (2nd etch) for etching a part of the base layer 3900 is performed to form the second outer film 390. The first outer film 380 and the second outer film 390 may be disposed on the outer surface of the semiconductor core 3000' to form the element rod ROD. The process of etching the base layer 3900 may be performed by a conventional method. However, in the second etching process (2nd etch), only the base layer 3900 may be selectively etched by an etchant or by process conditions different from those of the first etching process (1st etch). Accordingly, the insulating coating film 3800 or the exposed top surface of the electrode layer 370 of the semiconductor core 3000' is not etched (e.g., is hardly etched), and only (or primarily) the base layer 3900 between the semiconductor cores 3000' may be etched and removed. Accordingly, the second outer film 390 surrounding a part of the outer surface of the semiconductor core 3000' is formed.

Figure 18:
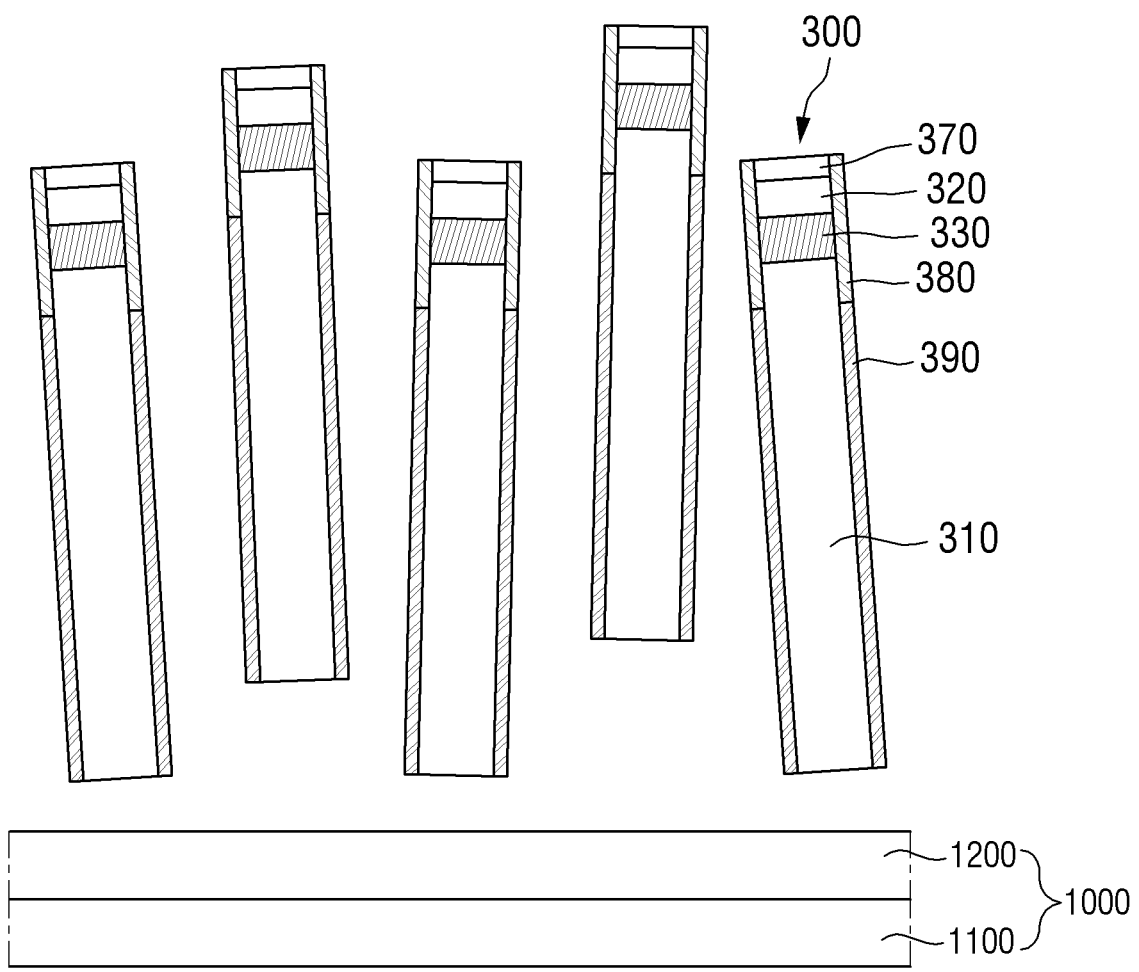

Finally, as shown in FIG. 18, the light emitting element 300 is manufactured by separating the element rod ROD on which the first outer film 380 and the second outer film 390 are formed from the lower substrate 1000.

Through the above-described processes, the light emitting element 300 according to one embodiment may be manufactured. The light emitting element 300 manufactured as described above may be disposed between the first electrode 210 and the second electrode 220, and the display device 10 may be manufactured by arranging the third insulating layer 530, the contact electrode 260, and the like thereon. Next, the manufacturing process of the display device 10 will be described with further reference to other drawings.

Figure 19:
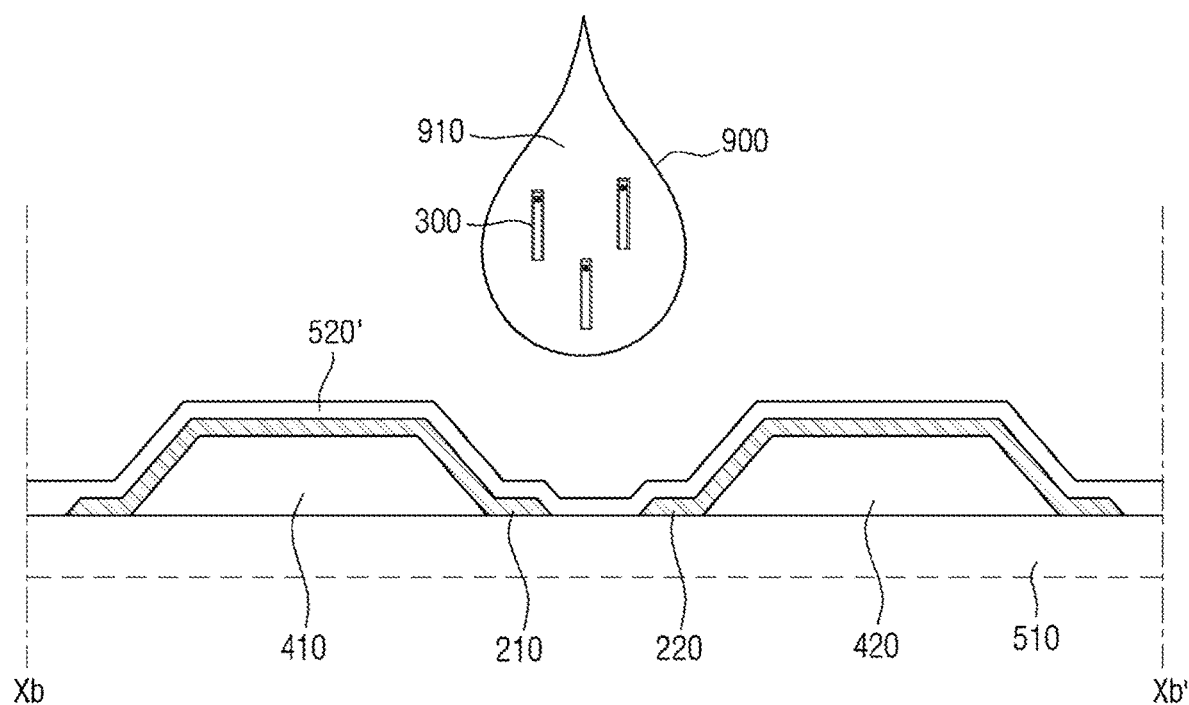
FIGS. 19 to 21 are cross-sectional views illustrating some steps of a manufacturing process of a display device according to one embodiment.
Figure 20:
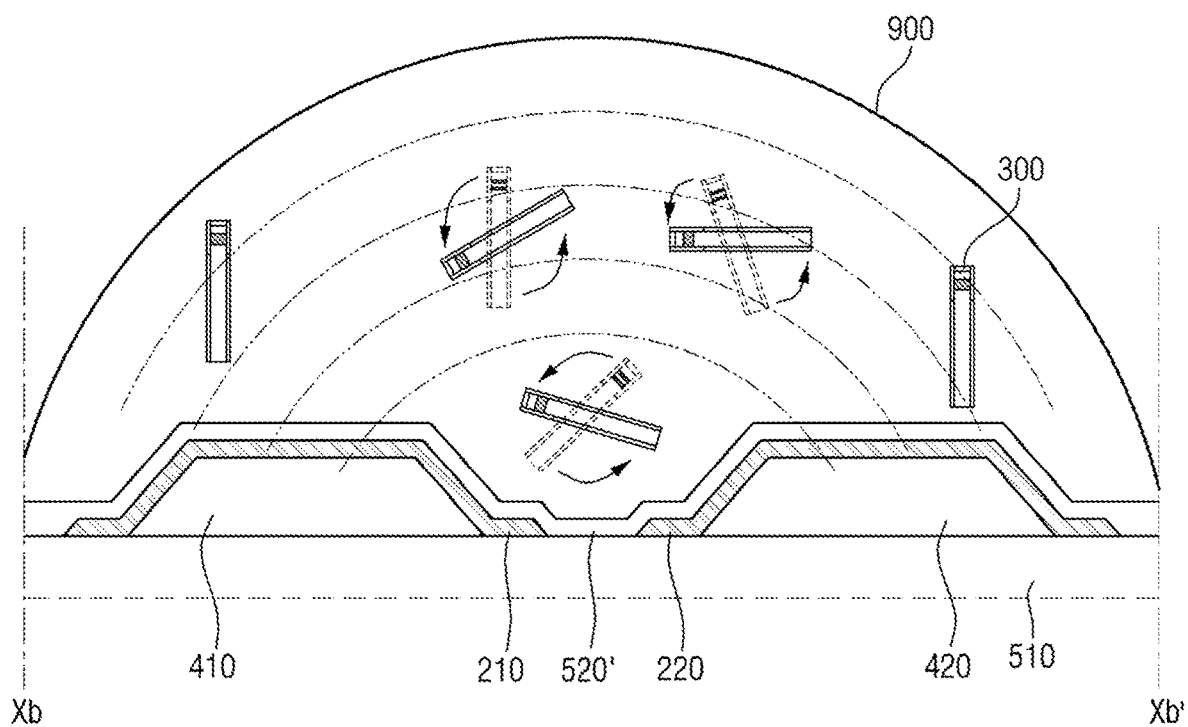
Figure 21:
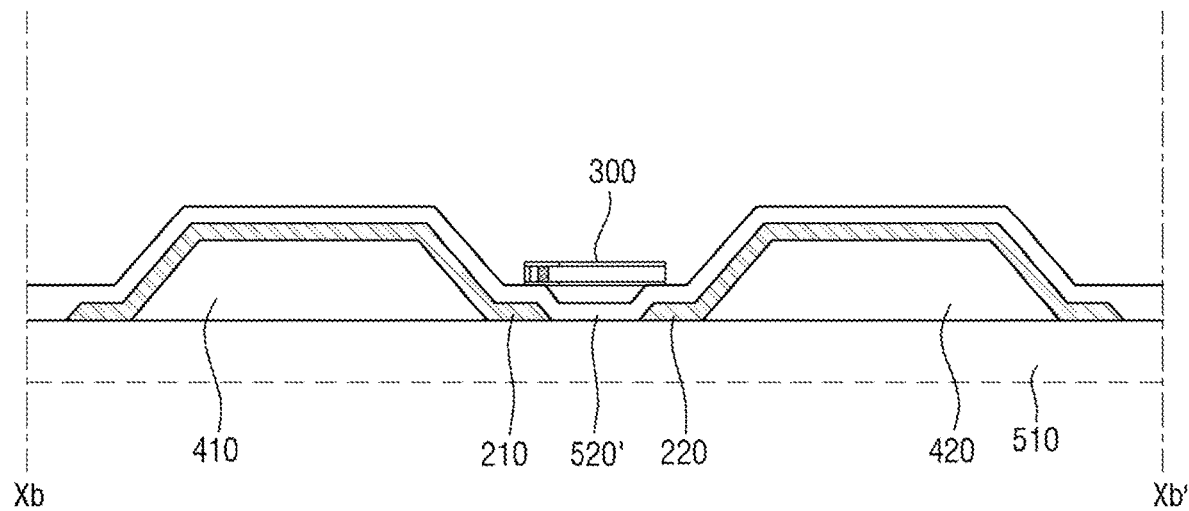

FIGS. 19 to 21 are cross-sectional views illustrating some steps of a manufacturing process of a display device according to one embodiment.

First, referring to FIG. 19, the first insulating layer 510, the first internal bank 410 and the second internal bank 420 spaced apart from each other on the first insulating layer 510, the first electrode 210 and the second electrode 220 respectively disposed on the first internal bank 410 and the second internal bank 420, and a second insulating layer 520' covering the first electrode 210 and the second electrode 220 are prepared. The second insulating material layer 520' may be partially patterned in a subsequent process to form the second insulating layer 520 of the display device 10. The above members may be formed by patterning a metal, an inorganic material, or an organic material by performing a conventional mask process.

Next, an ink 900 including the light emitting elements 300 is deposited (e.g., sprayed) on the first electrode 210 and the second electrode 220. The ink 900 may include a solvent 910 and the light emitting elements 300 dispersed in the solvent 910. The light emitting elements 300 may be sprayed on the electrodes 210 and 220 while being dispersed in the solvent 910 and may be aligned between the first electrode 210 and the second electrode 220 by an electrical signal applied in a subsequent process.

Next, referring to FIG. 20, the electrical signals may be applied to the first electrode 210 and the second electrode 220 to generate an electric field IEL in the ink 900 including the light emitting elements 300. The light emitting elements 300 may receive (e.g., may be acted upon by) a dielectrophoretic force induced by the electric field IEL and may be positioned (e.g., mounted) between the first electrode 210 and the second electrode 220 while the orientations and positions thereof are being changed.

Next, referring to FIG. 21, the solvent 910 of the ink 900 is removed (e.g., evaporated). Accordingly, the light emitting element 300 is disposed between the first electrode 210 and the second electrode 220, and the plurality of light emitting elements 300 mounted between the first electrode 210 and the second electrode 220 may be aligned with a specific orientation.

In a subsequent process, the third insulating layer 530 is formed on the light emitting element 300, and the second insulating layer 520' is patterned to form the second insulating layer 520. Thereafter, the first contact electrode 261, the second contact electrode 262, and the passivation layer 550 may be formed to manufacture the display device 10.

As described above, the light emitting element 300 and the display device 10 according to one embodiment may be manufactured. The light emitting element 300 according to one embodiment may include the first outer film 380, that is, an insulating film, and the second outer film 390, that is, a functional film. The first outer film 380 may be disposed to surround at least the active layer 330 of the light emitting element 300 to prevent damage to the active layer 330, and the second outer film 390 may include (or contain) a material having a low refractive index to allow the light generated in the active layer 330 to be smoothly emitted. Accordingly, the display device 10 according to one embodiment may include the light emitting element 300 having the first outer film 380 and the second outer film 390 to improve luminous efficiency and element reliability.

Hereinafter, the light emitting element 300 and the display device 10 according to various embodiments will be described.

Figure 22:
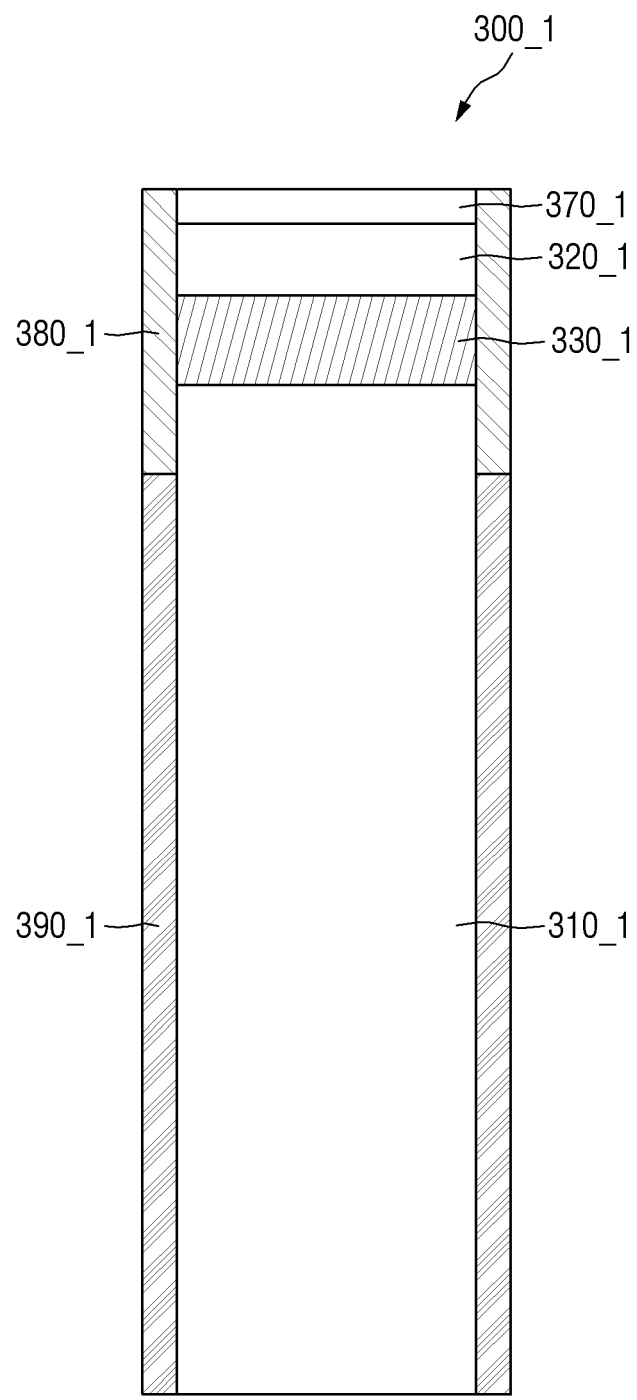
FIG. 22 is a schematic cross-sectional view of a light emitting element according to one embodiment.
Figure 23:
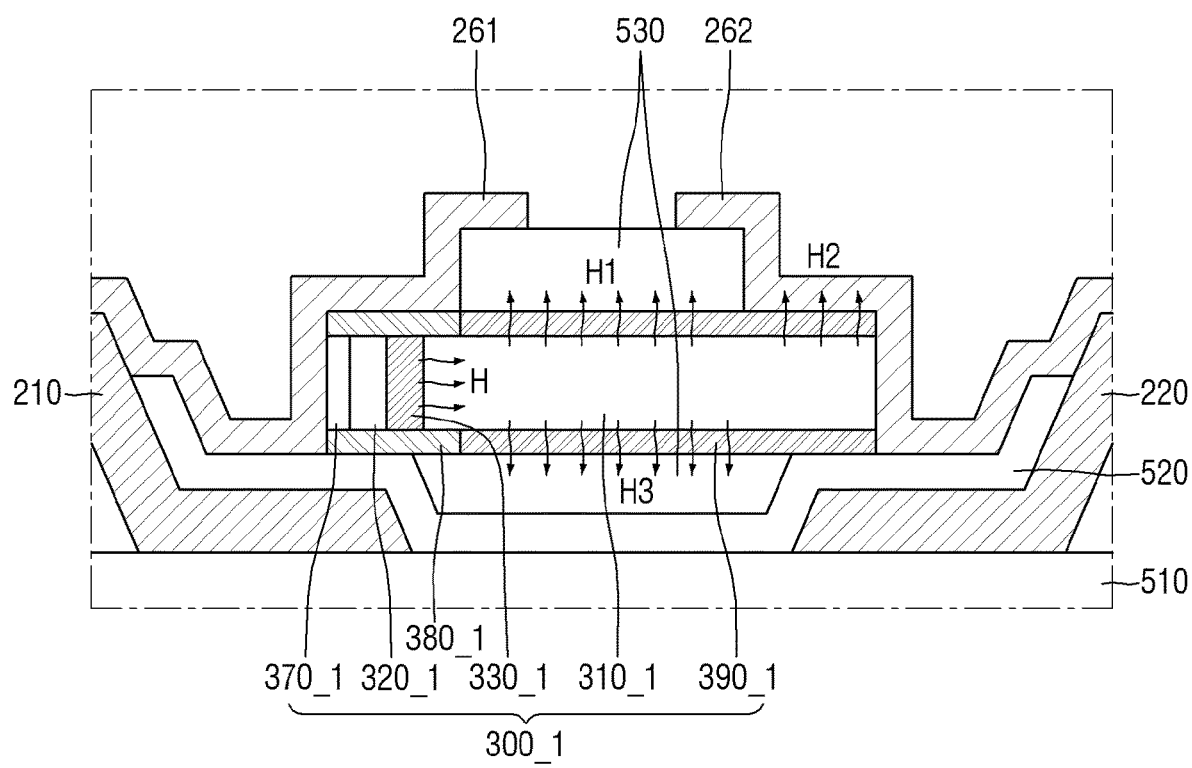
FIG. 23 is a schematic diagram illustrating emission of heat generated by the light emitting element of a display device according to one embodiment.

FIG. 22 is a schematic cross-sectional view of a light emitting element according to one embodiment. FIG. 23 is a schematic diagram illustrating emission of heat generated by the light emitting element of a display device according to one embodiment.

Referring to FIGS. 22 and 23, in a light emitting element 300_1 according to one embodiment, a second outer film 390_1 may include (or contain) a material having high thermal conductivity to provide a heat dissipation layer that emits heat generated in the light emitting element 300_1. The embodiment shown in FIGS. 22 and 23 is different from the embodiment shown in FIGS. 6 and 8 in that the second outer film 390_1 of the light emitting element 300_1 include (or contain) a different material.

As described above, because the second outer film 390_1 of the light emitting element 300_1 is spaced apart from the active layer 330, it may not necessarily be an insulating film for protecting the active layer 330. The second outer film 390_1 may be a functional film having various functions to improve emission characteristics and element efficiency of the light emitting element 300_1 and may perform a function of a heat dissipation layer, for example.

The light emitting element 300_1 may receive electrical signals from the first electrode 210 and the second electrode 220 so that light may be generated in the active layer 330. The semiconductor layers 310 and 320 and the active layer 330 of the light emitting element 300_1 may also generate heat due to the electric signals. The light emitting element 300_1 according to one embodiment may include the second outer film 390_1 having high thermal conductivity to effectively emit the heat. Accordingly, the light emitting element 300_1 may not be damaged by heat when the display device 10 is driven. During the manufacturing process of the light emitting element 300_1, the base layer 3900 is made of a material having high thermal conductivity so that the second outer film 390_1 may be a heat dissipation layer of the light emitting element 300_1. Further, the contact electrode 260 and the electrodes 210 and 220 contacting the light emitting element 300_1 may include (or contain) a material having high thermal conductivity so that the heat of the light emitting element 300_1 may be efficiently emitted. The description of other members is the same as the above description, and redundant descriptions thereof will be omitted.

Figure 24:
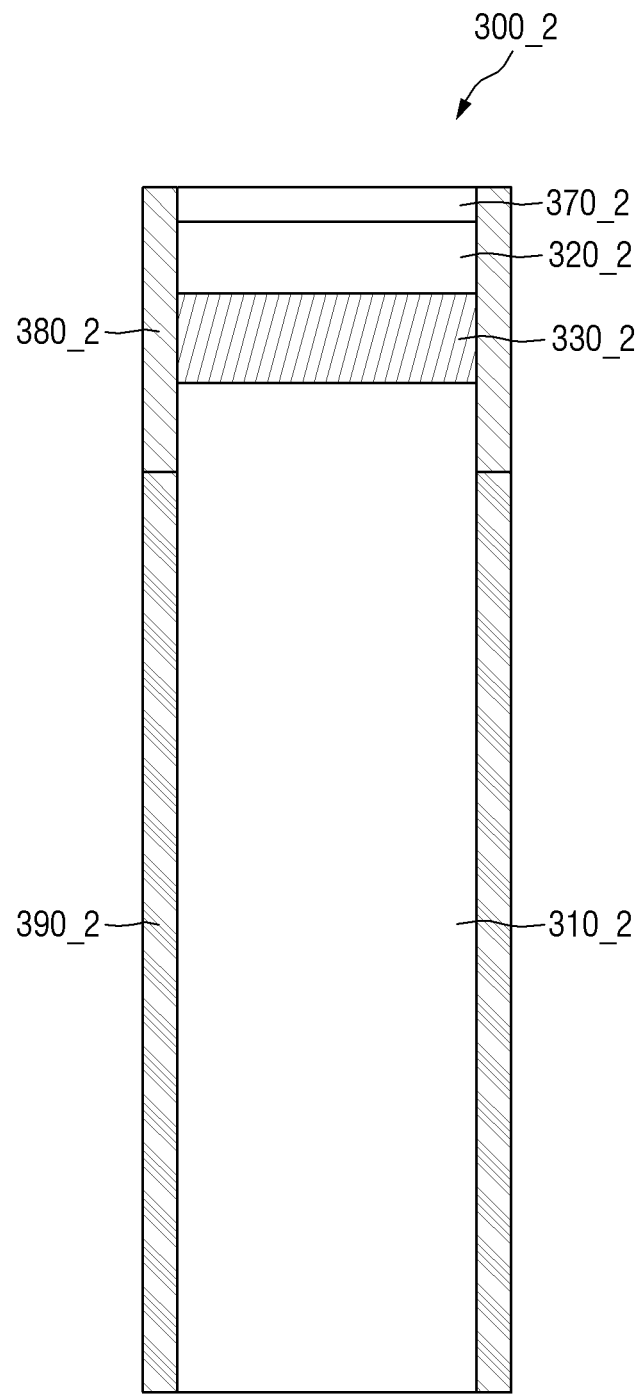
FIG. 24 is a schematic cross-sectional view of a light emitting element according to one embodiment.
Figure 25:
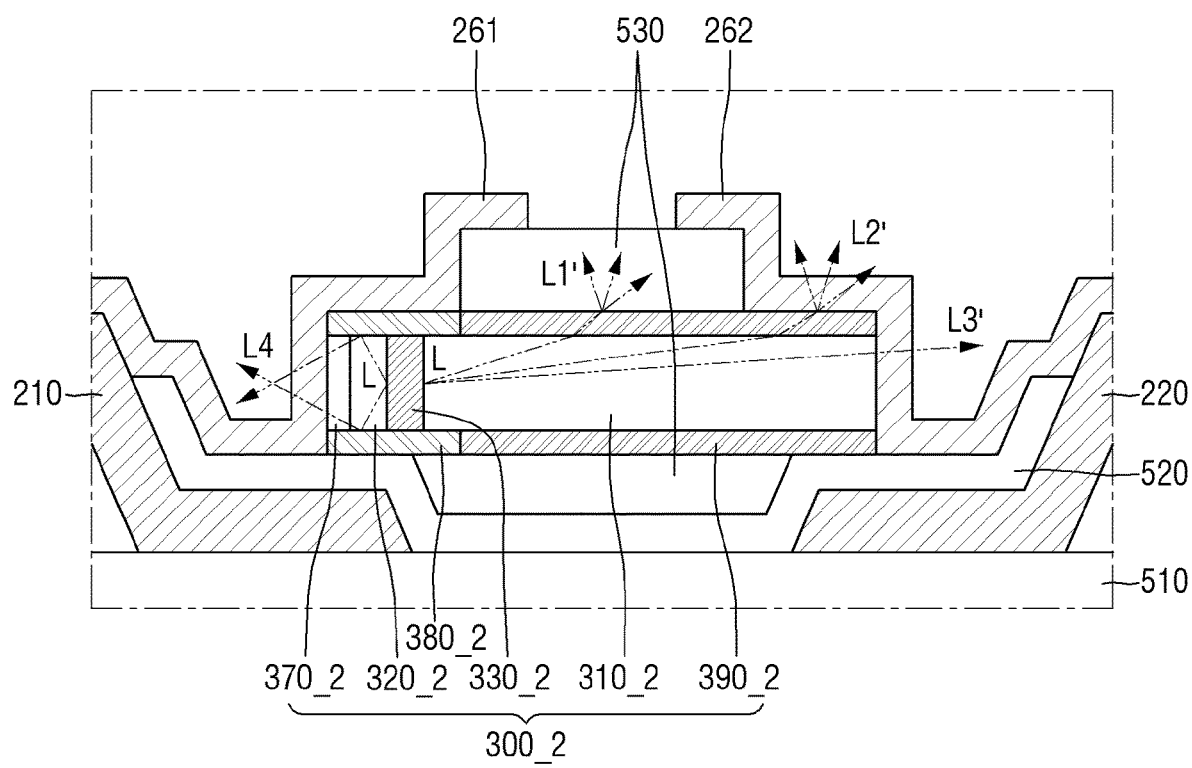
FIG. 25 is a schematic diagram illustrating emission of light generated by the light emitting element of a display device according to one embodiment.

FIG. 24 is a schematic cross-sectional view of a light emitting element according to one embodiment. FIG. 25 is a schematic diagram illustrating emission of light generated by the light emitting element of a display device according to one embodiment.

Referring to FIGS. 24 and 25, in a light emitting element 300_2 according to one embodiment, a second outer film 390_2 may be a scattering layer that scatters incident light. The embodiment shown in FIGS. 24 and 25 is different from the embodiment shown in FIGS. 6 and 8 in that the second outer film 390_2 of the light emitting element 300_2 include (or contain) a different material. As described above, the second outer film 390 may be a functional film having various functions to improve emission characteristics and element efficiency of the light emitting element 300 and may perform a function of a scattering layer, for example.

The light generated in an active layer 330_2 of the light emitting element 300_2 may be substantially emitted to both ends of the light emitting element 300_2 so that the amount of light directed to the upper side of the light emitting element 300_2 may be relatively small. In the embodiment shown in FIGS. 24 and 25, the second outer film 390_2 of the light emitting element 300_2 scatters light so that the amount of light directed to the upper side of the light emitting element 300_2 may increase and light having a uniform density may be emitted. During the manufacturing process of the light emitting element 300_2, the base layer 3900 includes (or is made of) a light scattering material so that the second outer film 390_2 may be a scattering layer of the light emitting element 300_2. The description of other members is the same as the above description, and redundant descriptions thereof will be omitted.

In some embodiments, the second outer film 390 of the light emitting element 300 may include scatterers 395 (see, e.g., FIG. 26) to reduce the difference in refractive index between the semiconductor layers 310 and 320 and the outside and to scatter the emitted light.

Figure 26:
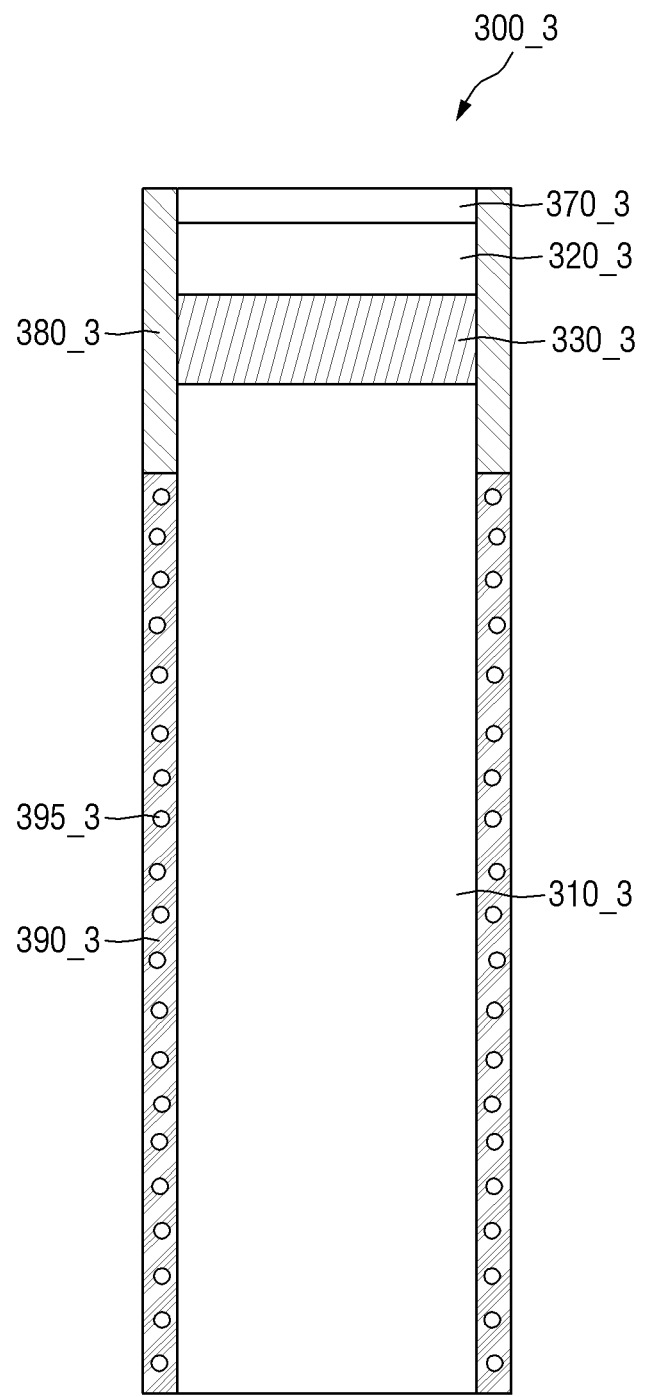
FIG. 26 is a schematic cross-sectional view of a light emitting element according to one embodiment.

FIG. 26 is a schematic cross-sectional view of a light emitting element according to one embodiment.

Referring to FIG. 26, a light emitting element 300_3 according to one embodiment may further include scatterers 395_3 dispersed in a second outer film 390_3. The embodiment shown in FIG. 26 is different from the embodiment shown in FIG. 6 in that the scatterers 395_3 are disposed in the second outer film 390_3. Accordingly, in the light emitting element 300_3, light generated in the active layer 330 may be scattered while being emitted toward the upper side of the light emitting element 300_3 through the second outer film 390_3. Because a display device 10_3 includes the light emitting element 300_3 shown in FIG. 26, luminous efficiency per pixel PX or sub-pixel PXn may be improved. The light emitting element 300_3 may be formed by further adding the scatterers 395_3 to the base layer 3900 in the process of forming the second outer film 390_3 during the manufacturing process.

Figure 27:
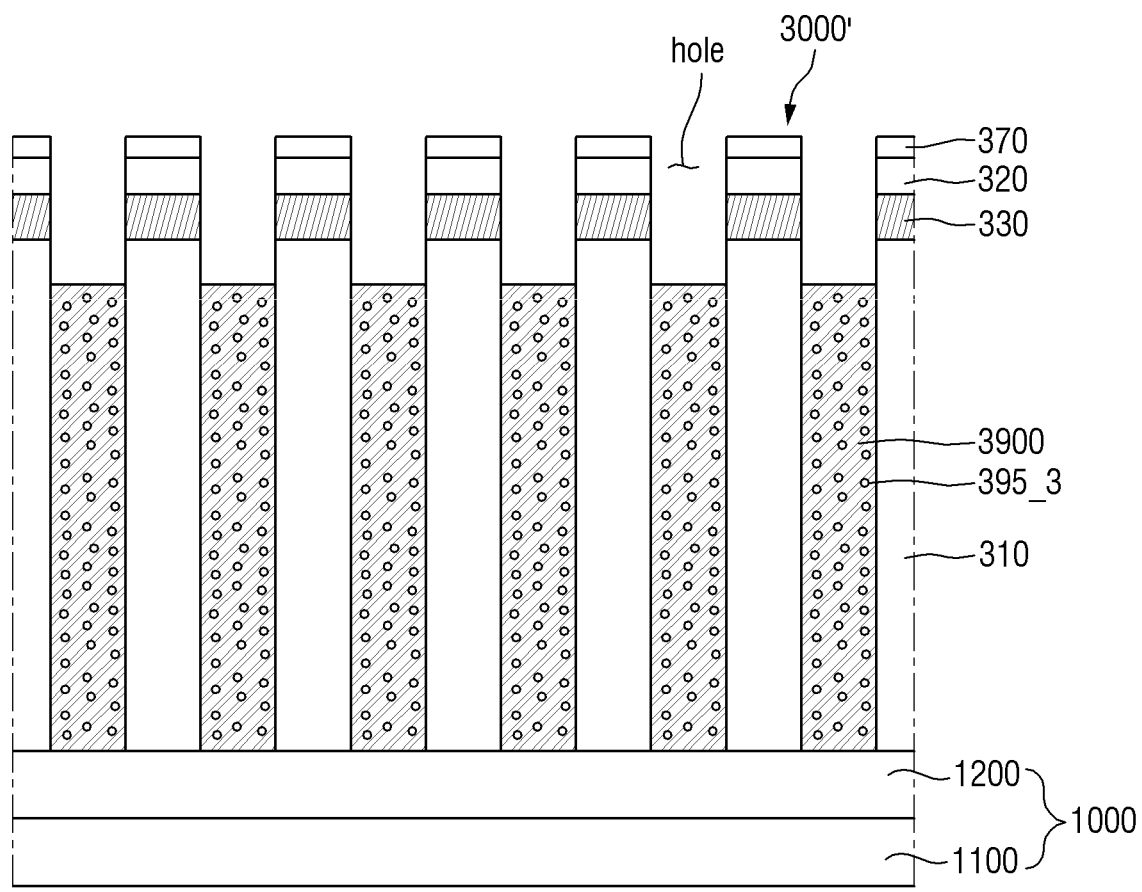
FIG. 27 is a cross-sectional view illustrating a step of a manufacturing process of the light emitting element shown in FIG. 26.

FIG. 27 is a cross-sectional view illustrating a step of a manufacturing process of the light emitting element shown in FIG. 26.

Referring to FIG. 27, in the step of forming the base layer 3900 during the manufacturing process of the light emitting element 300_3, the scatterers 395_3 may be further mixed in the base layer 3900. The base layer 3900 is made of substantially the same material as that of the embodiment shown in FIG. 14, and the scatterers 395_3 may be disposed in the base layer 3900. When the second outer film 390_3 is formed after the formation of the first outer film 380_3, the second outer film 390_3 may be made of a material having a small refractive index difference from the semiconductor layers 310 and 320 and a greater number of scatterers 395_3 may be disposed. Accordingly, the luminous efficiency of the light emitting element 300_3 may be improved. The description of other members is the same as the above description, and redundant descriptions thereof will be omitted.

Figure 28:
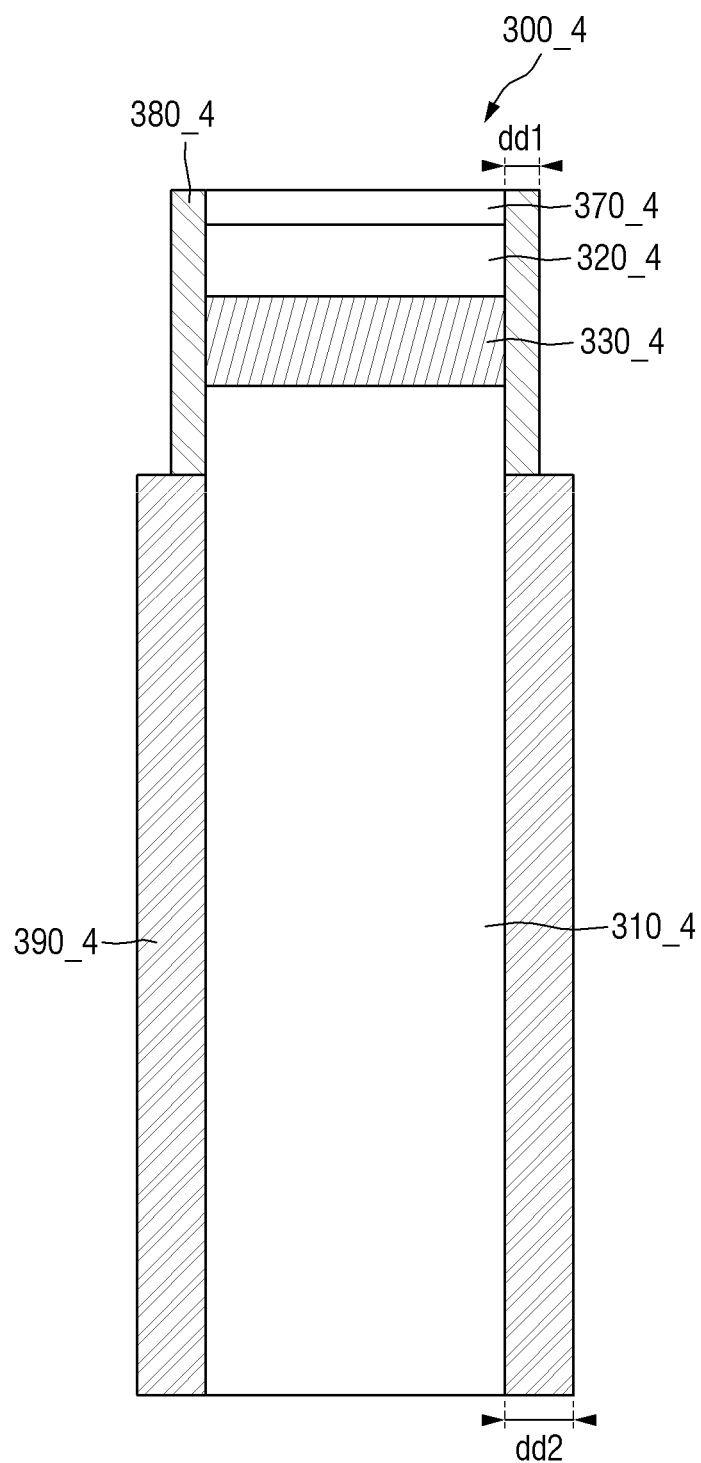
FIG. 28 is a schematic cross-sectional view of a light emitting element according to one embodiment.

FIG. 28 is a schematic cross-sectional view of a light emitting element according to one embodiment.

Referring to FIG. 28, in a light emitting element 300_4 according to one embodiment, a first outer film 380_4 and a second outer film 390_4 may have different thicknesses. The first outer film 380_4 and the second outer film 390_4 are formed by performing different processes. For example, the first outer film 380_4 is formed by performing the first etching process (1st etch), and the second outer film 390_4 is formed by performing the second etching process (2nd etch). The first etching process (1st etch) and the second etching process (2nd etch) may be performed under different process conditions depending on the materials of the insulating coating film 3800 and the base layer 3900, and the first outer film 380_4 and the second outer film 390_4 may have different thicknesses. a thickness dd2 of the second outer film 390_4 is illustrated as being greater than a thickness dd1 of the first outer film 380_4, the present disclosure is not limited thereto. In some embodiments, the thickness of the first outer film 380_4 may be greater than that of the second outer film 390_4.

In the light emitting element 300_4 according to an embodiment, the thicknesses of the first outer film 380_4 and the second outer film 390_4 may be adjusted. For example, the luminous efficiency and the element efficiency of the light emitting element 300_4 may be improved by adjusting the thickness of the second outer film 390_4. Further, in the light emitting element 300_4, damage to the active layer 330 of the light emitting element 300_4 may be avoided or prevented by adjusting the thickness of the first outer film 380_4. In the light emitting element 300_4 according to one embodiment, the first outer film 380_4 and the second outer film 390_4 may be variously modified depending on the manufacturing process of the display device 10 and other conditions.

Further, in the light emitting element 300, the length ha of the first outer film 380 may be longer, and in the light emitting element 300 included in the display device 10, the first outer film 380 may contact the third insulating layer 530.

Figure 29:
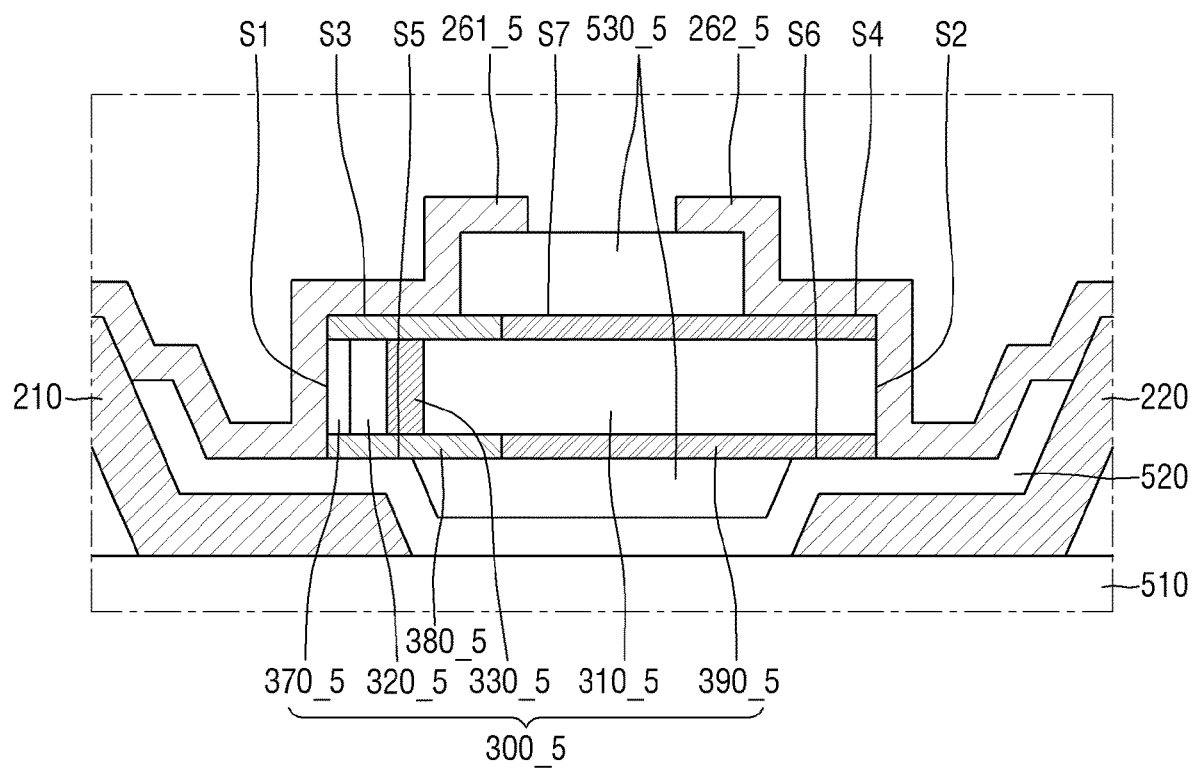
FIG. 29 is a cross-sectional view illustrating a part of a display device including the light emitting element shown in FIG. 28.

FIG. 29 is a cross-sectional view illustrating a part of a display device including a light emitting element according to one embodiment.

Referring to FIG. 29, the length of a first outer film 380_5 of a light emitting element 300_5 may be longer than that of the embodiment shown in FIG. 8, and a third insulating layer 530_5 of a display device 10_5 may contact the first outer film 380_5 and a second outer film 390_5. Accordingly, the seventh contact surface S7 and the eighth contact surface S8, which are the contact surfaces between the light emitting element 300_5 and the third insulating layer 530_5, may be positioned across the first outer film 380_5 and the second outer film 390_5. The display device 10 and the light emitting element 300_5 according to an embodiment are different from the embodiment shown in FIG. 8 in that the length ha of the first outer film 380_5 is different. Accordingly, the ratio of the first outer film 380_5 in the light emitting element 300_5 may increase, and damage to the active layer 330 during the manufacturing process of the display device 10 may be effectively prevented. The above-described structure of the light emitting element 300_5 may be formed by adjusting the height of the base layer 3900 during the manufacturing process thereof. By lowering (or reducing) the height of the base layer 3900, the length of the first outer film 380_5 may increase. The description of other members is the same as the above description, and redundant descriptions thereof will be omitted.

In accordance with some embodiments, in the light emitting element 300, the second outer film 390 may be omitted to expose the outer surface of the first semiconductor layer 310, and the display device 10 may further include a pattern layer contacting the first semiconductor layer 310 of the light emitting element 300.

Figure 30:
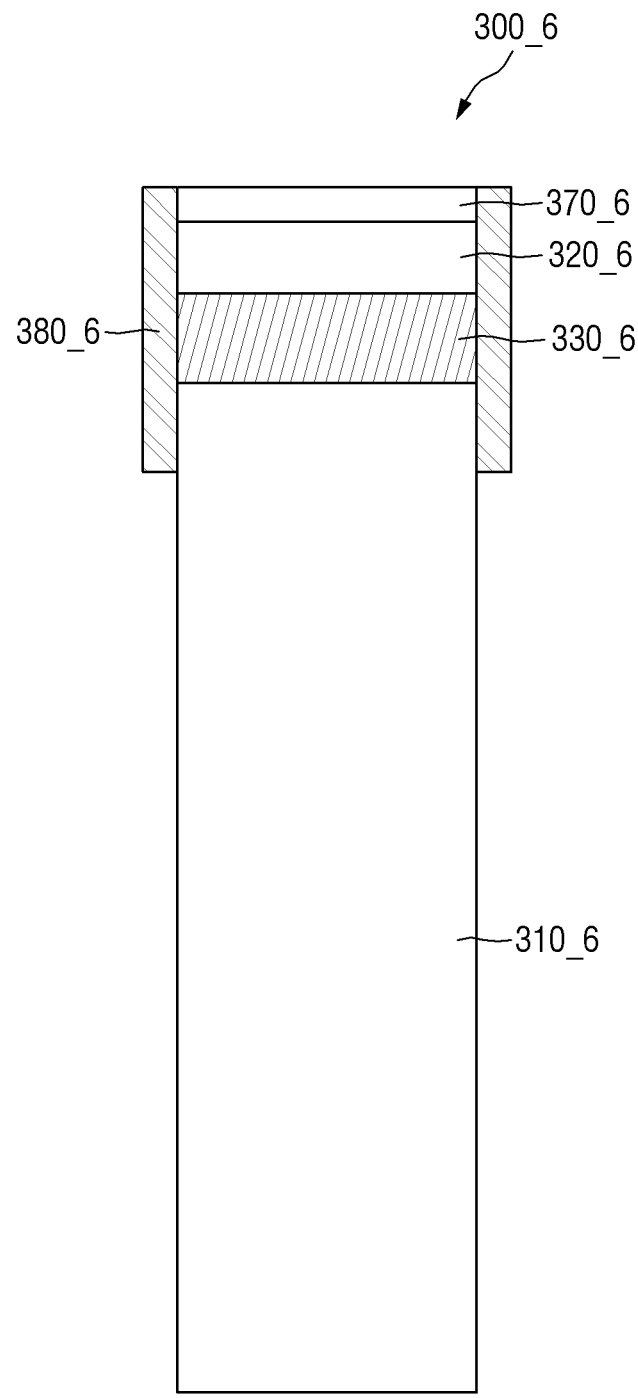
FIG. 30 is a schematic cross-sectional view of a light emitting element according to one embodiment.
Figure 31:
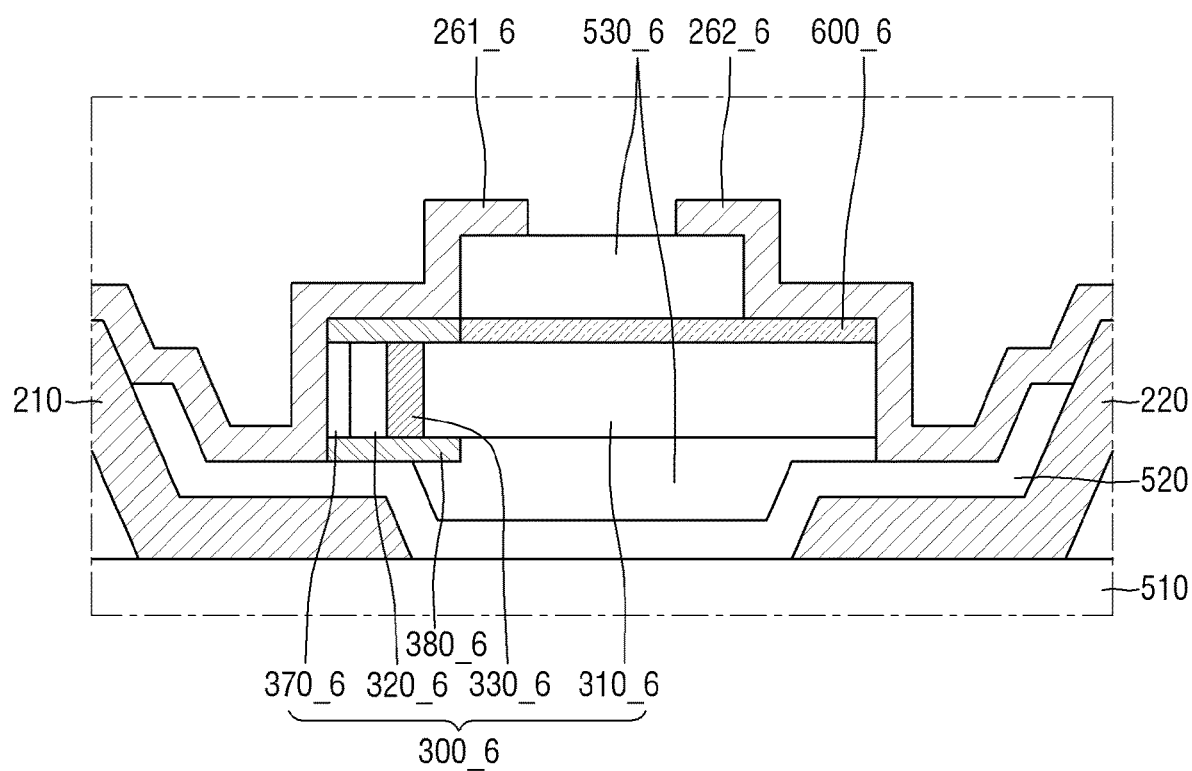
FIG. 31 is a cross-sectional view illustrating a part of the display device including the light emitting element shown in FIG. 30.

FIG. 30 is a schematic cross-sectional view of a light emitting element according to one embodiment. FIG. 31 is a cross-sectional view illustrating a part of the display device including the light emitting element shown in FIG. 30.

Referring to FIG. 30, in a light emitting element 300_6 according to one embodiment, the second outer film 390 may be omitted and only a first outer film 380_6 may remain so that a part of the outer surface of the first semiconductor layer 310_6 may be exposed. The structure of the light emitting element 300_6 may be formed by forming the first outer film 380_6 and then completely removing the base layer 3900.

Different from the active layer 330_6, the first semiconductor layer 310 of the light emitting element 300_6 may be less damaged by an external environment until it is disposed on the second insulating layer 520 even if the second outer film 390 is not disposed and a partial region is exposed. In the semiconductor core of the light emitting element 300_6, the first outer film 380_6 protects the active layer 330_6, and the first semiconductor layer 310_6 may be used in the manufacturing process of the display device 10 while being exposed as shown in FIG. 30. In such an embodiment, the display device 10 may further include a pattern layer 600_6 contacting the first semiconductor layer 310_6 of the light emitting element 300_6 to improve the luminous efficiency and the element efficiency of the light emitting element 300_6. For example, the display device 10 according to one embodiment may further include the pattern layer 600_6, that is, a functional layer, for improving the efficiency of the light emitting element 300_6, similar to the second outer film 390 of the light emitting element 300_6.

Referring to FIG. 31, the pattern layer 600_6 may be disposed on a partial region of the light emitting element 300_6, for example, on the exposed side surface of the first semiconductor layer 310_6. The pattern layer 600_6 may have a structure substantially similar to that of the second outer film 390 and may contact members of the display device 10 that contact the second outer film 390. For example, the pattern layer 600_6 may contact the third insulating layer 530_6 and the second contact electrode 262_6 to form the seventh contact surface S7 and the fourth contact surface S4, respectively. However, the pattern layer 600_6 may be disposed only on the top surface of the first semiconductor layer 310_6 in a cross-sectional view in the drawing and may not be disposed between the light emitting element 300_6 and the second insulating layer 520 (e.g., on the bottom surface of the first semiconductor layer 310_6 in a cross-sectional view). Accordingly, at least a partial region of the first semiconductor layer 310_6 of the light emitting element 300_6 may contact the second insulating layer 520.

The pattern layer 600_6 may include (or contain) substantially the same material as that of the second outer film 390. The pattern layer 600_6 may be a scattering layer that scatters light or may be a refractive layer that reduces the difference in refractive index between the semiconductor layers 310_6 and 320_6 and the outside to increase the amount of light directed to the upper side of the light emitting element 300_6. Further, as described above, the pattern layer 600_6 may be a heat dissipation layer that effectively emits heat generated in the active layer 330_6. For example, the description of the material and function of the pattern layer 600_6 is the same as the above description of the second outer film 390.

The shape of the pattern layer 600_6 may be formed after the step of disposing the light emitting element 300_6 between the electrodes 210 and 220 during the manufacturing process of the display device 10.

Figure 32:
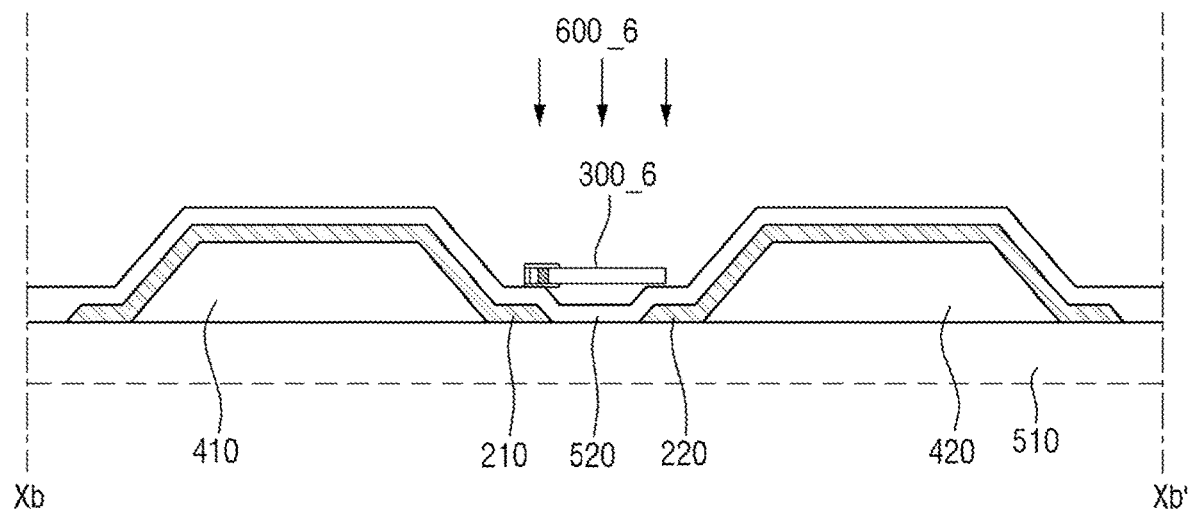
FIG. 32 is a cross-sectional view illustrating a step of a manufacturing process of the display device shown in FIG. 31.

FIG. 32 is a cross-sectional view illustrating a step of a manufacturing process of the display device shown in FIG. 31.

Referring to FIG. 32, when the light emitting element 300_6 is disposed between the first electrode 210 and the second electrode 220, a part of the top surface of the first semiconductor layer 310_6 is exposed in a cross-sectional view. The pattern layer 600_6 may be disposed between the first electrode 210 and the second electrode 220 and may be disposed to contact the exposed side surface of the first semiconductor layer 310 of the light emitting element 300_6. Here, the light emitting elements 300_6 may be arranged between the first electrode 210 and the second electrode 220 along a direction in which they extend. For example, the plurality of light emitting elements 300_6 may be disposed to be spaced apart from each other in the second direction DR2, and the pattern layer 600_6 may also extend in the second direction DR2 to contact the first semiconductor layers 310 of the plurality of light emitting elements 300_6.

Figure 33:
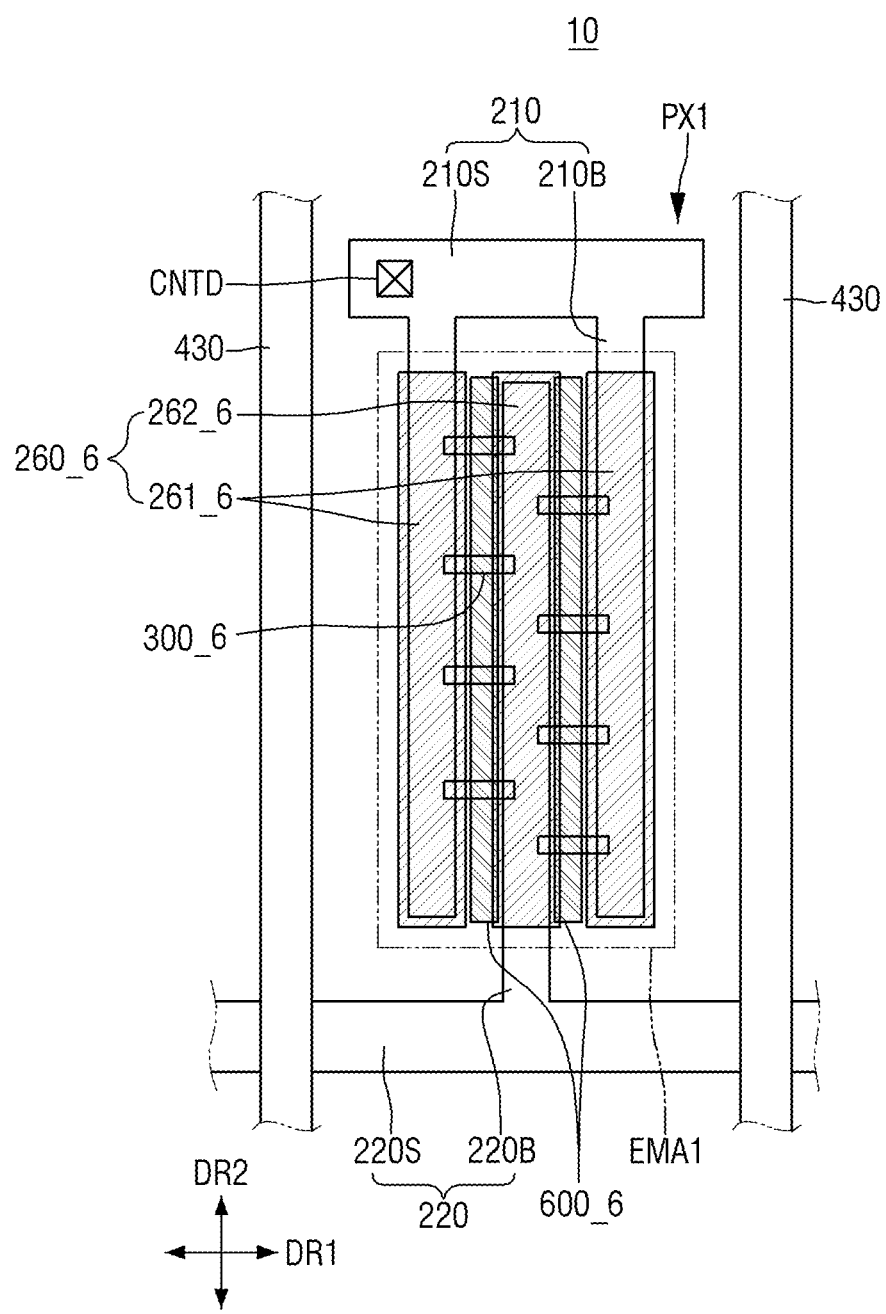
FIG. 33 is a plan view illustrating a part of a display device including the light emitting element shown in FIG. 30.

FIG. 33 is a plan view illustrating a part of a display device including the light emitting element shown in FIG. 30.

Referring to FIG. 33, the pattern layer 600_6 according to one embodiment may be disposed between the first electrode 210 and the second electrode 220 and may extend in the second direction DR2 to be disposed on one end of the light emitting element 300_6. Because the light emitting elements 300_6 are disposed to be spaced apart from each other in the second direction DR2, the pattern layer 600_6 disposed in the region in which they are spaced apart from each other may contact the second insulating layer 520. The pattern layer 600_6 may have a stripe shape extending in the second direction DR2 in each sub-pixel PXn.

Further, the pattern layer 600_6 may be disposed between the first electrode 210 and the second electrode 220 and may be disposed closer to one electrode (e.g., the second electrode 220) to be disposed on the first semiconductor layer 310_6 of the light emitting element 300_6. For example, the interval between the pattern layer 600_6 and the first electrode 210 may be greater than the interval between the pattern layer 600_6 and the second electrode 220. However, the present disclosure is not limited thereto, and the relationship of the intervals therebetween may be reversed.

The pattern layer 600_6 is illustrated as being disposed on the light emitting element 300_6 to overlap the third insulating layer 530_6 and the second contact electrode 262_6. Accordingly, the pattern layer 600_6 may not contact the first contact electrode 261_6. However, in some embodiments, the pattern layer 600_6 may be disposed to partially cover the first outer film 380_6, and in such embodiments, the pattern layer 600_6 may also contact the first contact electrode 261_6.

Figure 34:
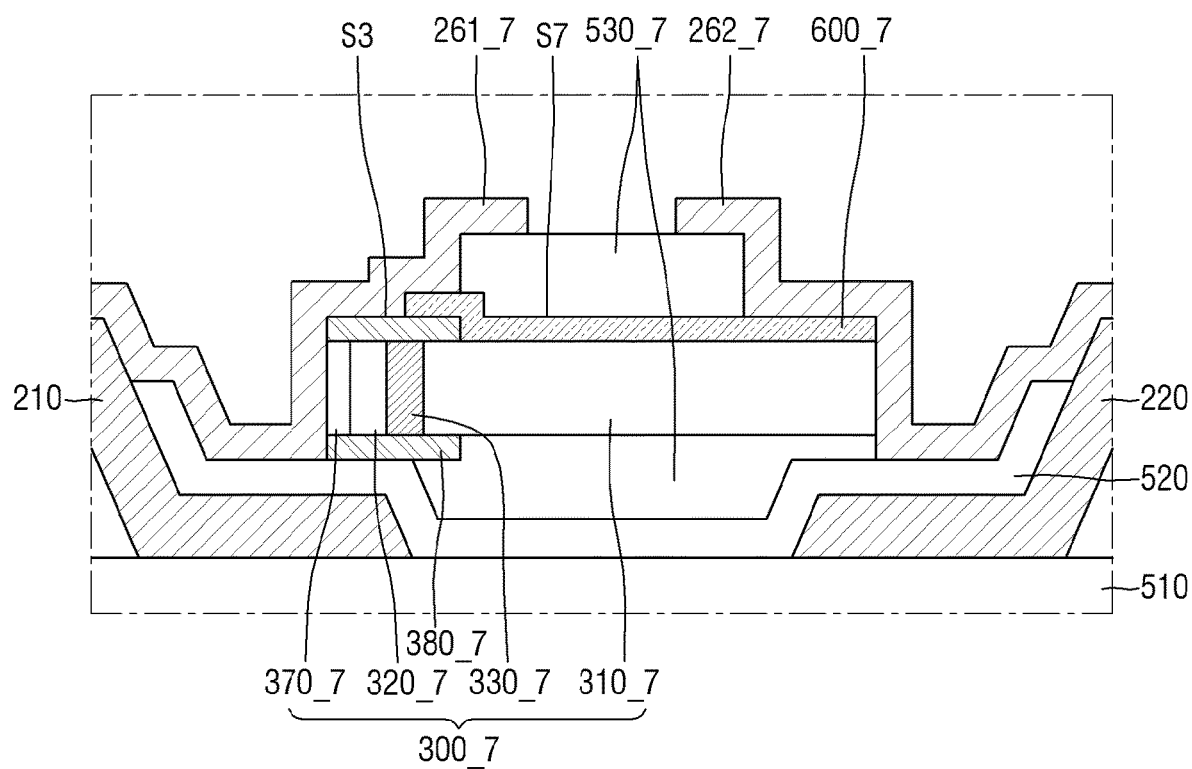
FIG. 34 is a cross-sectional view illustrating a part of a display device including a light emitting element according to one embodiment.

FIG. 34 is a cross-sectional view illustrating a part of a display device including a light emitting element according to one embodiment.

Referring to FIG. 34, a pattern layer 600_7 according to one embodiment may be disposed to contact a part of a first semiconductor layer 310_7 of a light emitting element 300_7 and a part of a first outer film 380_7. This embodiment is different from the embodiment shown in FIG. 31 in that a part of the pattern layer 600_7 is disposed on the first outer film 380_7. In the following description, redundant descriptions will be omitted while focusing on differences.

In the embodiment shown in FIG. 34, the pattern layer 600_7 may be disposed to overlap the first outer film 380_7, and the portion of the pattern layer 600_7 that overlaps the first outer film 380_7 may contact a first contact electrode 261_7. Because the pattern layer 600_7 is disposed on the upper side of the first outer film 380_7, a step may be formed in a region in which they overlap, and the first contact electrode 261 may have a shape corresponding to the step formed by the first outer film 380_7 and the pattern layer 600_7. In such an embodiment, the third contact surface S3, which is a surface where the first contact electrode 261_7 and the light emitting element 300_7 contact each other, may be positioned across the first outer film 380_7 and a part of the pattern layer 600_7.

As described above, the first outer film 380 may have a surface whose upper cross section is partially curved. During the manufacturing process of the light emitting element 300, in the first etching process (1st etch) of removing the insulating coating film 3800, the top surface and the side surfaces of the insulating coating film 3800 are partially etched so that the first outer film 380 may have a curved outer surface.

Figure 35:
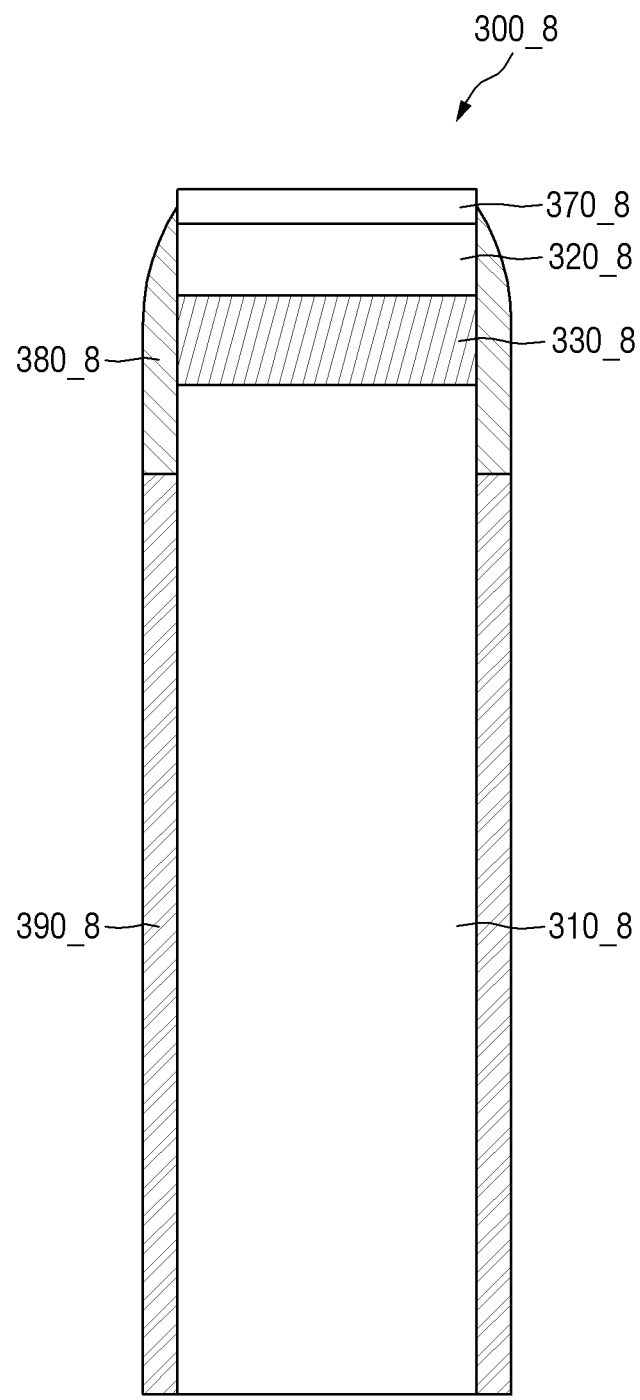
FIG. 35 is a schematic cross-sectional view of a light emitting element according to one embodiment.
Figure 36:
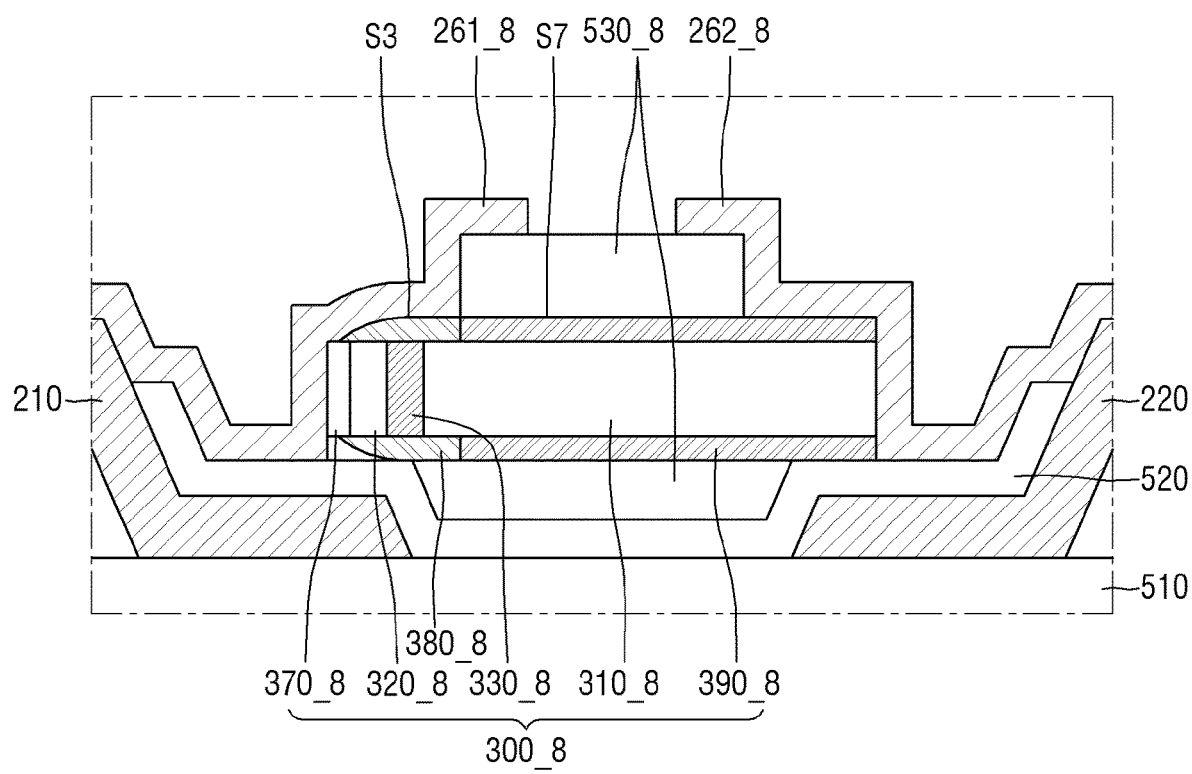
FIG. 36 is a cross-sectional view illustrating a part of a display device including the light emitting element shown in FIG. 35.

FIG. 35 is a schematic cross-sectional view of a light emitting element according to one embodiment. FIG. 36 is a cross-sectional view illustrating a part of a display device including the light emitting element shown in FIG. 35.

Referring to FIGS. 35 and 36, in a light emitting element 300_8 according to one embodiment, a first outer film 380_8 may have a shape in which a top surface or an upper cross section thereof is partially inclined and may include a region partially having different thicknesses. The light emitting element 300_8 shown in FIG. 35 is different from the light emitting element 300 shown in FIG. 6 in that the end surface of the first outer film 380_8 has an inclined shape. The arrangement and structures of the electrode layer 370, the first semiconductor layer 310, the active layer 330, the second outer film 390, and the like are the same as those shown in FIG. 6, and differences will be mainly described.

In accordance with one embodiment, the first outer film 380_8 is disposed to expose a part of the semiconductor core (e.g., the side surfaces of the electrode layer 370_8), and the end surface of the top surface of the first outer film 380_8 where the electrode layer 370_8 is exposed may have a partially inclined shape. The exposed surface of the electrode layer 370_8 where the first outer film 380_8 is not disposed may be exposed in a process of etching the insulating coating film 3800 during the manufacturing process of the light emitting element 300_8. In the light emitting element 300 shown in FIG. 6, only the top surface of the electrode layer 370 is exposed in the process of etching the insulating coating film 3800. However, in the light emitting element 300_8 shown in FIG. 35, the side surfaces as well as the top surface of the electrode layer 370_8 may be partially exposed. As shown in FIG. 35, the side surfaces of the electrode layer 370_8 are not entirely but are partially exposed so that a partial region thereof may contact the first outer film 380_8.

Because the first outer film 380_8 of the light emitting element 300_8 has a partially curved outer surface and the outer surface of the electrode layer 370_8 is partially exposed, the first contact electrode 261_8 of the display device 10 may contact a part of the side surface of the electrode layer 370_8. As shown in FIG. 36, the first contact electrode 261_8 may contact the first outer film 380_8 and a part of the side surface of the electrode layer 370_8 of the light emitting element 300_8 to form the third contact surface S3. Different from the embodiment shown in FIG. 7, the third contact surface S3 may be formed to contact the side surface of the electrode layer 370_8 as well as the first outer film 380_8 of the light emitting element 300_8 and may have a partially inclined shape corresponding to the curved outer surface of the first outer film 380_8.

As described above, the first outer film 380 and the second outer film 390 of the light emitting element 300 may be partially etched during the manufacturing process of the display device 10 to have reduced thicknesses. In such an embodiment, in the light emitting element 300 included in the display device 10, the thicknesses of the outer films 380 and 390 may vary depending on positions, and the diameter of the light emitting element 300 may also vary.

Figure 37:
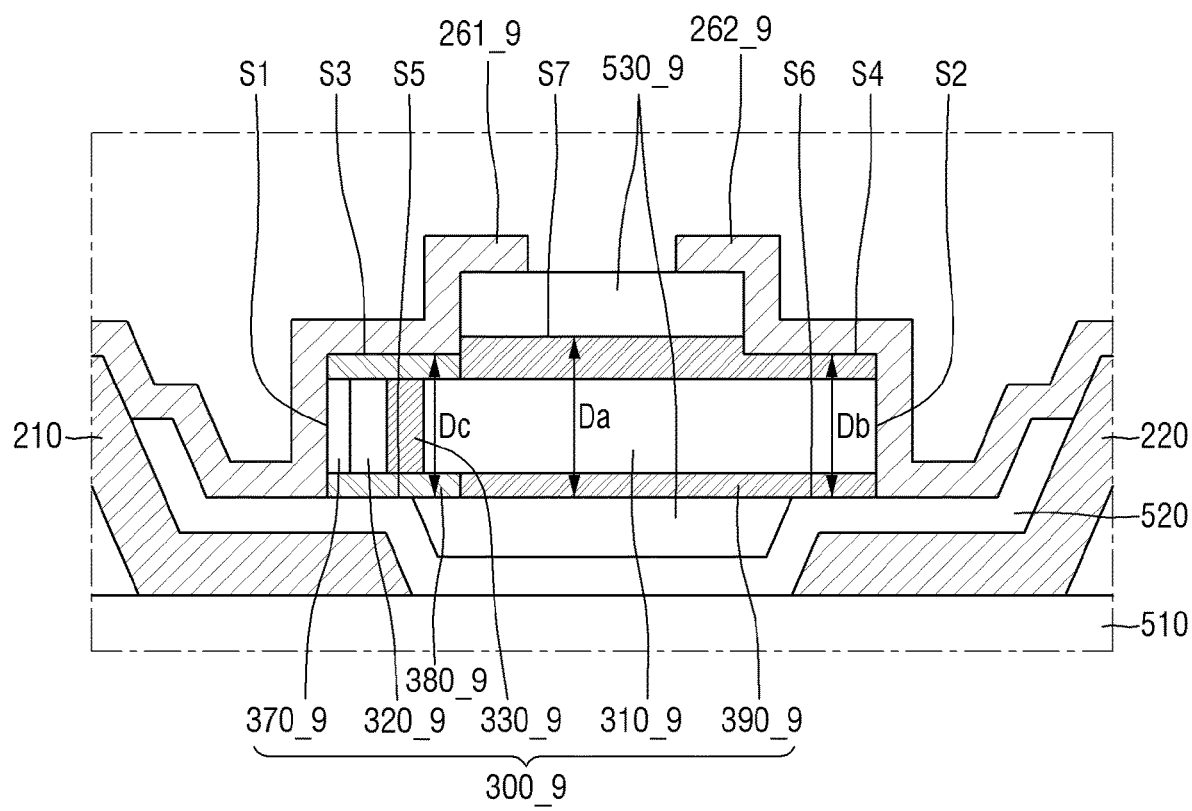
FIGS. 37 and 38 are cross-sectional views illustrating a part of a display device according to one embodiment.
Figure 38:
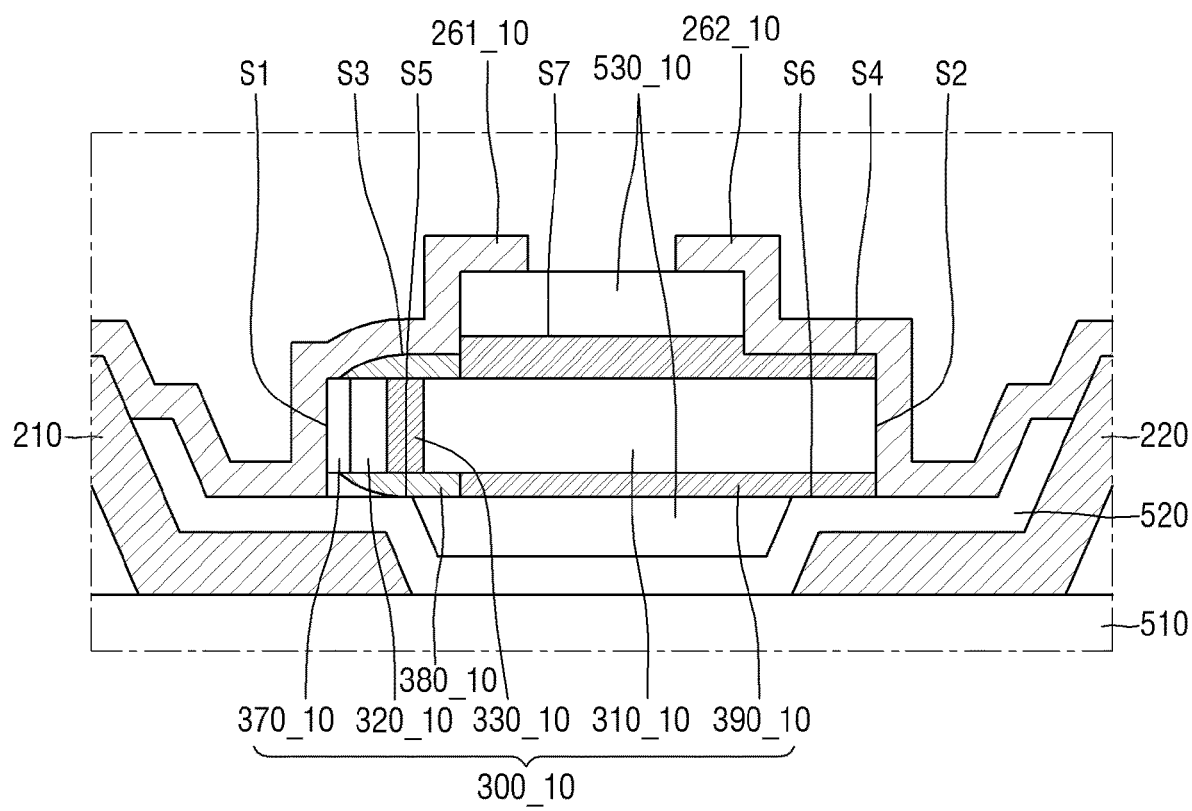

FIGS. 37 and 38 are cross-sectional views illustrating a part of a display device according to one embodiment.

FIG. 37 illustrates an embodiment in which a first outer film 380_9 and a second outer film 390_9 of a light emitting element 300_9 are partially etched in the display device 10. FIG. 38 illustrates an embodiment in which a first outer film 380_10 and a second outer film 390_10 of a light emitting element 300_10 are partially etched in the display device 10 including the light emitting element 300_8 shown in FIG. 35.

Referring to FIG. 37, in the process of forming the third insulating layer 530_9 during the manufacturing process of the display device 10, the first outer film 380_9 and the second outer film 380_10 that do not contact the third insulating layer 530_9 may be partially etched. The outer surface of light emitting element 300_9 may include one side surface, that is, the lower surface in a cross-sectional view, and the other side surface, that is, the upper surface in a cross-sectional view. Because the one side surface contacts the second insulating layer 520 and the third insulating layer 530 disposed on the lower side of the light emitting element 300_9, the first outer film 380_9 and the second outer film 390_9 positioned on the lower surface of the light emitting element 300_9 may not be etched during the manufacturing process of the display device 10.

On the other hand, the other side surface, which is the upper surface of the light emitting element 300_9 in a cross-sectional view, may be partially etched in the etching process performed before the process of forming contact electrodes 261_9 and 262_9. The first outer film 380_9 may be etched in a region where the other side surface contacts the contact electrodes 261_9 and 262_9 except a portion contacting the third insulating layer 530_9. Accordingly, in the display device 10, the outer films 380_9 and 390_9 of the light emitting element 300_9 may have different thicknesses depending on positions.

In the first outer film 380_9, the thickness on the third contact surface S3, that is, the surface contacting the first contact electrode 261_9, may be smaller than the thickness on the fifth contact surface S5, that is, the surface contacting the second insulating layer 520. In the second outer film 390_9, the thickness on the fourth contact surface S4, that is, the surface contacting the second contact electrode 262_9, may be smaller than the thickness on the sixth contact surface S6, that is, the surface contacting the second insulating layer 520.

Accordingly, the light emitting element 300_9 may have different diameters depending on positions. For example, a first diameter Da of the light emitting element 300_9, which is a diameter measured at a region in which the seventh contact surface S7 is positioned, may be greater than a second diameter Db, which is a diameter measured at a region in which the fourth contact surface S4 is positioned, and a third diameter Dc, which is a diameter measured at a region in which the third contact surface S3 is positioned. However, as described above, the first outer film 380_9 of the light emitting element 300_9 is disposed to surround at least the active layer 330_9 with a thickness of a certain level or more to protect the active layer 330_9. Although the first outer film 380_9 is partially etched during the manufacturing process of the display device 10, the first outer film 380_9 may have a minimum thickness to protect the active layer 330_9. In an embodiment, the thickness of the first outer film 380_9 of the light emitting element 300_9 disposed in the display device 10 may be within a range of about 10 nm to about 20 nm. The first outer film 380_9 having the thickness within the above-described range may prevent the active layer 330_9 from contacting another member to prevent an electrical short circuit of the light emitting element 300_9.

The embodiment shown in FIG. 38 illustrates that the first outer film 380_10 is partially etched during the manufacturing process of the display device 10 including the light emitting element 300_8 shown in FIG. 35. Because the description thereof is the same as the above description with reference to FIGS. 35 and 37, the detailed descriptions thereof will be omitted.

According to some embodiments, the first electrode 210 and the second electrode 220 may not have the electrode stems 210S and 220S extending in the first direction DR1.

Figure 39:
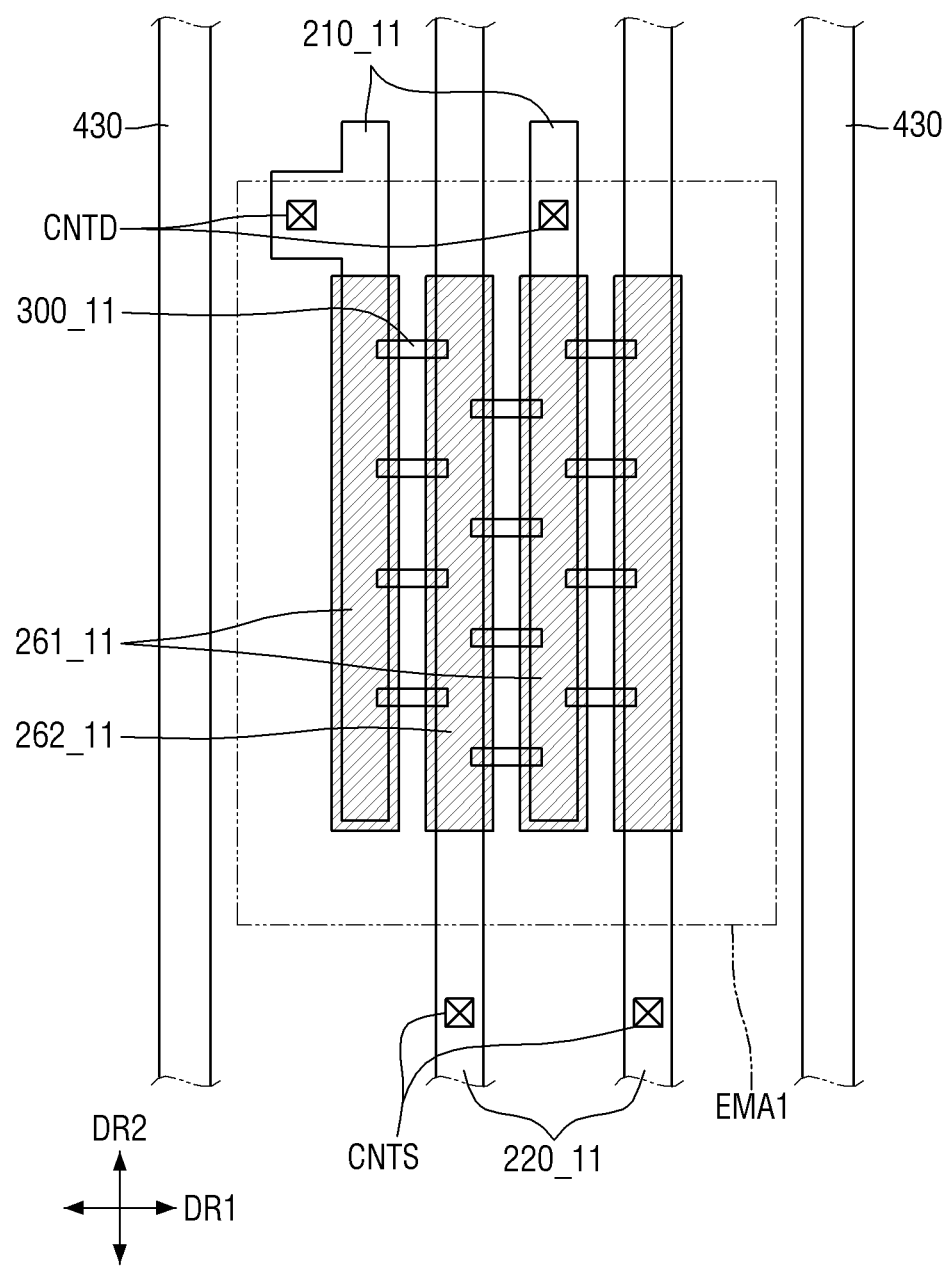
FIG. 39 is a plan view illustrating one sub-pixel of a display device according to one embodiment.

FIG. 39 is a plan view illustrating one sub-pixel of a display device according to one embodiment.

Referring to FIG. 39, in a display device 10_11, a first electrode 210_11 and a second electrode 220_11 may extend in one direction (e.g., in the second direction DR2). The first electrode 210_11 and the second electrode 220_11 may not have the electrode stems 210S and 220S extending in the first direction DR1. The display device 10_11 shown in FIG. 39 is different from the display device 10 shown in FIG. 3 in that the electrode stems 210S and 220S are omitted and one second electrode 220_11 is further included. A cross section taken along the lines Xa-Xa', Xb-Xb', and Xc-Xc' of FIG. 39 may be substantially the same as that of FIG. 4. In the following description, redundant descriptions thereof will be omitted while focusing on differences.

As shown in FIG. 39, the plurality of first electrodes 210_11 and second electrodes 220_11 may extend in the second direction DR2 in each sub-pixel PXn. The external bank 430 may also extend in the second direction DR2. The second electrode 220_11 and the external bank 430 may extend to another sub-pixel PXn adjacent in the second direction DR2. Accordingly, each of the sub-pixels PXn adjacent in the second direction DR2 may receive the same electrical signal from the second electrode 220_11.

Different from the display device 10 shown in FIG. 3, in the display device 10_11 shown in FIG. 39, the second electrode contact hole CNTS may be disposed in each second electrode 220_11. The second electrode 220 may be electrically connected to the power electrode 162 of the circuit element layer PAL through the second electrode contact hole CNTS disposed in each sub-pixel PXn. Although the second electrode contact hole CNTS is illustrated as being formed in each of the two second electrodes 220_11, the present disclosure is not limited thereto.

On the other hand, the first electrode 210_11 may extend in the second direction DR2 and may be terminated at the boundary of each sub-pixel PXn. Each of the sub-pixels PXn adjacent in the second direction DR2 may include the first electrodes 210_11 spaced apart from each other, and they may receive different electrical signals through the first electrode contact holes CNTD. The first electrode 210_11 may have a shape extending in the second direction DR2 and terminated at the boundary between adjacent sub-pixels PXn during the manufacturing process of the display device 10. In the embodiment shown in FIG. 39, the light emitting elements 300 between one first electrode 210_11 and one second electrode 220_11 and the light emitting elements 300 between the other first electrode 210_11 and the other second electrode 220_11 may be connected in parallel.

In the display device 10_11 shown in FIG. 39, some electrodes 210_11 and 220_11 may disposed as floating electrodes without being electrically connected to the circuit element layer PAL through the electrode contact holes CNTD and CNTS. For example, from among the plurality of electrodes 210_11 and 220_11, only the electrodes positioned at the outer part may receive the electrical signals through the electrode contact holes CNTD and CNTS, and the electrodes 210_11 and 220_11 disposed therebetween may not directly receive electrical signals. In such an embodiment, a part of the second electrodes 220_11 (e.g., the second electrode 220_11 disposed between different first electrodes 210_11) may extend in the second direction DR2 and may be terminated at the boundary of each sub-pixel PXn without being disposed in another sub-pixel PXn, similar to the first electrode 210_11. When some of the plurality of electrodes 210_11 and 220_11 are floating electrodes, the light emitting elements 300 disposed therebetween may be partially connected in series as well as in parallel. The external bank 430 may be disposed at the boundary of the sub-pixels PXn adjacent in the first direction DR1 and may extend in the second direction DR2. The external bank 430 may be disposed at the boundary between the sub-pixels PXn adjacent in the second direction DR2 and may extend in the first direction DR1. The description of the external bank 430 is the same as the above description with reference to FIG. 3. Further, the first contact electrode 261_11 and the second contact electrode 262_11 included in the display device 10_11 shown in FIG. 39 are substantially the same as those of the display device 10 shown in FIG. 3.

FIG. 39 illustrates that two first electrodes 210_11 and two second electrodes 220_11 are disposed and alternately spaced apart from each other. However, the present disclosure is not limited thereto, and some electrodes may be omitted or a greater number of electrodes may be disposed in the display device 10_11.

The first electrode 210 and the second electrode 220 of the display device 10 may not necessarily have the shape extending in one direction. The shapes of the first electrode 210 and the second electrode 220 of the display device 10 may not be particularly limited as long as they are placed apart from each other to provide therebetween the space in which the light emitting elements 300 are disposed.

Figure 40:
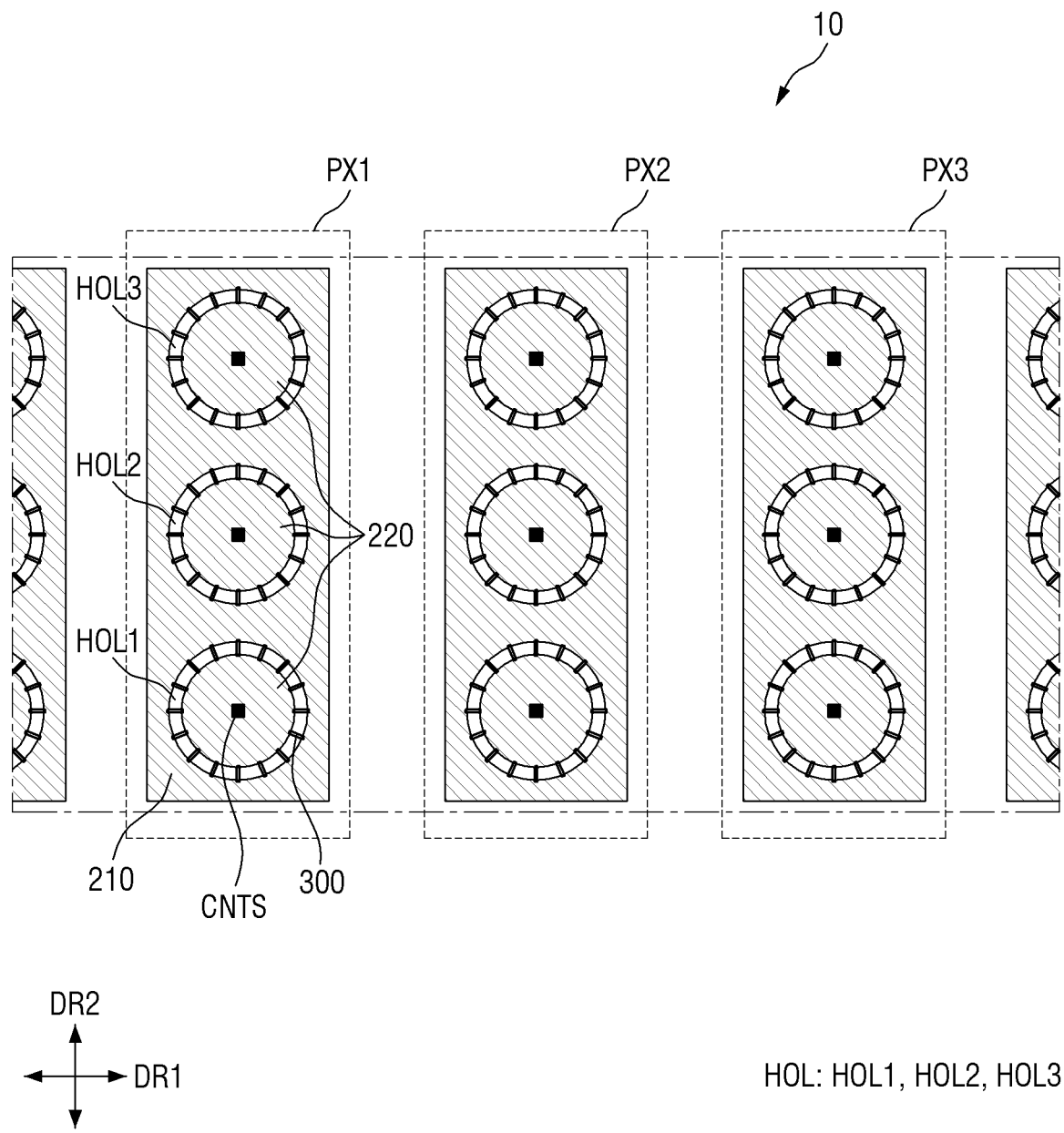
FIG. 40 is a plan view illustrating one pixel of a display device according to one embodiment.

FIG. 40 is a plan view illustrating one pixel of a display device according to one embodiment.

Referring to FIG. 40, at least some areas of a first electrode 210_12 and a second electrode 220_12 of a display device 10_12 according to one embodiment have curved shapes, and the curved area of the first electrode 210_12 may face the curved area of the second electrode 220_12 while being spaced apart from each other. The display device 10_12 shown in FIG. 40 differs from the display device 10 shown in FIG. 2 in that the shapes of the first and second electrodes 210_12 and 220_12 are different from those of the display device 10. In the following description, redundant descriptions thereof will be omitted while focusing on differences.

The first electrode 210_12 of the display device 10_12 shown in FIG. 40 may include multiple holes (e.g., multiple openings) HOL. For example, as illustrated in the drawing, the first electrode 210_12 may include a first hole HOL1, a second hole HOL2, and a third hole HOL3 arranged in the second direction DR2. However, the embodiment is not limited to thereto, and the first electrode 210_12 may include a greater number of holes HOL, a smaller number of holes HOL, or even a single hole HOL. Below, the description will be provided based on an example in which the first electrode 210_12 includes the first hole HOL1, the second hole HOL2, and the third hole HOL3.

In an embodiment, the first hole HOL1, the second hole HOL2, and the third hole HOL3 may have a circular shape in a plan view. Accordingly, the first electrode 210_12 may have curved areas formed by the holes HOL and may face the second electrodes 220_12 in these curved areas. However, this is merely an example, and the present disclosure is not limited thereto. The first hole HOL1, the second hole HOL2, and the third hole HOL3 are not particularly limited in shape as long as they can provide spaces for accommodating the second electrodes 220_12 therein. By way of example, the holes may have elliptical shapes, polygonal shapes such as rectangles, or the like in a plan view.

The second electrode 220_12 may be plural in number, and the plurality of second electrodes 220_12 may be disposed in each sub-pixel PXn. By way of example, three second electrodes 220_12 may be disposed in each sub-pixel PXn to correspond to the first to third holes HOL1, HOL2, and HOL3 of the first electrode 210_12. The second electrodes 220_12 may be respectively disposed within the first to third holes HOL1, HOL2, and HOL3, surrounded by the first electrode 210_12.

In an embodiment, the holes HOL of the first electrode 210_12 may have curved surfaces, and each second electrode 220_12 in the corresponding hole HOL of the first electrode 210_12 may also have a curved surface and may be disposed to face the first electrode 210_12 with a gap therebetween. As illustrated in FIG. 40, the first electrode 210_12 may have the holes HOL having circular shapes in a plan view, and the second electrodes 220_12 may have circular shapes in a plan view. The curved surface of the area of the first electrode 210_12 where each hole HOL is formed may face the curved outer surface of the corresponding one of the second electrodes 220_12 with a gap therebetween. For example, the first electrode 210_12 may be disposed to surround the outer surfaces of the second electrodes 220_12.

As stated above, light emitting elements 300 may be disposed between the first electrode 210_12 and the second electrode 220_12. The display device 10_12 according to an embodiment may include the second electrode 220_12 having the circular shape and the first electrode 210_12 disposed to surround (e.g., to extend around) it, and the light emitting elements 300 may be arranged along the curved outer surface of the second electrode 220_12. As descried above, because the light emitting elements 300 have the shapes extending in one direction, the light emitting elements 300 arranged along the curved outer surface of the second electrode 220_12 in each sub-pixel PXn may be disposed such that their extension directions are directed in different directions. Each sub-pixel PXn may have many different light emission directions depending on the directions in which the extension directions of the light emitting elements 300 are directed. In the display device 10_12 according to an embodiment, by disposing the first and second electrodes 210_12 and 220_12 to have the curved shapes, the light emitting elements 300 disposed between them may be oriented toward different directions, and lateral visibility of the display device 10_12 can be improved.

In concluding the detailed description, those skilled in the art will appreciate that many variations and modifications can be made to the embodiments described herein without substantially departing from the aspects and features of the present disclosure. Therefore, the disclosed embodiments of the present disclosure are used in a generic and descriptive sense and not for purposes of limitation.

What is claimed is:

1. A light emitting element comprising:
a first semiconductor layer doped with a first polarity;
a second semiconductor layer doped with a second polarity different from the first polarity;
an active layer between the first semiconductor layer and the second semiconductor layer in a first direction;
a first outer film around an outer surface of at least the active layer and extending in the first direction; and
a second outer film around an outer surface of a portion of the first semiconductor layer on which the first outer film is not present,
wherein the second outer film exposes a distal end surface of the first semiconductor layer facing away from the active layer.

2. The light emitting element of claim 1, wherein the first outer film and the second outer film comprise different materials.

3. The light emitting element of claim 2, wherein the first outer film comprises an insulating material.

4. The light emitting element of claim 3, wherein the second outer film comprises a material having a refractive index in a range of 1 to 2.4.

5. The light emitting element of claim 3, wherein the second outer film comprises a thermally conductive material.

6. The light emitting element of claim 3, further comprising a scatterer in the second outer film to scatter incident light.

7. The light emitting element of claim 1, wherein the second outer film is spaced apart from the active layer.

8. The light emitting element of claim 7, further comprising an electrode layer on the second semiconductor layer,
wherein the first outer film extends around side surfaces of a part of the second semiconductor layer and the electrode layer.

9. The light emitting element of claim 8, wherein the first outer film extends around an outer surface of a part of the first semiconductor layer, and
wherein a length of a region in which the first outer film contacts the first semiconductor layer is equal to a thickness of the second semiconductor layer.

10. The light emitting element of claim 8, wherein a partial region of a side surface of the electrode layer is exposed without contacting the first outer film.

11. The light emitting element of claim 10, wherein the first outer film has a curved outer surface such that its thickness in the first direction decreases.

12. The light emitting element of claim 1, wherein a thickness of the second outer film is greater than a thickness of the first outer film.

13. A method of manufacturing a light emitting element, the method comprising:
preparing a substrate and forming a plurality of semiconductor cores spaced apart from each other on the substrate;
forming a base layer in a region in which the plurality of semiconductor cores are spaced apart from each other, the base layer extending around an outer surface of a part of each of the plurality of semiconductor cores;
forming a first outer film around an exposed outer surface of each of the plurality of semiconductor cores in which the base layer is not formed;
forming a second outer film around a part of the outer surface of each of the plurality of semiconductor cores by etching the base layer; and
separating each of the plurality of semiconductor cores on which the first outer film and the second outer film are formed from the substrate.

14. The method of claim 13, wherein the semiconductor core comprises a first semiconductor layer, a second semiconductor layer, an active layer between the first semiconductor layer and the second semiconductor layer, and an electrode layer on the second semiconductor layer, and
wherein the base layer is formed to extend around a partial region of the first semiconductor layer.

15. The method of claim 14, wherein the forming of the first outer film comprises:
forming an insulating coating film to cover an exposed side surface and an exposed top surface of the semiconductor core; and
exposing a top surface of the electrode layer by partially removing the insulating coating film.

16. A display device comprising:
a substrate;
a first electrode on the substrate and a second electrode spaced apart from the first electrode;
a light emitting element between the first electrode and the second electrode and electrically connected to the first electrode and the second electrode, the light emitting element comprises:
a first semiconductor layer doped with a first polarity;
a second semiconductor layer doped with a second polarity different from the first polarity;
an active layer between the first semiconductor layer and the second semiconductor layer in a first direction; and
a first outer film around an outer surface of at least the active layer and extending in the first direction;
a first insulating layer under the light emitting element between the first electrode and the second electrode; and a second insulating layer on the light emitting element and exposing one end and another end of the light emitting element.

17. The display device of claim 16, wherein the light emitting element further comprises a second outer film around an outer surface of a portion of the first semiconductor layer on which the first outer film is not present.

18. The display device of claim 17, further comprising:
a first contact electrode contacting the first electrode and the one end of the light emitting element; and
a second contact electrode contacting the second electrode and the other end of the light emitting element.

19. The display device of claim 17, wherein the second insulating layer contacts the second outer film.

20. The display device of claim 17, further comprising an electrode layer on the second semiconductor layer,
wherein the first outer film extends around side surfaces of a part of the second semiconductor layer and the electrode layer.

21. The display device of claim 20, wherein the first outer film and the second outer film comprise different materials.

22. The display device of claim 21, wherein the first outer film comprises an insulating material, the second outer film comprises a material having a refractive index in a range of 1 to 2.4, and at least some of the light generated in the active layer is emitted through the second outer film.

23. The display device of claim 16, further comprising a pattern layer on the second insulating layer and the first semiconductor layer of the light emitting element.

24. The display device of claim 23, wherein the pattern layer is not between the first insulating layer and the first semiconductor layer of the light emitting element.

* * * * *